(12) United States Patent
Ono et al.

(10) Patent No.: US 6,350,844 B1
(45) Date of Patent: Feb. 26, 2002

(54) POLYIMIDE FILM AND ELECTRIC/ELECTRONIC EQUIPMENT BASES WITH THE USE THEREOF

(75) Inventors: Kazuhiro Ono; Kiyokazu Akahori; Hidehito Nishimura, all of Shiga (JP)

(73) Assignee: Kaneka Corporation, Osaka (JP)

(*) Notice: Subject to any disclaimer, the term of this patent is extended or adjusted under 35 U.S.C. 154(b) by 0 days.

(21) Appl. No.: 09/434,179

(22) Filed: Nov. 5, 1999

(30) Foreign Application Priority Data

| Nov. 5, 1998 | (JP) | 10-314129 |
| Nov. 5, 1998 | (JP) | 10-314130 |
| Nov. 5, 1998 | (JP) | 10-314131 |
| Nov. 5, 1998 | (JP) | 10-314132 |
| Nov. 5, 1998 | (JP) | 10-314133 |
| Apr. 28, 1999 | (JP) | 11-121875 |
| Jul. 8, 1999 | (JP) | 11-193937 |

(51) Int. Cl.$^7$ ............ C08G 73/10; C08G 69/26; B32B 27/00
(52) U.S. Cl. ............ 528/170; 528/125; 528/126; 528/128; 528/171; 528/172; 528/173; 528/174; 528/175; 528/179; 528/183; 528/185; 528/188; 528/220; 528/229; 528/350; 528/353; 428/411.1; 428/458; 428/473.5
(58) Field of Search ............... 528/229, 171, 528/353, 350, 170, 179, 125, 128, 126, 172, 173, 174, 175, 183, 185, 188, 220; 428/458, 473.4, 411.1

(56) References Cited

U.S. PATENT DOCUMENTS 5,668,247 A   9/1997   Furutani et al. ............ 528/353

FOREIGN PATENT DOCUMENTS

| JP | 7-88495 | 9/1995 |
| JP | 9-77871 | 3/1997 |
| JP | 9077871 | * 3/1997 |
| JP | 2712597 | 10/1997 |
| JP | 10-36506 | 2/1998 |

* cited by examiner

Primary Examiner—P. Hampton-Hightower
(74) Attorney, Agent, or Firm—Armstrong, Westerman, Hattori, McLeland & Naughton, LLP

(57) ABSTRACT

A polyimide film having sufficiently excellent characteristics such as a sufficiently high elastic modulus, a low water absorption, a small coefficient of moisture-absorption expansion, a small coefficient of linear expansion and a high dimensional stability; and various electric/electronic equipment bases with the use of the polyimide film.

A polyimide film having a tensile elastic modulus of 700 kg/mm$^2$ or less and a coefficient of moisture-absorption expansion of 20 ppm or less and containing a specific repeating unit as an essential repeating unit is synthesized. Then various electric/electronic equipment bases such as a laminate for flexible print connection boards are produced by using the polyimide film.

18 Claims, 3 Drawing Sheets

POLYIMIDE FILM AND ELECTRIC/ ELECTRONIC EQUIPMENT BASES WITH THE USE THEREOF

FIELD OF THE INVENTION

This invention relates to a novel polyimide film. More particularly, it relates to a novel polyimide film which has excellent characteristics (a sufficiently high elastic modulus, a low water absorption, a small coefficient of moisture-absorption expansion, a small coefficient of linear expansion and a high dimensional stability, etc.) and is adequately usable as a base film for various electric/electronic equipments such as an adhesive film for flexible print connection boards or in packaging semiconductors, a magnetic recording film, a hard-disk suspension connection base, etc.

BACKGROUND OF THE INVENTION

In general, polyimide films are excellent in various properties (heat resistance, low temperature properties, chemical resistance, electrical characteristics, etc.) among various organic polymers. Therefore, polyimide films have been widely employed as materials of electric/electronic equipments as well as in the fields of cosmology/aeronautics and electronic communication. In particular, it is required in recent years that these polyimide films are not only excellent in heat resistance but have various functions so as to meet the demands.

For example, it is desired that a polyimide film to be used as a base film for flexible print connection boards has a high elastic modulus, a small coefficient of moisture-absorption expansion and a small coefficient of linear expansion. When a polyimide film having a large coefficient of moisture-absorption expansion and a large coefficient of linear expansion is employed, the obtained flexible print connection board undergoes curling or warpage. In particular, a board base film having a high dimensional stability should be used in a flexible print connection board for plasma display (PDP), since it is to be used in a large area compared with those for other uses.

As the polyimide to be used in the electric/electronic equipments as described above, it has been a practice to use a polyimide obtained by the polycondensation of pyromellitic acid dianhydride with 4,4'-diaminodiphenhyl ether, since it is excellent in heat resistance and electrical insulating properties and, therefore, usable in these equipments to be used at high temperature. By taking advantage of the high dimensional stability, films made of this polyimide are also used in flexible print connection boards, etc. In recent years, however, it becomes necessary that base films to be used in IC, LSI, etc. have a further improved procccessability and an elevated accuracy. In its turn, the polyimide serving as the base film material should have an elevated elastic modulus, a lowered coefficient of linear expansion, a reduced water absorption, etc. Thus, various attempts have been made to satisfy these requirements. For example, it is reported to elevate the elastic modulus by using p-phenylenediamine as a diamine component thereby giving a three-component polyimide composed of pyromellitic acid dianhydride, 4,4'-diaminodiphenyl ether and p-phenylenediamine in JP-A-60-210629, JP-A-64-16832, JP-A-64-16833, JP-A-64-16834, JP-A-1-131241 and JP-A-1-131242 (the term "JP-A" as used herein means an "unexamined Japanese patent publication"). Moreover, it is also attempted to add 3,3',4, 4'-bipehnyltetracarboxylic acid dianhydride to the above-described three components to thereby give a four-component polyimide having a further elevated elastic modulus. For example, JP-A-59-164328 and JP-A-61-111359 discloses such a four-component polyimide. Furthermore, an attempt to improve the physical properties of the four-component polyimide by adding the monomers in a controlled order in the step of the polymerization is reported in, for example, JP-A-5-25273. Also, it is reported to use an acid having a structure similar to p-phenylenebis (trimellitic acid monoesteracid anhydride) in JP-A-63-189490 (examined Japanese Patent Publication No. 7-88495), JP-A-3-60182 (Japanese Patent No. 2,712,597), JP-A-9-77871 and JP-A-10-36506.

As described above, more and more demands are imposed upon polyimide films which are employed in electric/electronic equipments and, therefore, various studies have been made to satisfy these requirements. However, there has been proposed no polyimide film so far having sufficiently excellent characteristics (a sufficiently high elastic modulus, a low water absorption, a small coefficient of moisture-absorption expansion, a small coefficient of linear expansion and a high dimensional stability).

SUMMARY OF THE INVENTION

Under these circumstances, one object of the present invention is to provide a polyimide film having sufficiently excellent characteristics (a sufficiently high elastic modulus, a low water absorption, a small coefficient of moisture-absorption expansion, a small coefficient of linear expansion and a high dimensional stability). Another object of the present invention is to provide various electric/electronic equipment bases with the use of the polyimide film.

To achieve the above-described objects, the present invention provides a polyimide film, a laminate for flexible print connection boards, an adhesive film, a base film for magnetic recording and a hard disk suspension connection base each will be specified below.

(1) A polyimide film having a tensile elastic modulus of 700 kg/mm$^2$ or less and a coefficient of moisture-absorption expansion of 20 ppm or less.

(2) The polyimide film as described in the above (1) having a coefficient of linear expansion at 100 to 200° C. of 5 to 15 ppm.

(3) The polyimide film as described in the above (1) or (2) having a water absorption of 3.0% or less.

(4) The polyimide film as described in the above (3) having a water absorption of 2.0% or less.

(5) The polyimide film as described in any of the above (1) to (4) which contains a repeating unit represented by the following general formula (1) in its molecule:

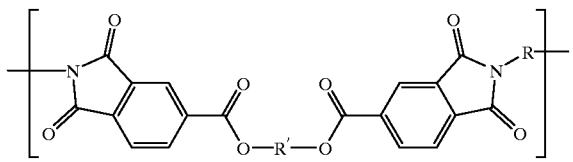

(1)

wherein R$^1$ represents a divalent organic group selected from among:

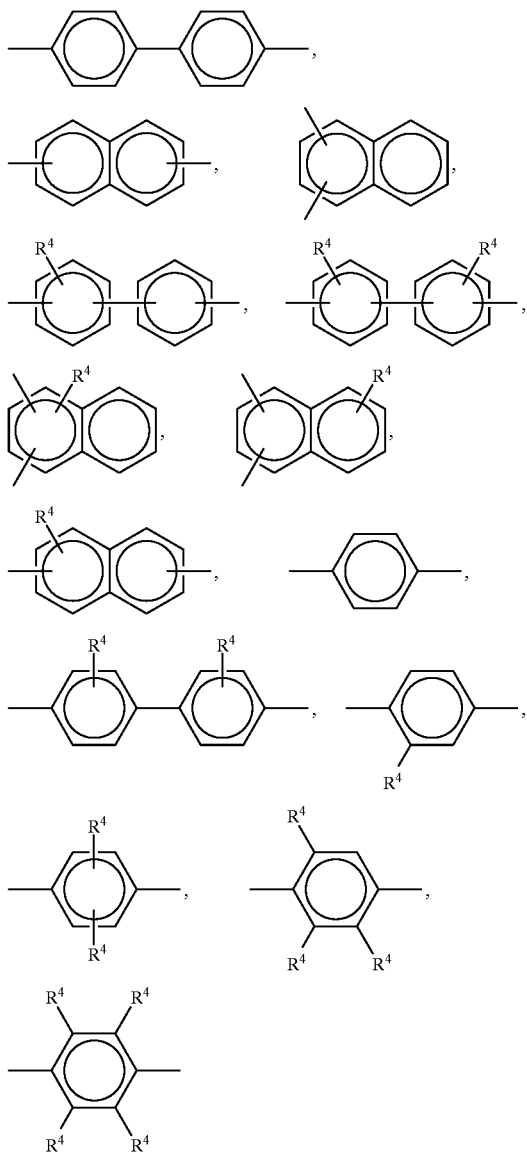

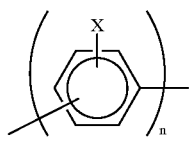

(wherein R⁴ represents CH₃—, Cl—, Br—, F— or CH₃O—); and R represents a divalent organic group represented by the following general formula:

(wherein n is an integer of 1 to 3; and X represents a monovalent substituent selected from among a hydrogen atom, a halogen atom, a carboxyl group, a lower alkyl group having 6 or less carbon atoms and a lower alkoxy group having 6 or less carbon atoms), or the following general formula:

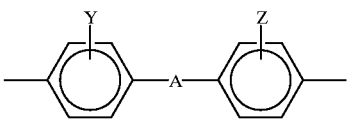

(wherein Y and Z may be the same or different and each represents a monovalent substituent selected from among a hydrogen atom, a halogen atom, a carboxyl group, a lower alkyl group having 6 or less carbon atoms and a lower alkoxy group having 6 or less carbon atoms; and A represents a divalent linking group selected from among —O—, —S—, —CO—, —SO—, —SO₂— and —CH₂—.)

(6) The polyimide film as described in the above (5) which further contains a repeating unit represented by the following general formula (2) in its molecule in addition to said repeating unit represented by the general formula (1):

(2)

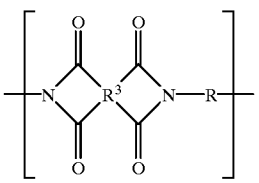

wherein R is as defined in the general formula (1); and R³ represents a tetravalent organic group selected from among:

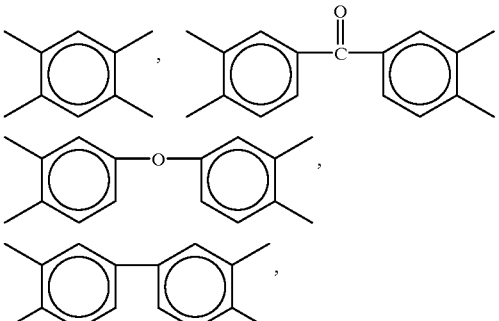

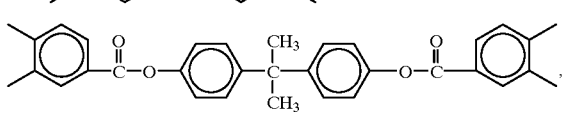

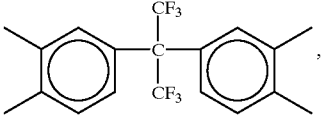

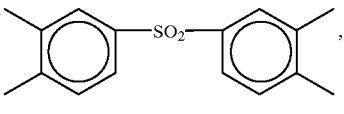

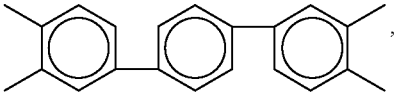

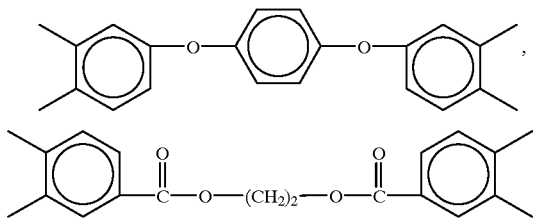

(7) The polyimide film as described in the above (5) or (6) which further contains a repeating unit represented by the following general formula (3) in its molecule:

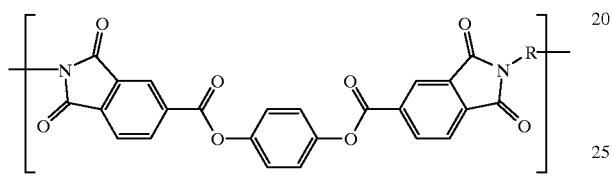

(3)

wherein R is as defined in the general formula (1).

(8) The polyimide film as described in the above (5) or (6) which contains a repeating unit represented by the following general formula (4) and another repeating unit represented by the following general formula (5) in its molecule:

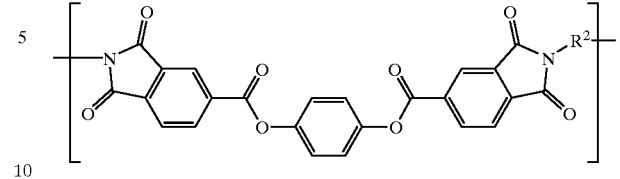

(4)

wherein $R^2$ represents a divalent organic group selected from:

(5)

or:

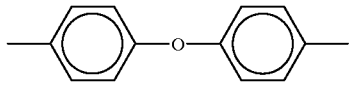

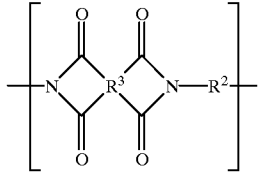

(wherein $R^2$ is as defined in the general formula (4); and $R^3$ is as defined in the general formula (2)).

(9) The polyimide film as described in the above (5) or (6) wherein the main repeating units contained in its molecule are those represented by the following general formulae (6) to (9):

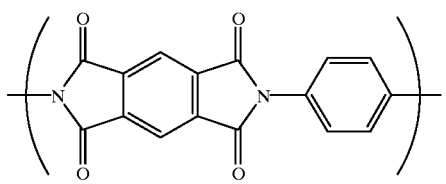

(6)

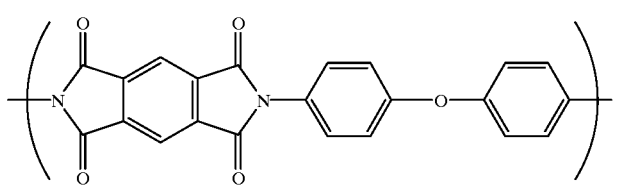

(7)

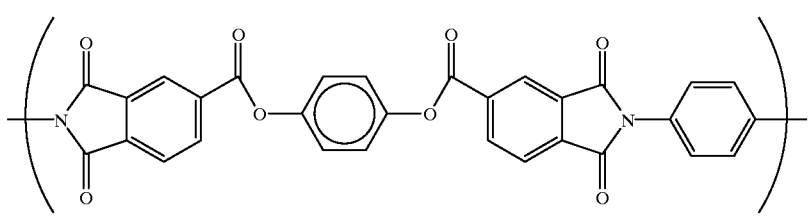

(8)

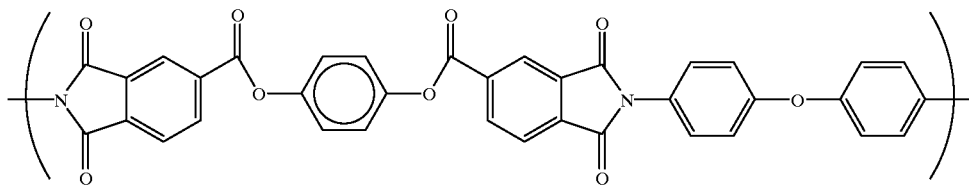

(10) The polyimide film as described in the above (9) which satisfies the requirement that (a+b)/s, (a+c)/s, (b+d)/s and (c+d) Is each falls within the range of 0. 25 to 0. 75, wherein a, b, c and d represent respectively the numbers of the repeating units represented by the above general formulae (6) to (9) and s represents a+b+c+d.

(11) A laminate for flexible print connection boards which is obtained by forming a metal layer at least on one face of the polyimide film as described in any of the above (1) to (10).

(12) The laminate for flexible print connection boards as described in the above (11), wherein said metal layer is laminated via a thermosetting adhesive.

(13) The laminate for flexible print connection boards as described in the above (11), wherein said metal layer is laminated via a thermoplastic polyimide adhesive.

(14) The laminate for flexible print connection boards as described in any of the above (11) to (13), wherein at least one face of said polyimide film is subjected to at least one treatment selected from among heat treatment, corona treatment, plasma treatment and coupling agent-treatment.

(15) An adhesive film obtained by forming an adhesive layer on at least one face of the polyimide film as described in any of the above (1) to (10).

(16) The adhesive film as described in the above (15) wherein said adhesive layer comprises a thermosetting adhesive.

(17) The adhesive film as described in the above (15) wherein said adhesive layer comprises a thermoplastic polyimide adhesive.

(18) The polyimide film as described in any of the above (1) to (10) to be used as a base film for magnetic recording.

(19) The polyimide film as described in any of the above (1) to (10) to be used as a hard disk suspension connection base.

In this drawing, each numerical symbol shows as follows:
1: Copper foil
2: Adhesive
3: Film.

Figure 2:
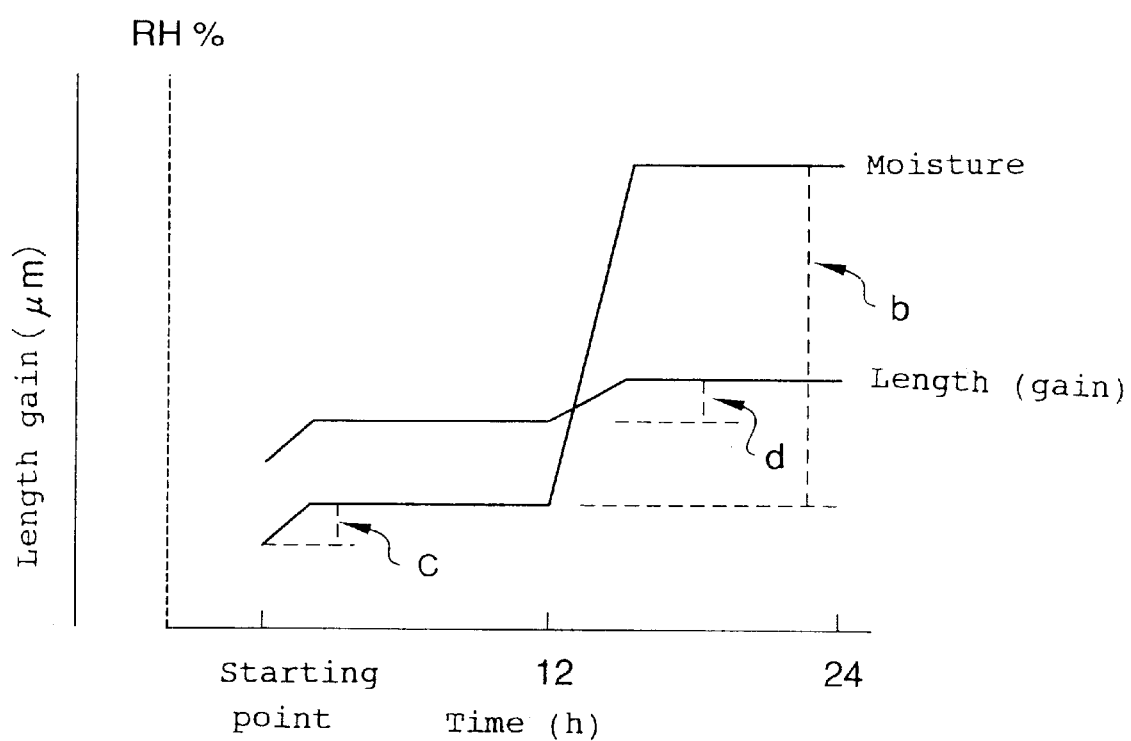

FIG. 2 is a diagram relating to a test for the determination of the coefficient of moisture-absorption expansion of Comparative Examples 1 and 2 and the Examples 1 to 33 and 78 to 82.

Figure 3:
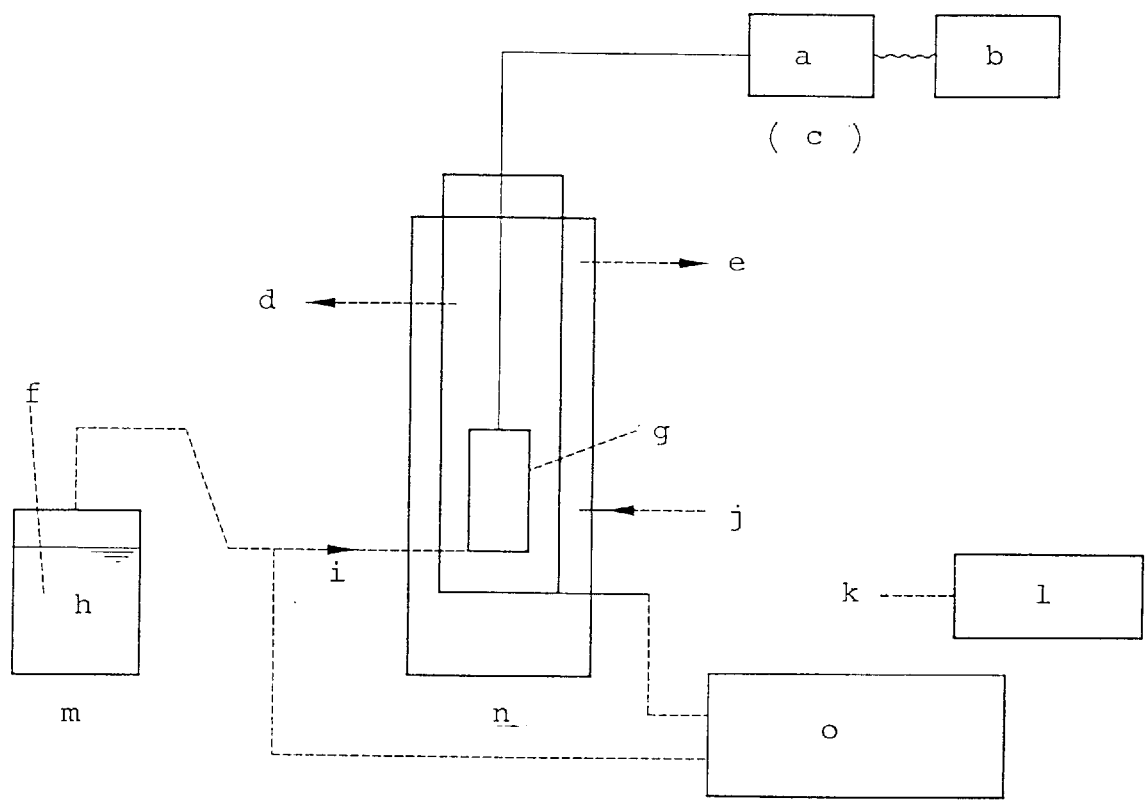

FIG. 3 is a device for determination of coefficient of moisture-absorption expansion in Comparative Examples 1 and 2 and the Examples 1 to 33 and 78 to 82.

In this drawing, each symbol shows as follows:
a: Detector
b: Recorder
c: (Gain)
d: Steam outlet
e: Hot water outlet
f: $N_2$ bubbling
g: Sample
h: Water
i: Steam
j: Hot water inlet (hot water tank)
k: Humidity sensor
l: Humidity converter
m: Steam generator
n: Thermostat (50° C.)
o: Humidity controlling unit

DETAILED DESCRIPTION OF THE INVENTION

The polyimide film according to the present invention is one having a tensile elastic modulus of 700 kg/mm² or less, generally from 500 to 700 kg/mm², and a coefficient of moisture-absorption expansion of 20 ppm or less, preferably 15 ppm or less. In usual, it has a coefficient of linear expansion at 100 to 200° C. of from 5 to 15 ppm and a water absorption of 3.0% or less, preferably 2.0% or less.

The polyimide film of the present invention as defined above is made of a polyimide usually containing a repeating unit represented by the following general formula (1) in its molecule:

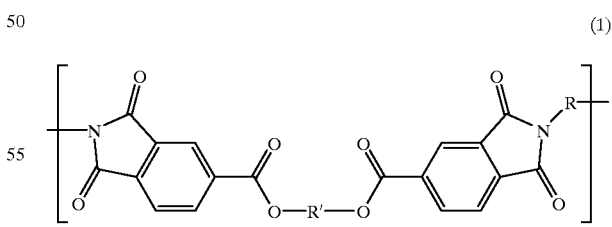

wherein $R^1$ represents a divalent organic group selected from among:

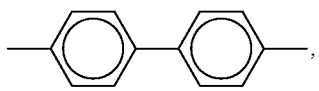

-continued

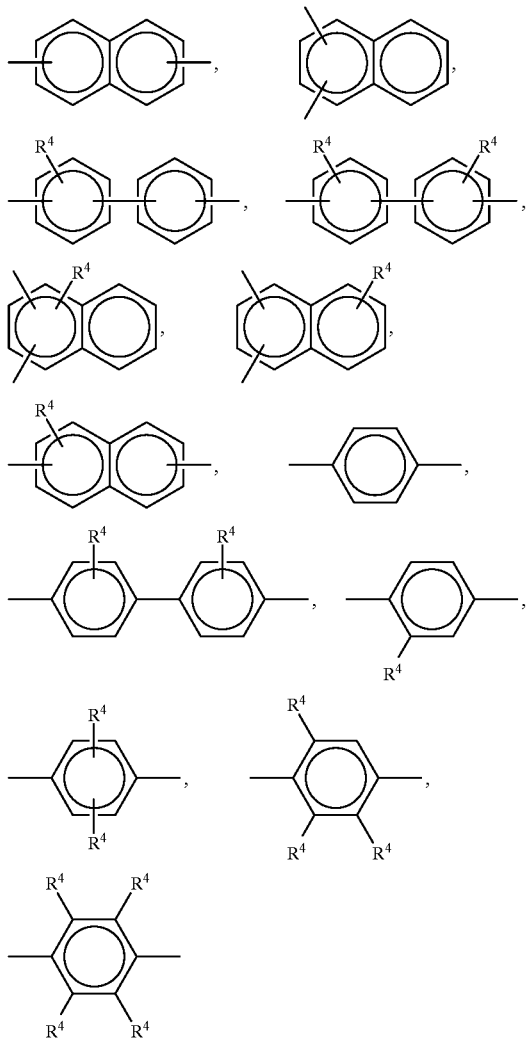

(wherein $R^4$ represents $CH_3$—, Cl—, Br—, F— or $CH_3O$—); and R represents a divalent organic group represented by the following general formula:

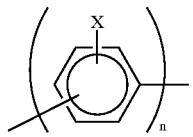

(wherein n is an integer of 1 to 3; and X represents a monovalent substituent selected from among a hydrogen atom, a halogen atom, a carboxyl group, a lower alkyl group having 6 or less carbon atoms and a lower alkoxy group having 6 or less carbon atoms), or the following general formula:

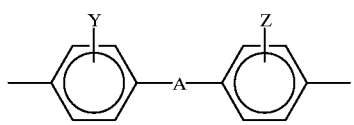

(wherein Y and Z may be the same or different and each represents a monovalent substituent selected from among a hydrogen atom, a halogen atom, a carboxyl group, a lower alkyl group having 6 or less carbon atoms and a lower alkoxy group having 6 or less carbon atoms; and A represents a divalent linking group selected from among —O—, —S—, —CO—, —SO—, —$SO_2$— and —$CH_2$—.)

The polyimide film containing the repeating unit represented by the general formula (1) in its molecule may further contain another repeating unit represented by the following general formula (2), in addition to the repeating unit of the general formula (1) as the essential component:

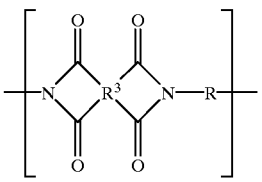

wherein R is as defined in general formula (1); and $R^3$ represents a tetravalent organic group selected from among:

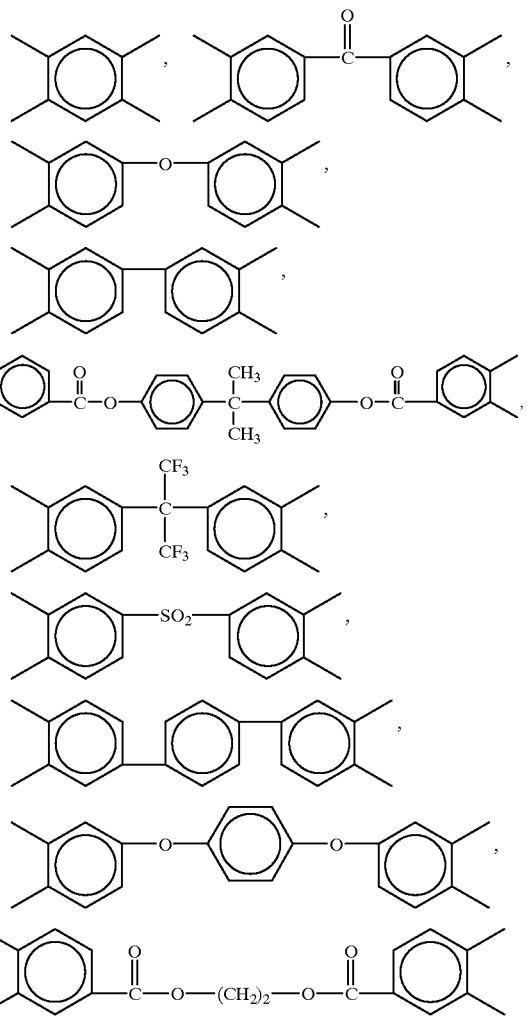

The polyimide film according to the present invention can be produced by dehydrating and cyclizing a solution of a polyamide acid (i.e., a precursor of a polyimide) to thereby give an imide and then processing it into a film, or performing the imidation and film-formation simultaneously. More particularly speaking, the polyamide acid solution is mixed with a dehydrating agent, a catalyst, etc. and then the resultant mixture is casted or applied onto a support such as an endless belt to give a film. Next, it is converted into a imide by baking at an appropriate temperature and the film thus obtained is separated from the support, thereby giving a polyimide film.

The polyamide acid solution to be used as the precursor in the production of the polyimide film can be obtained by polymerizing an acid dianhydride component and a diamine component at a substantially equimolar ratio in an organic polar solvent. In this process, use can be made of two or more acid dianhydrides as the acid dianhydride component and two or more diamines as the diamine component, if necessary. The polyamide acid solution to be used in the present invention can be obtained usually by polymerizing an aromatic diester acid dianhydride represented by the following general formula (10), which is employed as the essential acid dianhydride component, with a diamine represented by the following general formula (11):

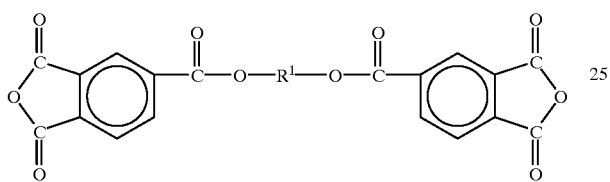
(10)

wherein $R^1$ is as defined in the general formula (1);

$$H_2N-R-NH_2 \quad (11)$$

wherein R is as defined in the general formula (1).

In the above polymerization, acid dianhydrides (for example, a tetracarboxylic acid dianhydride represented by the following general formula (12)) may be added in addition to the aromatic diester acid dianhydride represented by the above general formula (10) employed as the essential component;

(12)

wherein $R^3$ is as defined in the general formula (2).

In the above-described case, the aromatic diester acid dianhydride represented by the general formula (10) and the tetracarboxylic acid dianhydride represented by the general formula (12) may be used at a ratio appropriately determined depending on the purpose. In general, the aromatic diester acid dianhydride represented by the general formula (10) is used in an amount of 25% by mol or more, preferably 35% by mol or more and still preferably 40% by mol or more, based on the whole acid dianhydride components, while it is favorable to use the tetracarboxylic acid dianhydride represented by the general formula (12) in an adequate amount. When the content of the aromatic diester acid dianhydride represented by the general formula (10) is less than 25% by mol, the resultant polyimide film has an elevated water absorption and an elevated coefficient of moisture-absorption expansion.

The polymerization as described above can be carried out by any of publicly known methods, for example, JP-A-59-164328 or JP-A-63-166287) with the use of organic polar solvents. In the polymerization step, the starting acid dianhydride component and diamine component may be added to the reaction system in an arbitrary order.

In the present invention, the reaction is performed by various methods as follows.

(a) A method wherein diamines and acid dianhydrides are preliminarily mixed together and then the mixture is added in portions to a solvent solution under stirring.

(b) A method wherein a solvent is added under stirring to a mixture of diamines and acid dianhydrides, contrary to the above one.

(c) A method wherein diamines are exclusively dissolved in a solvent and then acid dianhydrides are added thereto at such a ratio as allowing to control the reaction rate.

(d) A method wherein tetracarboxylic acid dianhydrides are exclusively dissolved in a solvent and then diamines are added thereto at such a ratio as allowing to. control the reaction rate.

(e) A method wherein diamines and acid dianhydrides are separately dissolved in solvents and then these solutions are slowly mixed in a reactor.

(f) A method wherein a polyamide acid with excessive diamines and another polyamide acid with excessive acid dianhydrides are preliminarily formed and then reacted with each other in a reactor.

(g) A method wherein a portion of diamines and acid dianhydrides are first reacted and then the residual diamines are reacted, or vice versa.

When the aromatic diester acid dianhydride represented by the general formula (10) and the tetracarboxylic acid dianhydride represented by the general formula (12) are used as the acid dianhydride components, it is particularly preferable to perform the polymerization by first reacting one of the acid dianhydrides with the diamine component to give a first polyamide acid and then reacting the other acid dianhydride with the diamine component to give a second polyamide acid.

Examples of the organic polar solvents usable in the above-described polymerization include sulfoxide solvents (dimethyl sulfoxide, diethyl sulfoxide, etc.), formamide solvents (N,N-dimetylformamide, N,N-dietnylformamide, etc.), acetamide solvents (N,N-dimethylacetamide, N,N-diethylacetamide, etc.), pyrrolidone solvents (N-methyl-2-pyrrolidone, N-vinyl-2-pyrrolidone, etc.), phenol solvents (phenol, o-, m- or p-cresol, xylenol, halogenated phenols, catechol, etc.), hexamehtylphosphoramide and γ-butyrolactone. It is desirable to use one of these solvents or mixtures thereof. It is also possible to use combinations of these solvents with aromatic hydrocarbons such as xylene and toluene. From the viewpoint of handling, it is desirable that the thus formed polyamide acid is dissolved in the organic polar solvent at a concentration of 5 to 40% by weight, preferably from 10 to 30% by weight and still preferably from 12 to 27% by weight.

The polyimide film produced by the above-described method from starting with polyamide acid has excellent characteristics and well-balanced physical properties. It is desirable that the polyamide acid obtained by the above method has an average molecular weight of from 10,000 to 1,000,000. When the average molecular weight of the polyamide acid is less than 10,000, the resultant film becomes brittle. When its average molecular weight exceeds 1,000,000, on the other hand, the polyamide acid varnish becomes poor in handling properties due to the excessively high viscosity thereof.

Among the polyimides containing the repeating unit represented by the general formula (1) in its molecule which is produced form the polyamide acid by the above-described method, a polyimide film containing a repeating unit represented by the following general formula (3) in its molecule is particularly preferable:

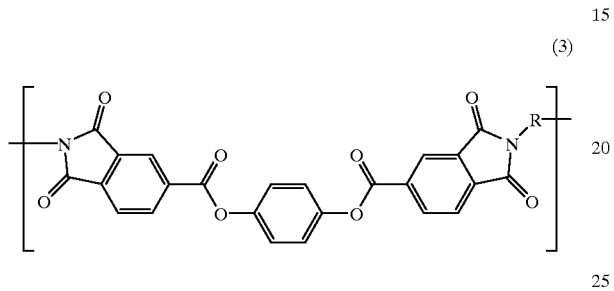
(3)

wherein R is as defined in the general formula (1).

Among the polyimide films containing the repeating unit represented by the general formula (1) in its molecule which is produced form the polyamide acid by the above-described method, a polyimide film containing a repeating unit represented by the following general formula (4) and another repeating unit represented by the following general formula (5) in its molecule is particularly preferable:

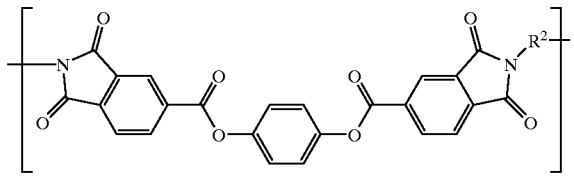
(4)

wherein $R^2$ represents a divalent organic group selected from:

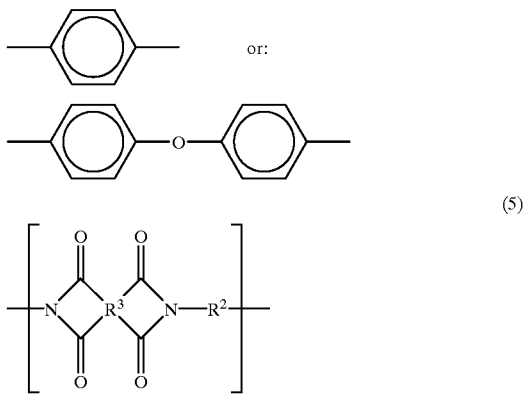
(5)

(wherein $R^2$ is as defined in the general formula (4); and $R^3$ is as defined in the general formula (2)).

Among the polyimide film containing the repeating unit represented by the above general formula (1) in its molecule, a polyimide film containing the repeating units represented by the following general formulas (6) to (9) as the main repeating units is still preferable:

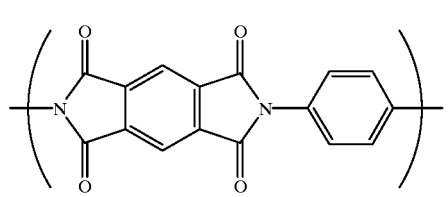
(6)

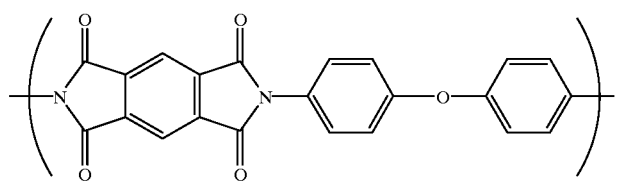
(7)

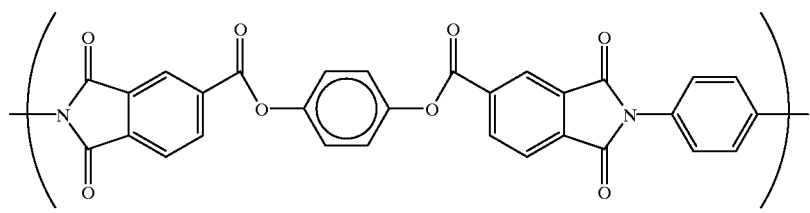
(8)

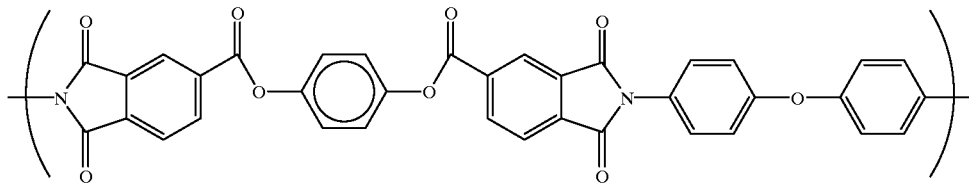

(9)

The polyimide film as described above satisfies the requirement that (a+b)/s, (a+c)/s, (b+d)/s and (c+d)/s each falls within the range of 0.25 to 0.75, wherein a, b, c and d represent respectively the numbers of the repeating units represented by the above general formulae (6) to (9) and s represents a+b+c+d In the production of the polyimide film according to the present invention, it is also possible to add antioxidants, light stabilizers, flame-retardants, antistatic agents, heat stabilizers, ultraviolet absorbing agents, inorganic fillers or various reinforcing agents to the polyamide acid solution which is employed as a precursor.

To obtain the polyimide film of the present invention from the polyamide acid solution, use may be made of either a thermal method with the use of thermal dehydration or a chemical method with the use of a dehydrating agent. However, it is preferred to use the chemical method, since the polyimide film thus obtained shows favorable mechanical properties such as elongation and tensile strength. On the other hand, the thermal method is advantageous in that the imidation can be completed within a short period of time. It is also possible to combine the thermal imidation method with the chemical imidation method.

Now, a method for producing the polyimide film according to the present invention will be described in greater detail.

To the above-described polyamide acid or a solution thereof, a dehydrating agent in a stoichiometric amount or more and a catalyst are added. The solution thus obtained is then casted or applied onto a drum or an endless belt to thereby form a membrane. Next, this membrane is dried at a temperature of 150° C. or below for about 1 to 20 minutes to thereby give a self-supporting polyamide acid membrane. Subsequently, this membrane is separated from the support and then fixed at both ends. Then it is converted into the imide by heating slowly or stepwise to about 100 to 550° C. (preferably 450° C. or more, more preferably 470° C. or more and most preferably 500° C. or more). It is preferable from the viewpoint of the deterioration of a film that the maximum heating temperature is not more than 600° C. After cooling, the membrane is taken off to give the polyimide film according to the present invention. As the above-described dehydrating agent, use can be made of, for example, aliphaticacidanhydrides (aceticanhydride, etc.) and aromatic acid anhydrides. As the above-described catalyst, use can be made of, for example, aliphatic tertiary amines (triethylamine, etc.), aromatic tertiary amines (dimethylaniline, etc.) and heterocyclic tertiary amines (pyridine, picoline, isoquinoilne, etc.). The thickness of the polyimide film thus obtained may be adequately determined depending on the purpose, etc. It is generally preferable that the thickness ranges from 5 to 90 $\mu$m.

It is preferable that the polyimide film thus obtained has an elastic modulus of 500 k g/mm$^2$ or more, not exceeding 700 kg/mm$^2$ (inclusive) so that it is adequately employed as a base film such as a laminate for flexible print connection boards. It is preferable that the polyimide film has a coefficient of moisture-absorption expansion of 20 ppm or less, still preferably 18 ppm or less and particularly preferably 16 ppm or less. It is also preferable that the polyimide film has a coefficient of linear expansion at 100 to 200° C. of 20 ppm or less, more preferably 15 ppm or less and most preferably 12 ppm or less. In general, the coefficient of linear expansion thereof ranges from 5 to 15 ppm. It is preferable that the polyimide film has a water absorption of 3.0% or less, more preferably 2.0% or less, still more preferably 1.8% or less and particularly preferably 1.6% or less. It is preferable that the polyimide film has a relative permittivity of 3.50 or less, still preferably 3.40 or less and particularly preferably 3.35 or less, within a frequency range of 100 Hz to 1 MHz at ordinary temperature. It is also preferable that the polyimide film has a relative permittivity of 3.30 or less within a frequency range of 1 kHz at a temperature of −50° C. to 200° C. or a frequency range of 1 kHz to 1 MHz at ordinary temperature. The difference in a relative permittivity between a dry condition and a moisture-absorption condition is preferably as small as 0.3 or less. Moreover, it is preferable that the polyimide film shows a ratio of the coefficient of moisture-absorption expansion in the major direction (MD) to that of the transverse direction (TD) of from ⅕ to 5, still preferably form ⅓ to 3 and particularly preferably from ½ to 2. The density of the polyimide film preferably ranges from about 1.440 to 1.480 g/cm$^3$. The glass transition temperature of the polyimide film is preferably 200° C. or more, still preferably 240° C. or more and particularly preferably 260° C. or more.

As described above, the polyimide film according to the present invention has sufficiently excellent characteristics such as a sufficiently high elastic modulus, a low water absorption, a small coefficient of moisture-absorption expansion, a small coefficient of linear expansion and a high dimensional stability. Therefore, it is widely usable for various purposes. Among all, it is adequately usable as an adhesive film. for flexible print connection boards or in packaging semiconductors, a magnetic recording film (floppy disk, magnetic recording tape, etc.), a hard disk suspension connection base, etc.

Now, illustration will be made on a case where the polyimide film according to the present invention is used as a base film for a laminate for flexible print connection board.

In general, a flexible print connection board (FPC) is produced by a process involving the steps of: ① application of an adhesive and drying; ② lamination of a copper foil; ③ hardening of the adhesive; and ④ layout pattern formation (application of a resist, copper etching, separation of the resist). In the step of the pattern formation, dimensional changes generally arise during the etching treatment. Therefore, a circuit pattern should be designed by previously taking the changes in the subsequent step into consideration. To achieve a high dimensional stability of an FPC per se, it is necessary to employ an FPC base material having an appropriately high elastic modulus, a low water absorption, a small coefficient of linear expansion and a small coefficient of moisture-absorption expansion. These changes in the FPC are caused by (a) a dimensional change in the base film serving as an insulating material of the FPC due to the moisture absorption/desorption; (b) a strain caused by the difference in heat expansion of the copper foil and the base film occurring in the step of laminating the copper foil; and (c) a strain caused by a tension occurring in each step, etc. The extent of the dimensional change caused by the factor (b) can be easily anticipated in the step of designing, if the base film has a constant coefficient of linear expansion. The dimensional change caused by the factor (c) can be regulated by controlling the tension occurring in each step. Therefore, the extent of this change can be also easily anticipated in the step of designing. However, the dimensional change caused by the factor (a) can be hardly controlled, since the moisture absorption and drying are carried out repeatedly in the process of producing the FPC.

Recently, there is reported a process for producing a multilayered connection board. In this process, a polyimide film is first bonded to a copper foil by using a thermoplastic polyimide to give a copper foil/polyimide film having a layered structure wherein a thermoplastic polyimide adhesive layer is formed also on the bottom face. Next, a copper connecting pattern is etched thereon and the bearer is perforated from the bottom with the use of excimer laser beams. Next, a electrically conductive paste for bearers, which is obtained by adding a metal powder to a thermoplastic polyimide resin, is filled into the holes. A desired number of boards are prepared by the same method and piled up on each other. Next, these boards are laminated at once by the hot-melt method with the use of a heat press to give a multilayered connection board. In the process of producing this multilayered connection board, it is difficult to appropriately control the dimensional stability of the polyimide film to be used as an insulation layer. On the other hand, an FPC for plasma display (PDP) should have a higher dimensional stability per se, since it is to be used in a large area compared with those for other uses. Thus, it has been urgently required to invent FPC bases satisfying these strict requirements.

Because of having the excellent characteristics as described above, the polyimide film of the present invention makes it possible to solve the above problems encountering in the field of FPC and is adequately usable as the base film of the conventional three-layered FPCs or the multilayered connection boards reported recently.

When the polyimide film of the present invention is to be used as the base film of the three-layered FPCs or the multilayered connection boards, it is particularly preferable to use a polyimide film with the use of phenylenediamines having no substituent other than amino and diaminodiphenyl ethers having no substituent other than amino. Use of the above phenylenediamine makes it possible to further elevate the elastic modulus, while use of the above diaminodiphenyl ethers makes it possible to improve the moldability of the polyimide in the step of film formation. Among these phenylenediamines, p-phenylenediamine is still preferable. Among these diaminodiphenyl ethers, 4,4'-diaminodiphenyl ether is still preferable. Moreover, it is preferable to use a polyimide film wherein the phenylenediamine and the diaminodiphenyl ether are mixed at a ratio of 10 to 90% by mol and 10 to 90% by mol, preferably 20 to 80% by mol and 20 to 80% by mol and still preferably 30 to 70% by mol and 30 to 70% by mol.

In the case of a polyimide film employed as a base film for flexible print connection boards which are to be used under severe conditions (high temperature, high humidity, etc.) and thus should be further excellent in the above properties, it is particularly preferable to use a copolymerized polyimide film, among the polyimide films of the present invention, wherein a polyimide component containing the above-described aromatic diester acid dianhydride and two specific diamine components (phenylene diamine: diaminodiphenyl ether; 5 to 40% by mol : 60 to 95% by mol) is molecular-bonded to another polyimide component containing the above-described tetracarboxylic acid dianhydride and two specific diamine components (phenylene diamine : diaminodiphenyl ether; 55 to 90% by mol 10 to 45% by mol).

A laminate for flexible print connection boards consisting of the polyimide film of the present invention as a base film and a metal layer formed thereon can be produced by selecting an appropriate method from among publicly known methods for producing a laminate for flexible print connection boards. Now, an example thereof will be illustrated.

In general, such a laminate is produced by applying a solution type adhesive on the polyimide film of the present invention or laminating a sheet type adhesive thereon, then adhering a metal foil (a copper foil, etc.) thereon and curing at a sufficient temperature for hardening the adhesive. In this case, an appropriate adhesive may be selected from various publicly known ones exemplified by epoxy resin adhesives, polyamide resin adhesives, phenolic resin adhesives, acrylic resin adhesives, polyimide resin adhesives and rubber resin adhesives. Either one of these adhesives or a mixture of two or more thereof may be employed. It is also possible to use adhesives containing various additives such as hardeners, antioxidants and ultraviolet absorbers.

When a solution type adhesive is used, the polyimide film is slit to give a definite width and then the adhesive solution is applied thereon with a bar coater, a comma coater, etc. to give a thickness of 1 to 50 $\mu$m followed by drying in an atmosphere at 50 to 200° C. for 10 to 600 seconds to thereby eliminate the organic solvent in the adhesive solution. Next, the polyimide film, onto which the adhesive has been applied, is bonded to a copper foil under heating to 50 to 200° C. The thus obtained three-layered laminate composed of the adhesive, the polyimide film and the copper foil is heat-cured at a sufficient temperature for a sufficient period so as to harden the resin employed in the adhesive.

When a sheet type adhesive is used, the protective layer of the sheet is removed and the adhesive is bonded to the polyimide film heating to 50 to 200° C. Next, the two-layered laminate composed of the polyimide film and the adhesive sheet is then bonded to a copper foil heating to 50 to 200° C. The thus obtained three-layered laminate composed of the adhesive, the polyimide film and the copper foil is heat-cured at a sufficient temperature for a sufficient period so as to harden the resin employed in the adhesive. By using these methods, three-layered laminates for flexible print connection boards can be obtained.

The adhesion strength of the above-described laminates can be improved by employing various publicly known techniques for elevating adhesion strength, for example, prior to the step of applying the adhesive onto the polyimide film or laminating the adhesive sheet thereon, subjecting the polyimide film to a pretreatment (heat treatment, corona treatment, plasma treatment under atmospheric pressure, plasma treatment under reduced pressure, treatment with coupling agents, sandblasting, alkali-treatment, acid-treatment, etc.). To improve the adhesion strength, it is also possible to add various metal compounds as disclosed, for example, in U.S. Pat. No. 4,742,099, (tin compounds, titanium compounds, etc.) to the polyamide acid or to apply various metal compound solutions onto the gel film.

The above-described heat treatment employed as the pretreatment of the polyimide film can be continuously performed by using, for example, a heat treatment system provided with a heating oven (an electric heater, etc.) between a film feeder and a dispenser. It is preferable to use a heating system, etc. provided with plural heating ovens, if necessary. It is also preferable that the maximum heating temperature is controlled so as to give the maximum atmospheric temperature of the heating ovens of from 100 to 700° C., still preferably from 200 to 600° C. By regulating the maximum heating temperature within the range as defined above, it is possible to obtain a polyimide film which is excellent in mechanical strength, adhesiveness, dimensional stability, etc. Regarding the heat treatment time, it is preferable that the polyimide film is exposed to the maximum heating temperature for 1 to 1,200 seconds, still preferably 2 to 800 seconds and particularly preferably 5 to 400 seconds. In the heat treatment, the heating temperature may be changed stepwise. For example, the temperatures of heating ovens are set respectively to 200, 400, 600, 400 and 200° C. and the polyimide film is exposed to the temperature of each oven for 200 seconds. Alternatively, the heating temperatures of the heating ovens are all set to 500° C. while varying the heating time from oven to oven.

The above-described corona treatment employed as the pretreatment of the polyimide film may be performed by using a corona treatment system commonly available for those skilled in the art. The corona treatment density, which is calculated in accordance with the following formula, preferably ranges from 50 to 800 w·min/m$^2$. Corona treatment density (w·min/m$^2$) (=Corona output (w)/{Line speed (m/min)×Treating width (m)}.

The above-described plasma treatment employed as the pretreatment of the polyimide film may be performed by using a plasma treatment system commonly available for those skilled in the art. There are two methods including one with plasma discharge under reduced pressure and the other one with the plasma discharge under atmospheric pressure. The latter one is preferred from the viewpoint of the operation cost. Although the plasma discharge under atmospheric pressure is not restricted in the type or pressure of the gas or the treatment density, the gas pressure is preferably controlled within a range of from 100 to 1,000 Torr. Examples of the gases usable for forming the plasma gas include inert gases (helium, argon, krypton, xenon, neon, radon, nitrogen, etc.), oxygen, air, carbon monoxide, carbon dioxide, carbon tetrachloride, chloroform, hydrogen, ammonia, carbon tetrafluoride, tirchlorofluoroethane and trifluoromethane. It is also possible to use publicly known fluoride gases or mixtures of the above gases. Preferable combinations of the gases include argon/oxygen, argon/ammonia, argon/helium/oxygen, argon/carbon dioxide, argon/nitrogen/carbon dioxide, argon/helium/nitrogen, argon/helium/nitrogen/carbon dioxide, argon/helium, argon/helium/acetone, helium/acetone, helium/air, argon/helium/silane, etc. The plasma treatment density, which is calculated in accordance with the following formula, preferably ranges from 100 to 20,000 w ·min/m$^2$, in particular, 300 to 10,000 w·min/m$^2$. Plasma treatment density (w·min/m$^2$)=Plasma output (w)/{Line speed (m/min)×Treating width (m)}.

The above-described treatment with a coupling agent to be carried out as the pretreatment of the polyimide film may be performed by, for example, applying a coupling agent solution on the surface of the film, lapping the surface of the film with a coupling agent solution, spraying a coupling agent solution onto the surface of the film, immersing the film in a coupling agent solution, etc. As the coupling agent, use can be made of silane-based coupling agents, titanium-based ones, aluminum-based ones, zirconium-based ones, aliphatic polyamine-based ones,. aromatic polyamine-based ones, etc. Among the aromatic polyamine-based coupling agents, it is preferable to use diethylenetriamine, N-aminoethylpiperazine or isophronediamine. It is preferable to adjust the concentration of the coupling solution to 0.005 to 50% by weight, still preferably 0.1 to 20% by weight and still preferably 1 to 10% by weight so that the coupling agent can be uniformly adhered onto the film surface and can fully exert its effect. Although the organic solvent to be used in the preparation of the coupling agent solution is not particularly restricted, use may be made therefor of methanol, ethanol, propanol, butanol, N,N-dimethylformamide, N,N-dimethylacetamide, N-methyl-2-pyrrolidone, etc. or mixtures thereof.

Furthermore, it is possible to perform two or more of the above-described pretreatments (i.e., heat treatment corona treatment, plasma treatment and treatment with coupling agent) combinedly. In such a case, these treatment may be performed at an arbitraryorder withoutrestriction. Tomoreeffectively improve the adhesion strength of the polyimide film to the thermoplastic polyimide adhesive, etc., it is preferable to perform the surface treatments in the order as will be specified below.

(a) When the heat treatment is combined with the corona treatment, the heat treatment is first performed followed by the corona treatment.

(b) When the heat treatment is combined with the plasma treatment, the heat treatment is first performed followed by the plasma treatment.

(c) When the heat treatment is combined with the treatment with a coupling agent, the heat treatment is first performed followed by the treatment with the coupling agent.

(d) When the corona treatment is combined with the plasma treatment, the corona treatment is first performed followed by the plasma treatment.

(e) When the corona treatment is combined with the treatment with a coupling agent, the corona treatment is first performed followed by the treatment with the coupling agent.

(f) When the plasma treatment is combined with the treatment with a coupling agent, the plasma treatment is first performed followed by the treatment with the coupling agent.

In addition, when three or more treatments are combined together, it is preferable to perform these treatments in the order as described above.

In recent years, there sometimes arises in the field of FPCs (flexible print connection boards) a problem relating to the interfacial adhesion strength between a polyimide film serving as the base film and an epoxy type or acrylic type adhesive. Thus, a number of techniques have been published to solve this problem. However, the working environment (high temperature, etc.) of FPCs becomes more and more stringent and, therefore, FPCs with the use of epoxy type or acrylic type adhesives, etc. cannot sustain sufficient interfacial adhesion strength between the base material and the adhesive. Under these circumstances, it has been recently proposed to use FPCs with the use of a thermoplastic polyimides as an adhesive which can withstand stringent working environment (high temperature, etc.). Thermoplastic polyimides can be used as an adhesive by the following three methods. In the first method, a thermoplastic polyimide in the form of a sheet or a powder is heat compression bonded to a non-thermoplastic polyimide film employed as the base film. In the second method, a solution of a thermoplastic polyimide in an organic solvent is applied onto a non-thermoplastic polyimide film employed as the base film followed by drying. In the third method, a solution of a polyamide acid (i.e., a precursor of a thermoplastic polyimide) in an organic solvent is applied onto a non-thermoplastic polyimide film employed as the base film followed by drying and imidation. Each of these methods suffers from a problem of the interfacial adhesion strength between an existing non-thermoplastic polyimide film employed as the base film and a thermoplastic polyimide.

However, the above-described problem of the interfacial adhesion strength between a non-thermoplastic polyimide film employed as the base film and a thermoplastic polyimide encountering in the prior art can be solved by, in the production of FPCs with the use of the polyimide film of the present invention as described above as the base film, using a thermoplastic polyimide as an adhesive and performing the above-described pretreatment such as corona treatment, plasma treatment, treatment with a coupling agent, etc. Thus, it becomes possible to manufacture FPCs which have further improved characteristics involving enhanced adhesion strength and can be used under strict conditions (high temperature, etc.).

The thermoplastic polyimide adhesive to be used in the above-described FPCs with further improved characteristics is not particularly restricted. In general, thermoplastic polyimides represented by the following general formulae (13) and (14) are usable therefor.

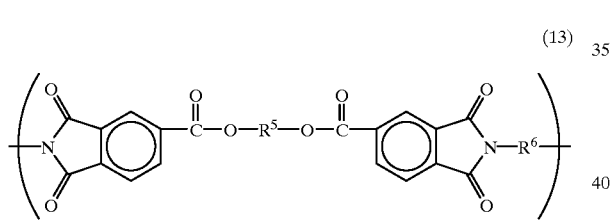
(13)

wherein $R^5$ represents a divalent organic group selected from among:

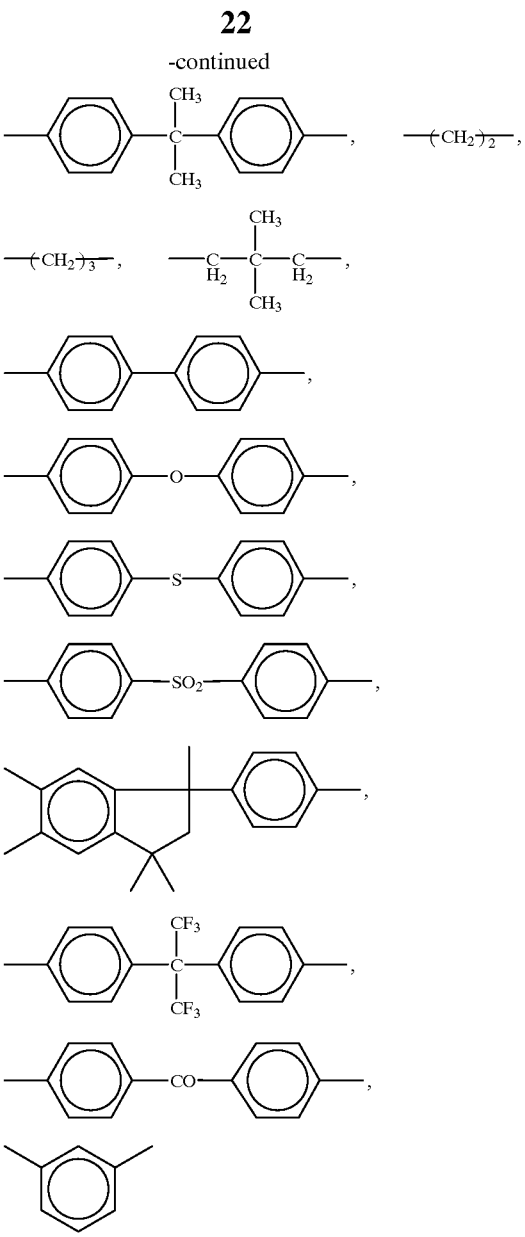

and $R^6$ represents a divalent organic group selected from among:

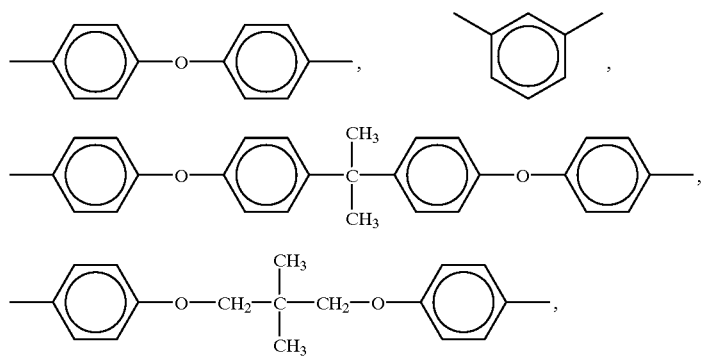

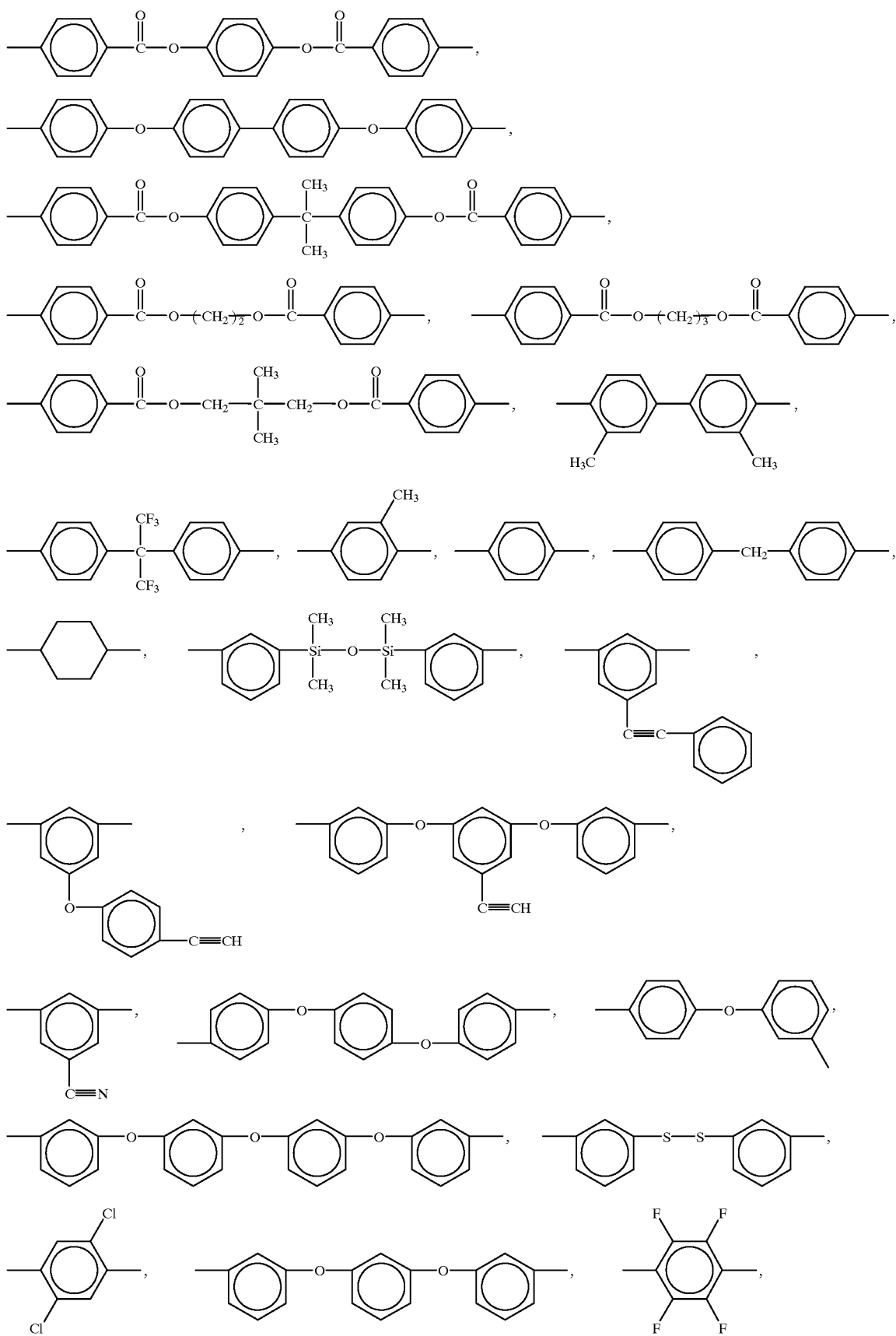

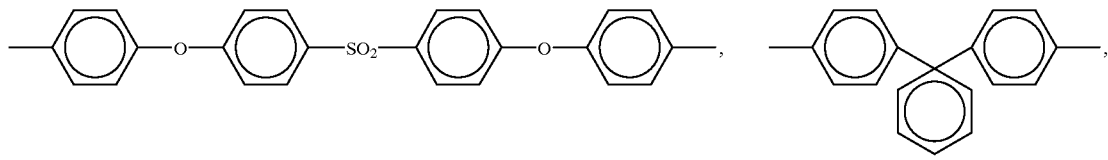
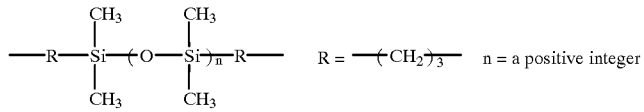  R = $-(CH_2)_3-$  n = a positive integer
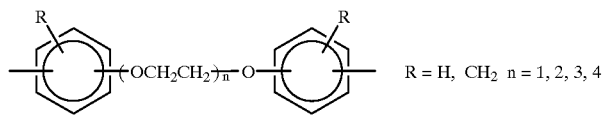  R = H, $CH_2$  n = 1, 2, 3, 4
(14)
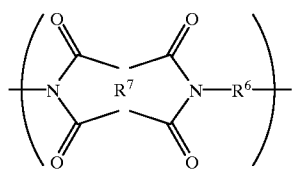
wherein $R^6$ is as defined in the general formula (13) and $R^7$ represents a divalent organic group selected from among:
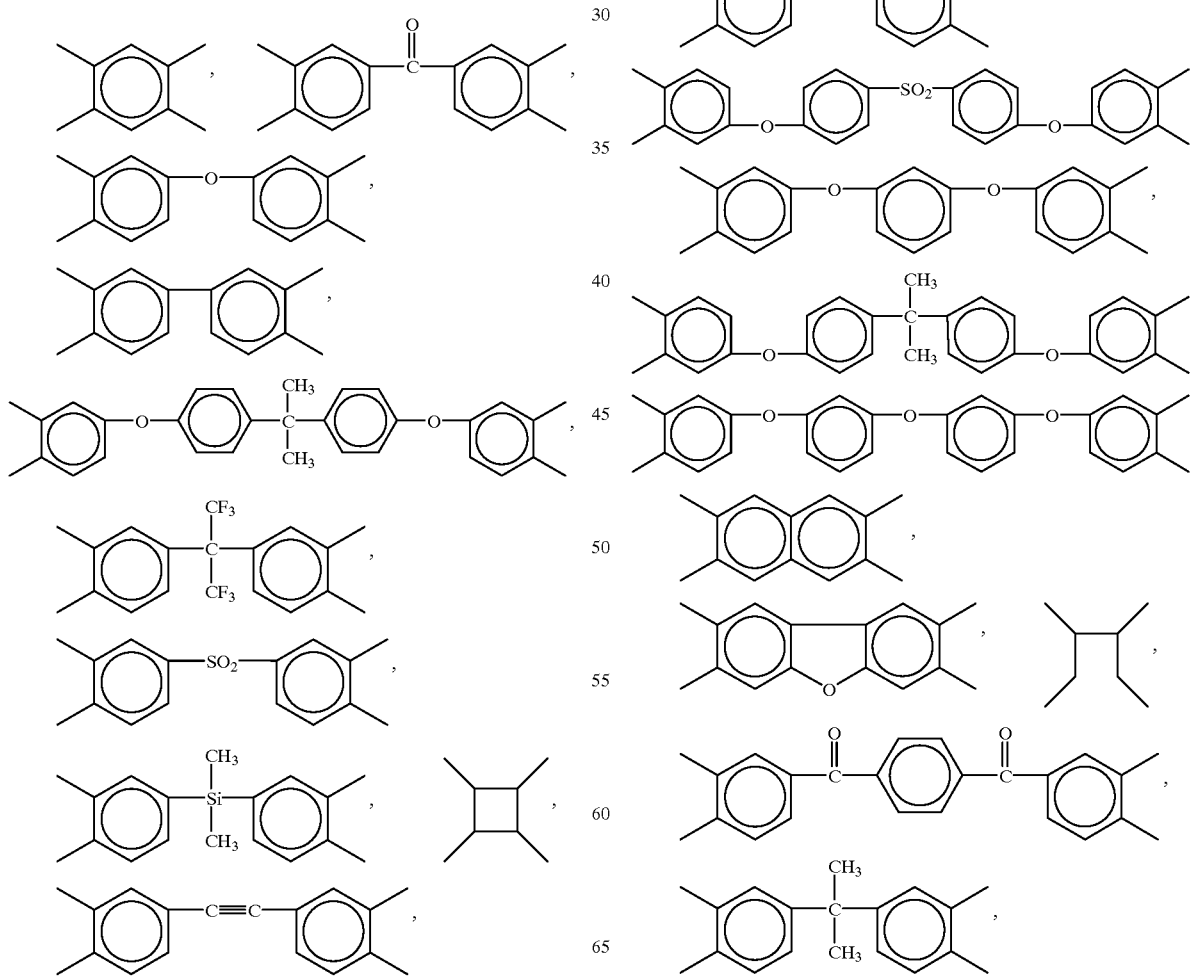

-continued

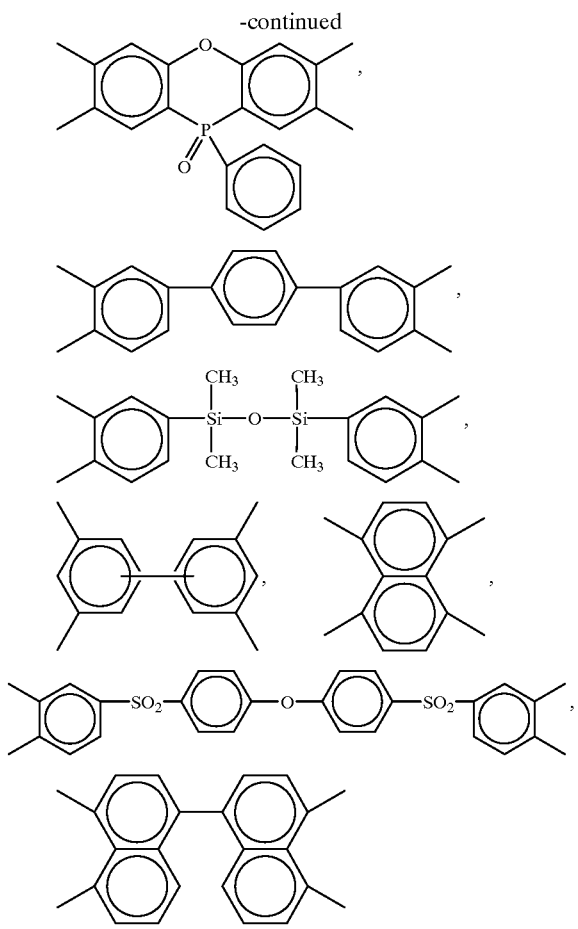

These thermoplastic polyimide resins show each a definite glass transition point within a range of 100 to 350° C. depending on the composition.

By using the thermoplastic polyimide adhesive, a polyimide film serving as the base film may be bonded to a metal the following manner. When a varnish containing a polyamide acid to be converted into a thermoplastic polyimide or a polyamide acid containing partly imidated polyimide is used as the adhesive, the varnish is applied onto one of the adherends to form a thin layer. Then the thus bonded adherend is heated to about 100 to 300° C. in the atmosphere for a definite period of time to thereby eliminate the excessive solvent and convert the polyamide acid into the polyimide having a higher stability. Next, another adherend is placed thereon and compression-bonded under 1 to 1,000 kg/cm$^2$ at 100 to 400° C. followed by curing at 100 to 400° C. Thus, the adherends are bonded to each other. When a thermoplastic polyimide in the form of a film or a powder is used as the adhesive, the film or powder is inserted into the adherends, compression bonded under 1 to 1,000 kg/cm$^2$ at 100 to 400° C. and then cured 100 to 400° C., thereby bonding the adherends to each other. When a solution of a thermoplastic polyimide in an organic solvent is used as the adhesive, this adhesive is applied onto one of the adherends. Then the adherend is heated to about 100 to 300° C. for a definite period of time to thereby eliminate the solvent. Next, another adherend is placed on the face of the former adherend on which the adhesive has been applied and compression-bonded under 1 to 1,000 kg/cm$^2$ at 100 to 400° C. followed by curing at 100 to 400° C. Thus, the adherends are bonded to each other. In the above-described bonding method, the polyimide laminate and the metal foil can be compression bonded by using a method appropriately selected from among publicly known ones, for example, the heat lamination method with the use of a hot roll or the hot press method. Heating conditions depend on the glass transition temperature of the thermoplastic polyimide employed. Namely, it is preferably to employ a heating temperature not less than the glass transition temperature, still preferably higher by 20° C. than it. The treating pressure generally ranges from 20 to 150 kg/cm$^2$. It is preferable to use a thermoplastic polyimide having a glass transition temperature of from 100 to 350° C., still preferably from 150 to 300° C.

Next, use of the polyimide film according to the present invention as the base film of an adhesive film will be described in greater detail.

With the recent tendency toward electronic equipments having high performance, high function and small size, it has been required to employ small-sized and lightweight electronic parts. Thus, there have been also required semiconductor packaging methods and wiring materials and wiring parts to be used therein having elevated density, high function and improved performance. In particular, it has been required to develop adhesive films and insulating materials which are excellent in solder heat resistance, dimensional stability and adhesion characteristics and thus adequately usable in high density packaging materials (semiconductor package, COL, LOC package, MCM (multi chip module), etc.), print connectionboard materials (multilayered FPC, etc.) and aerospace materials.

Various attempts have been made to improve solder heat resistance. JP-A-6-200216 proposes a heat resistant adhesive film for print boards consisting of a polyimide resin having a silicone unit and an epoxy resin. JP-A-7-097555 proposes a method for improving solder heat resistance by blending an alcohol-soluble polyamide resin with a specific naphthalene type epoxy rein at a specific ratio. JP-A-6-5997 proposes to improve solder heat resistance by using a polyimide film having been surface-treated with an alkaline aqueous solution. JP-A-2-79496 proposes a method for producing a flexible print connection board having a good solder heat resistance by AC-etching the surface of a rolled copper foil, applying an adhesive thereon and then laminating a plastic insulating film thereon. As described above, there have been proposed various means for obtaining connection boards with excellent solder heat resistance by, for example, modifying the surface of an adherend (surface-treatment of a polyimide film, surface-treatment of a copper foil, etc.) or improving an adhesive by introducing a silicone unit into the main chain of a polyimide. However, there has been obtained hitherto no adhesive film, insulating materials, etc. showing a satisfactory solder heat resistance, dimensional stability and adhesion characteristics.

To construct an adhesive film for packaging semiconductors as described above, an adhesive film showing a satisfactory solder heat resistance, dimensional stability and adhesion characteristics can be obtained by using the polyimide film according to the present invention as the base film. Because of being excellent in the properties as described above, an adhesive film with the use of the polyimide film according to the present invention as the base film is adequately usable in fixing or insulating electronic parts, electronic circuit boards, etc. in electronic equipments. In particular, it is adequately usable in die pad bonding of flexible print connection boards or semiconductor devices or packaging materials for COL (chip on lead) or LOC (lead on chip) where a high heat resistance is required.

The adhesive film of the present invention with the use of the polyimide film according to the present invention as the base film is produced by forming adhesive layer(s) on one or both faces of the polyimide film serving as the base film. Adhesive films, etc. having a cover film, etc. (for example, PET film) also fall within the category of the adhesive film of the present invention. It is preferable from the viewpoint of the dimensional stability that the polyimide film to be used as the base film has a high elastic modulus so that the elastic deformation due to the tension in the step of roll-to-roll molding can be relieved. More particularly speaking, the elastic modulus of the polyimide film is preferably 500 kg/mm$^2$ or more, still preferably 550 kg/mm$^2$ or more and particularly preferably 600 kg/mm$^2$ or more. It is also preferable that the polyimide film has a low water absorption which exerts favorable effects on the solder heat resistance, thereby improving the solder heat resistance both in the original state and after absorbing moisture. More particularly speaking, the water absorption of the polyimide film is preferably 3.0% or less, more 2.0% or less, still more preferably 1.8% or less and particularly preferably 1.5% or less. Moreover, it is preferable form the viewpoint of improving the pattern density and reliability that the polyimide film has a low coefficient of moisture-absorption expansion and a low coefficient of linear expansion so that the dimensional change in the heating step for film formation and in the steps of etching, washing and drying the copper-clad laminate. It is preferable that the coefficient of moisture-absorption expansion of the polyimide film is 12 ppm or less, still preferably 10 ppm or less and particularly preferable 8 ppm or less. It is preferable that the coefficient of linear expansion of the polyimide film is 15 ppm or less, still preferably 14 ppm or less and particularly preferably 12 ppm or less.

To form the adhesive layer of the adhesive film according to the present invention, use may be made of an adhesive appropriately selected from among publicly known ones similar to the above-described case for producing a laminate for flexible print connection boards by using the polyimide film of the present invention. Examples of the adhesive usable include thermoplastic polyimide adhesives, and thermosetting adhesives such as epoxy resins and phenolic resins. If necessary, the polyimide film may be pretreated by applying publicly known techniques for improving adhesion strength (heat treatment, corona treatment, plasma treatment under atmospheric pressure, plasma treatment under reduced pressure, treatment with coupling agents, etc.).

These heat treatment, corona treatment, plasma treatment under atmospheric pressure, plasma treatment under reduced pressure and treatment with coupling agents can be performed each as in the above-described case of producing a laminate for flexible print connection boards by using the polyimide film of the present invention. It is also possible to combine two or more of these pretreatments. It is preferable to perform these pretreatment, since the interfacial adhesion strength between the polyimide film and the adhesive layer can be improved thereby.

The thermoplastic polyimide adhesive to be used in the formation of the adhesive layer is not particularly restricted. In general, use is made therefor of thermoplastic polyimides represented by the above general formulae (13) and (14). The adhesive layer made of such a thermoplastic polyimide may be formed on the polyimide film employed as the base film in the same manner as in the above-described case of producing a laminate for flexible print connection boards by using the polyimide film of the present invention, though the present invention is not restricted thereto. Namely, a solution of a thermoplastic polyimide or a solution of apolyamide acid (i.e., a precursor thereof) may be casted onto the polyimide film or applied thereon with a roll coater, a bar coater, etc. followed by drying by heating, thereby forming an adhesive layer. Alternatively, a thermoplastic polyimide in the form of a film or a powder is heat compression bonded to the polyimide film by using, for example, a so-called double belt press machine provided with a heating/pressing member and an endless belt, thereby forming an adhesive layer.

Examples of the thermosetting adhesive usable in forming the adhesive layer include epoxy resins, phenolic resins, melamine resins, xylene resins and cyanate resins. Among all, epoxy resins and phenolic resins are preferable owing to the excellent insulation properties. The content of the thermosetting resin in the adhesive layer ranges from 5 to 400 parts by weight, preferably from 50 to 200 parts by weight, per 100 parts by weight of so-called rubber components, i.e., resin components other than the thermosetting resin. It is preferable to use the thermosetting resin in an amount of 5 parts by weight or more, since a decrease in the elastic modulus at high temperatures can be prevented, the deformation of a semiconductor integrated circuit connection board can be prevented during the operation of an instrument in which the semiconductor is packaged and thus the handling properties in the processing can be improved thereby. It is also possible to use the thermosetting resin in an amount of 400 parts by weight or less, since an adhesive layer having an adequate elastic modulus and an adequate coefficient of linear expansion can be thus obtained. It is never restricted in the present invention to add hardeners, accelerators, etc. to the thermosetting resin for forming the adhesive layer.

Now, an example of a process for producing an adhesive film by using the above-described thermosetting adhesive will be illustrated.

(a) A solution of an adhesive composition in a solvent is applied onto a releasable polyester film, etc. and dried. The drying is preferably performed at 100 to 200° C. for 1 to 5 minutes. Preferable example of the solvent include aromatic solvents (toluene, xylene, chlorobenzene, etc.), ketones (methyl ethyl ketone, etc.) and aprotic polar solvent (dimethylformamide, dimethylacetamide, etc.), though the present invention is not restricted thereto.

(b) The film as described in the above (a) is laminated onto a polyimide film employed as the base film. After taking off the releasable polyester film, curing is carried out at 100 to 200° C. for 10 to 20 hours to give an adhesive film.

As described above, the adhesive film consists of a polyimide film serving as the base film and an adhesive layer. Next, the preferable thickness of each layer will be illustrated. It is preferable that the thickness of the base film ranges from 15 to 90 $\mu$m. When the base film thickness is less than 15 $\mu$m, the polyimide adhesive film, which is a laminate having layers largely differing in mechanical properties from each other, frequently suffers from flash formation in the step of punching. When punching failures occur frequently, the opening between a female die and a male die is filled with punching waste and thus the punching cannot be performed continuously. In this case, there arises another problem of missregister in bonding. When the thickness of the base film exceeds 90 $\mu$m, on the other hand, a high pressure is needed in the punching step, which results in the deformation or cracking of the film. It is preferable that the thickness of the adhesive layer, which is generally made of a thermosetting adhesive or a thermoplastic polyimide adhesive, ranges from 2 to 30 µm. When the thickness of the adhesive layer is less than 2 µm, no sufficient adhesive force can be established, thus damaging the reliability. When the thickness of the adhesive layer exceeds 30 µm, on the other hand, flash formation frequently occurs in the punching step. Although the mechanism of the flash formation is not sufficiently clarified so far, it is anticipated as follows. When the base film is completely cut prior to the adhesive layer, the adhesive layer is elongated under cutting and the thus elongated part of the adhesive layer is converted into flash. To prevent the flash formation, it is therefore favorable that the base film is thickened without deteriorating the cutting properties in the punching while the adhesive layer is thinned without deteriorating the bonding reliability. More particularly speaking, it is preferable that the thickness of the base film amounts to 30 to 90% of the whole thickness. Thus, the adhesive film according to the present invention has been described in detail. A copper-clad laminate obtained by bonding a copper foil on one or both faces of the adhesive film of the present invention has a solder heat resistance of 300° C.×60 seconds or more, thus exerting favorable results (improvement in qualities and efficiency, etc.) in packaging semiconductors.

Next, use of the polyimide film according to the present invention as the base film of a magnetic recording film will be described in greater detail.

Sheets having a thin metal film formed on the surface of a base film have been employed in various technical fields. In the field of magnetic recording, for example, it has been a practice to form a magnetic layer made of a ferromagnetic material on the surface of a polymer film to give a magnetic record film (floppy disk, magnetic recording tape, etc.). In this magnetic recording field, studies have been made on magnetic recording media of the metal-application type or vapor deposition type, different form the conventional oxide-application type, with the recent tendency toward high-density recording. Furthermore, there have been developed magnetic recording media of the vertical magnetic recording system which exceed the limit of the conventional in-plane magnetic recording system. Also, processes for manufacturing magnetic recording media have been drastically changed. For example, the conventional process wherein a magnetic metal powder is mixed with a binder and the obtained mixture is applied has been replaced by novel film piling methods such as vacuum deposition, sputtering or ion-plating as in the formation of alloys such as Co—Ni or Co—Cr. In these film piling methods, the system is subjected to a considerably high temperature due to the radiation heat from the evaporation source and the liberation of kinetic energy from deposition particles in the step of the formation of the magnetic layer film on the base film. To impart a sufficiently large magnetic coercive force as in the case of a Co—Cr film, it is sometimes required to elevate the base film temperature to 100° C. or above, or to 160° C. or above in some cases. Thus, the base film of the metal foil should have a considerably high heat resistance in the film piling methods.

However, polyester films such as polyethylene terephthalate films are frequently employed as the base film in the conventional magnetic recording media. Since these polyester films have low heat resistance, it is necessary to lower the can temperature below the ice point and to sufficiently adhere the base film to the can so as to facilitate the heat discharge in the step of forming a magnetic layer in the deposition method. Even though these procedures are carried out, polyethylene terephthalate films frequently suffer from partial heat damage or the formation of heat decomposition products (oligomers, etc.) causing small projections on the surface thereof. In addition, polyethylene terephthalate is hardly usable in the formation of a magnetic layer exposed to a heat history exceeding 160° C. even though momentarily.

On the other hand, polyimide films and polyamide films have been known as heat resistant films. Polyimide films have extremely high heat resistance among polymer materials and, therefore, can be continuously used at 250° C. Conventional polyimide films involve those made of polymers of pyromellitic acid dianhydride (hereinafter referred to simply as PMDA) with diaminodiphenyl ether (hereinafter referred to simply as ODA), polymers of biphenyltetracarboxylic acid dianhydride (hereinafter referred to simply as BPDA) with ODA, and polymers of BPDA with p-phenylenediamine (hereinafter referred to simply as p-PDA). However, the polyimide films of these three types are insufficient in heat resistance or mechanical properties, i.e., showing excessively high coefficient of linear expansion (30 ppm or above at 20 to 300° C.) or excessively low coefficient of linear expansion (4 ppm or above at 20 to 300° C.). Magnetic recording media consisting of these conventional polyimide films or polyamide film provided with an alloy film formed on the surface by the deposition or sputtering method frequently suffer from serious curling.

The above-described curling of the magnetic recording media is seemingly caused by: (a) stress of the magnetic layer; (b) the difference in the coefficients of linear expansion of the base film layer and the magnetic layer and heat stress due to the heat shrinkage of the base film layer; and (c) mechanical stress applied on the base film during the formation of the magnetic layer. In the case of a magnetic recording medium wherein the base film temperature should be considerably elevated during the formation of the magnetic layer because of the magnetic characteristics as in the case of Co—Cr films, in particular, the difference in the coefficients of linear expansion of the base film layer and the magnetic layer serves as a large factor causing the curling. However, there has been found out no effective means for eliminating curling hitherto. The conventional polyimide films have tensile elastic modulus, which relates to the rigidity of magnetic recording media, of about 300 kg/mm$^2$, while that of aromatic polyamide films ranges from about 1,000 to 1,200 kg/mm$^2$. Namely, these films are either too soft or too hard, compared with polyethylene terephthalate, thus failing to show an adequate tensile elastic modulus. Therefore, the conventional magnetic recording media are poor in traveling properties and frequently suffer from troubles such as winding irregularity, head touch failure, etc. Use of the polyimide film according to the present invention as the base film of magnetic recording films makes it possible to solve the above-described problems encountering in the conventional magnetic recording media such as magnetic recording films. In general, properties required as magnetic recording films are as follows: (a) being normally wound without forming any irregularity on surface, in winding hardness or thickness; (b) having an adequately high tensile elastic modulus (500 to 800 kg/mm$^2$); (c) being excellent in heat resistance; and (d) having a high dimensional stability under changes in temperature or humidity, namely, having a small heat shrinkage ratio, a small coefficient of linear expansion, a small coefficient of moisture-absorption expansion and no in-film anisotropy. By using the polyimide film according to the present invention as the base film, it is possible to obtain a magnetic recording film which satisfies the required properties as described above and is free from the problem of curling.

The polyimide film to be used as the base film of a magnetic recording film is one which preferably has an elastic modulus of 500 kg/mm² or more (preferably 550 kg/mm² or more), an average coefficient of linear expansion at 20 to 300° C. of 1 to 20 ppm (preferably 1 to 16 ppm), a ratio of the coefficient of linear expansion in the major direction (MD) to that of the transverse direction (TD) of from 1/5 to 5 (preferably from 1/3 to 3 and still preferably from 1/2 to 2), an average coefficient of moisture-absorption expansion in a range of 30% RH to 80% RH of from 2 to 20 ppm (preferably 1 to 15 ppm and still preferably 1 to 10 ppm), a heat shrinkage ratio of the film at ordinary temperature determined by heating from ordinary temperature to 300° C. and then maintaining the same temperature for 2 hours of from −1.0% to not more than 1.0%, and a thickness of 50 μm or less, and can maintain these properties even after reducing the thickness to 2 to 15 μm.

Finally, use of the polyimide film according to the present invention in hard disk suspension connection boards will be described in greater detail.

In recent years, flexible print connection boards have attracted attention and employed frequently, in contrast to the conventional hard print connection boards, as connection boards for electronic parts. Among these flexible print connection boards, it is necessary in suspension connection boards for magnetic head of hard disk drives etc. to elevate the density of recording bit by locating a magnetic head as close as possible to a disc based on well-balanced aerial lifting power and the rigidity-counterforce of a print connection board. To improve the lifting style of the head, it is advantageous that the connection pattern from the head is formed directly on an ultrafine supporting spring made of stainless. Thus, boards produced by the above-described process have been adequately employed in this field.

When a pattern is formed on the hard disk suspension connection board as described above, the board undergoes dimensional changes particularly in the etching step. It is considered that these dimensional changes are caused by any of the following three factors: (a) a dimensional change in the base film serving as an insulating material or the base due to the moisture absorption/desorption; (b) a strain caused by the difference in heat expansion of the stainless foil and the base film; (c) a strain caused by a tension occurring in each step. Among all, the dimensional change caused by the moisture absorption/desorption of the base film is a serious problem. This is because, this dimensional change can be hardly estimated in the step of the initial designing, since washing and drying procedures are carried out repeatedly in the process of producing flexible print connection boards typified by hard disk suspension connection boards.

When the coefficient of linear expansion of the stainless, directly on which a connection is formed, largely differs from the coefficient of linear expansion of the base film in a suspension connection board for hard disk drive magnetic heads, moreover, the board becomes warped due to the dimensional change of the board, thereby bringing about a serious problem of strain due to the difference in heat expansion.

By using the polyimide film according to the present invention as the base film of such a hard disk suspension connection board, the above-described problems encountering in the conventional hard disk suspension connection boards can be solved and thus a hard disk suspension connection board having excellent properties and being free from the above problems can be obtained. Namely, the polyimide film of the present invention has excellent characteristics such as a high elastic modulus, a low water absorption, a small coefficient of moisture-absorption expansion and a small coefficient of linear expansion comparable to that of stainless.

Now, preferred embodiments of the present invention will be described by reference to the following Examples. However, it should be understood that the present invention is not construed as being limited to these Examples. Those skilled in the art can make various changes, alterations and modifications without departing form the scope of the invention.

The following abbreviations are used in the Examples and Comparative Examples.

PMDA: Pyromellitic acid dianhydride.
TMHQ: p-Phenylenebis(trimellitic acid monoester acid anhydride).
ODA: 4,4'-Diaminodiphenyl ether.
p-PDA: p-Phenylenediamine.
DMF: Dimethylformamide.
DMAc: Dimethylacetamide.
AA: Acetic anhydride.
IQ: Isoquinoline.

COMPARTIVE EXAMPLE 1

DMF was introduced into a separable flask and 1 equivalent of ODA was added thereto. The resultant mixture was well stirred at room temperature until ODA was completely dissolved. Next, 0.85 equivalents of powdery PMDA was slowly added thereto followed by stirring for 40 minutes. Then a solution of 0.15 equivalents of PMDA dissolved in DMF was slowly added thereto and the resultant mixture was stirred under cooling for 1 hour to give a polyamide acid solution in DMF. DMF was employed in such an amount as giving the feeding concentration of the diamine and aromatic tetracarboxylic acid dianhydride monomers of 18% by weight.

Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 100° C. for about 5 minutes, at about 300° C. for about 30 seconds, at about 400° C. for about 30 seconds and at about 510° C. for about 30 seconds to thereby give a polyimide film of about 10 μm in thickness.

EXAMPLE 1

Component A

DMAc was introduced into a separable flask and 2 equivalents of ODA and 3 equivalents of p-PDA were added thereto. The resultant mixture was well stirred at room temperature until ODA and p-PDA were completely dissolved. Next, 4.25 equivalents of powdery TMHQ was slowly added thereto followed by stirring for 40 minutes. Then a solution of 0.75 equivalents of TMHQ dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Component B

DMF was introduced into a separable flask and 3 equivalents of ODA and 1 equivalent of p-PDA were added thereto.

The resultant mixture was well stirred at room temperature until ODA and p-PDA were completely dissolved. Next, 3.4 equivalents of powdery PMDA was slowly added thereto followed by stirring for 40 minutes. Then a solution of 0.6 equivalents of PMDA dissolved in DMF was slowly added thereto and the resultant mixture was stirred under cooling for 1 hour to give a polyamide acid solution in DMF. DMF was employed in such an amount as giving the feeding concentration of the diamine and aromatic tetracarboxylic acid dianhydride monomers of 18% by weight.

Next, the components A and B were mixed at a weight ratio of 1:1 and stirred The polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 100° C. for about 5 minutes, at about 300° C. for about 30 seconds, at about 400° C. for about 30 seconds and at about 510° C. for about 30 seconds to thereby give a polyimide film of about 10 µm in thickness.

EXAMPLE 2

DMAc was introduced into a separable flask and 4 equivalents of ODA and 2 equivalents of p-PDA were added thereto. The resultant mixture was well stirred at room temperature until ODA and p-PDA were completely dissolved. Next, 6 equivalents of TMHQ was slowly added thereto followed by stirring for 40 minutes. 1 equivalent of ODA and 3 equivalents of p-PDA were added and the mixture was stirred for 40 minutes. Next, 3.5 equivalents of PMDA was added and the mixture was stirred for 40 minutes. Then a solution of 0.5 equivalents of PMDA dissolved in DMAc was slowly added thereto and the resultant mixture was stirred under cooling for 1 hour to give a polyamide acid solution in DMAc.

DMAc was employed in such an amount as giving the feeding concentration of the diamine and aromatic tetracarboxylic acid dianhydride monomers of 18% by weight.

Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 100° C. for about 5 minutes, at about 300° C. for about 30 seconds, at about 400° C. for about 30 seconds and at about 510° C. for about 30 seconds to thereby give a polyimide film of about 10 µm in thickness.

EXAMPLE 3

DMAc was introduced into a separable flask and 4.5 equivalents of ODA and 5.5 equivalents of p-PDA were added thereto. The resultant mixture was well stirred at room temperature until ODA and p-PDA were completely dissolved. Next, 5 equivalents of PMDA was added thereto followed by stirring for 40 minutes. Then 4.5 equivalents of TMHQ was added and the mixture was stirred for 40 minutes. Then a solution of 0.5 equivalents of TMHQ dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 100° C. for about 5 minutes, at about 300° C. for about 30 seconds, at about 400° C. for about 30 seconds and at about 510° C. for about 30 seconds to thereby give a polyimide film of about 10 µm in thickness.

EXAMPLE 4

DMAc was introduced into a separable flask and 5 equivalents of ODA and 5 equivalents of p-PDA were added thereto. The resultant mixture was well stirred at room temperature until ODA and p-PDA were completely dissolved. Next, 5 equivalents of TMHQ was added thereto followed by stirring for 40 minutes. Then 4.5 equivalents of PMDA was added and the mixture was stirred for 40 minutes. Then a solution of 0.5 equivalents of PMDA dissolved in DMAc was slowly added thereto and the resultant mixture was stirred under cooling for 1 hour to give a polyamide acid solution in DMAc.

DMAc was employed in such an amount as giving the feeding concentration of the diamine and aromatic tetracarboxylic acid dianhydride monomers of 18% by weight.

Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 100° C. for about 5 minutes, at about 300° C. for about 30 seconds, at about 400° C. for about 30 seconds and at about 510° C. for about 30 seconds to thereby give a polyimide film of about 10 µm in thickness.

The coefficients of linear expansion, coefficients of moisture-absorption expansion, elastic moduli, water absorptions and relative permittivities of the films obtained in Comparative Example 1 and Examples 1 to 4 were measured. Table 1 summarizes the results.

TABLE 1

|  | Comp. Ex. 1 | Ex. 1 | Ex. 2 | Ex. 3 | Ex. 4 |
|---|---|---|---|---|---|
| Modulus of elasticity (kg/mm$^2$) | 300 | 550 | 680 | 630 | 600 |
| Coefficient of linear expansion (ppm) | 32 | 9 | 8 | 9 | 9 |
| Coefficient of moisture-absorption expansion (ppm) | 21 | 8 | 4 | 5 | 5 |
| Water absorption (%) | 3 | 1.5 | 0.9 | 1.4 | 1.2 |
| Relative permittivity |  |  |  |  |  |

TABLE 1-continued

| Temperature/Frequency | Comp. Ex. 1 | Ex. 1 | Ex. 2 | Ex. 3 | Ex. 4 |
|---|---|---|---|---|---|
| −50° C./1 KHz | 3.50 | 3.08 | 3.10 | 3.09 | 3.10 |
| −0° C./1 KHz | 3.46 | 3.18 | 3.20 | 3.19 | 3.18 |
| 22° C./1 KHZ | 3.48 | 3.24 | 3.22 | 3.23 | 3.23 |
| 100° C./1 KHz | 3.01 | 3.11 | 3.10 | 3.12 | 3.11 |
| 200° C./1 KHz | 3.00 | 3.16 | 3.17 | 3.19 | 3.15 |
| 22° C./100 Hz | 3.51 | 3.28 | 3.25 | 3.30 | 3.25 |
| 22° C./10 KHz | 3.46 | 3.20 | 3.17 | 3.20 | 3.21 |
| 22° C./100 KKHz | 3.43 | 3.15 | 3.14 | 3.14 | 3.15 |
| 22° C./1 MHz | 3.40 | 3.10 | 3.10 | 3.11 | 3.10 |

Coefficient of linear expansion means a coefficient of linear expansion measured at 20 to 300° C. under a nitrogen gas stream by using TMA-8140 manufactured by Rigaku Denki.

Coefficient of moisture-absorption expansion was determined by the following calculation method (1) with the use of the following measurement device (2).

(1) Method for calculating moisture elongation

While changing moisture as shown in FIG. 2, the sample length gain and moisture change were measured simultaneously and thus the moisture elongation were calculated (measurement temperature: 50° C.). Moisture elongation= {moisture absorption length gain (d)/(sample length+c)}/ moisture change (b).

b: 35% RH (low humidity side), 75% RH (high humidity side).

c: Heat expansion with temperature rise from room temperature to the measurement temperature after setting sample.

(2) Measurement device:

① Measurement temperature was controlled by a temperature controller in a hot water tank.

② To elevate the humidity in a thermostat, $N_2$ bubbled into a steam generation tank and the humidity conditions were programmed by elevating temperature with the use of a mantle heater. Temperature in the inlet part located between the thermostats was controlled to thereby prevent dew formation.

③ Temperature at a humidity sensor was regulated to the same level as the thermostat temperature. The temperature-controlling unit is provided at the sensor body outside the thermostat.

④ Length (gain) was measured with TMA (TMC-140) manufactured by Shimadzu Corporation.

Tensile elastic modulus was determined in accordance with ASTM-D882.

Water absorption was determined in accordance with the following formula wherein W1 means the weight of a film sample determined after drying at 150° C. for 30 minutes, and W2 means the weight of the sample determined after immersing in distilled water for 24 hours and then wiping off the water drops on the surface thereof. Water absorption (%)=(W2−W1)/W1×100.

Relative permittivity was determined under the following conditions.

The thickness of a sample piece was calculated by the volumetric specific gravity method.

Electrode type: in accordance with JIS-K6911.

Test environment: 22±2° C., 60±5% RH.

Frequency: 100Hz, 1 kHz, 10 kHz, 100 kHz, 1 MHz.

Temperature: −50° C., 0° C., 22° C., 100° C., 200° C.

EXAMPLE 5

DMAc was introduced into a separable flask and 8 equivalents of ODA and 5 equivalents of p-PDA were added thereto. The resultant mixture was well stirred at room temperature until ODA and p-PDA were completely dissolved. Next, 5 equivalents of TMHQ and 6.05 equivalents of powdery PMDA were added thereto followed by stirring for 40 minutes. Then a solution of 1.95 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Next, the polyamide acid solution was mixed with AA and IQ and poured onto a glass plate. After drying at about 150° C. for about 5 minutes, the polyamide acid film was peeled off from the glass plate. Then this film was fixed to a supporting frame and dehydrated and cyclized by heating successively at about 100° C. for about 5 minutes, at about 300° C. for about 30 seconds, at about 400° C. for about 30 seconds and at about 510° C. for about 30 seconds to thereby give a polyimide film of about 10 μm in thickness.

EXAMPLE 6

DMAc was introduced into a separable flask and 12 equivalents of ODA and 11 equivalents of p-PDA were added thereto. The resultant mixture was well stirred at room temperature until ODA and p-PDA were completely dissolved. Next, 15 equivalents of TMHQ and 4.55 equivalents of powdery PMDA were slowly added thereto followed by stirring for 40 minutes. Then a solution of 3.45 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 100° C. for about 5 minutes, at about 300° C. for about 30 seconds, at about 400° C. for about 30 seconds and at about 510° C. for about 30 seconds to thereby give a polyimide film of about 10 μm in thickness.

EXAMPLE 7

A polyimide film of about 10 μm in thickness was obtained in the same manner as in Example 1.

EXAMPLE 8

Component A

DMAC was introduced into a separable flask and 2 equivalents of ODA and 3 equivalents of p-PDA were added thereto. The resultant mixture was well stirred at room temperature until ODA and p-PDA were completely dissolved. Next, 4.25 equivalents of powdery TMHQ was slowly added thereto followed by stirring for 40 minutes. Then a solution of 0.75 equivalents of TMHQ dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Component B

DMF was introduced into a separable flask and 3 equivalents of ODA and 1 equivalent of p-PDA were added thereto. The resultant mixture was well stirred at room temperature until ODA and p-PDA were completely dissolved. Next, 3.4 equivalents of powdery PMDA was slowly added thereto followed by stirring for 40 minutes. Then a solution of 0.6 equivalents of PMDA dissolved in DMF was slowly added thereto and the resultant mixture was stirred under cooling for 1 hour to give a polyamide acid solution in DMF. DMF was employed in such an amount as giving the feeding concentration of the diamine and aromatic tetracarboxylic acid dianhydride monomers of 18% by weight.

Then the components A and B were mixed at a weight ratio of 2:1 and stirred.

Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 100° C. for about 5 minutes, at about 300° C. for about 30 seconds, at about 400° C. for about 30 seconds and at about 510° C. for about 30 seconds to thereby give a polyimide film of about 10 μm in thickness.

EXAMPLE 9

A polyimide film of about 10 μm in thickness was obtained in the same manner as in Example 3.

EXAMPLE 10

A polyimide film of about 10 μm in thickness was obtained in the same manner as in Example 2.

EXAMPLE 11

A polyimide film of about 10 μm in thickness was obtained in the same manner as in Example 4.

The coefficients of linear expansion, coefficients of moisture-absorption expansion and elastic moduli of the films obtained in Comparative Example 1 and Examples 5 to 11 were measured. Table 2 summarizes the results.

Coefficient of linear expansion means a coefficient of linear expansion measured at 20 to 300° C. under a nitrogen gas stream by using TMA-8140 manufactured by Rigaku Denki.

Coefficient of moisture-absorption expansion was determined in the same manner as in Comparative Example 1 and Examples 1 to 4.

Tensile elastic modulus and tensile elongation were each determined in accordance with ASTM-D882.

Water absorption was determined in accordance with the following formula wherein W1 means the weight of a film sample determined after drying at 150° C. for 30 minutes, and W2 means the weight of the sample determined after immersing in distilled water for 24 hours and then wiping off the water drops on the surface thereof. Water absorption (%)=(W2−W1)/W1×100.

Plasma etching characteristics were evaluated by using a parallel plate type RIE unit RMD-450B manufactured by ULVAC. The test conditions are as follows.

Etching gas: $O_2$+20% $CF_o$.

Gas flow rate: 400 SCCM.

Gas pressure: 100 mTorr.

RF power: 0.6 W/cm$^2$.

Electrode temperature: 40° C.

TABLE 2

|  | Coefficient of linear Expansion (ppm) | Coefficient of moisture absorption expansion (ppm) | Elastic modulus (kg/mm$^2$) | Tensile elongation (%) | Water Absorption (%) | plasma etching properties |
|---|---|---|---|---|---|---|
| C. Ex. 1 | 32 | 20 | 300 | 30 | 3.0 | x |
| Ex. 5 | 12 | 7 | 550 | 40 | 1.0 | ○ |
| Ex. 6 | 10 | 4 | 700 | 30 | 0.8 | ○ |
| Ex. 7 | 9 | 8 | 550 | 40 | 1.5 | ○ |
| Ex. 8 | 8 | 7 | 640 | 30 | 1.4 | ○ |
| Ex. 9 | 9 | 5 | 630 | 40 | 1.4 | ○ |
| Ex. 10 | 8 | 4 | 680 | 40 | 0.9 | ○ |
| Ex. 11 | 9 | 5 | 600 | 40 | 1.2 | ○ |

COMPARATIVE EXAMPLE 2

DMF was introduced into a separable flask and 1 equivalent of ODA was added thereto. The resultant mixture was well stirred at room temperature until ODA was completely dissolved. Next, 0.85 equivalents of powdery PMDA was slowly added thereto followed by stirring for 40 minutes.

Then a solution of 0.15 equivalents of PMDA dissolved in DMF was slowly added thereto and the resultant mixture was stirred under cooling for 1 hour to give a polyamide acid solution in DMF. DMF was employed in such an amount as giving the feeding concentration of the diamine and aromatic tetracarboxylic acid dianhydride monomers of 18% by weight.

Next, the polyamide acid thus obtained was mixed with AA and IQ and then casted onto a stainless endless belt. After drying at 100° C. for 5 minutes, the self-supporting prefilm thus formed was peeled off from the belt. With holding both ends, the prefilm was continuously fed into an oven wherein it was heated at 300° C. for 30 seconds, at 400° C. for 30 seconds and at 510° C. for 30 seconds. Next, it was gradually cooled to room temperature in an annealing chamber. When the film was taken out from the annealing chamber, it was peeled off from the pin. Then various characteristics of the film were measured while referring the direction of the film flow as to the MD direction and the transverse direction as to the TD direction.

EXAMPLE 12

DMAc was introduced into a separable flask and 4 equivalents of ODA and 2 equivalents of p-PDA were added thereto. The resultant mixture was well stirred at room temperature until ODA and p-PDA were completely dissolved. Next, 5.95 equivalents of powdery TMHQ was slowly added thereto followed by stirring for 40 minutes. After adding 1 equivalent of ODA and 3 equivalents of p-PDA, the mixture was stirred for 40 minutes. Next, 4 equivalents of powdery PMDA was slowly added thereto and the mixture was stirred for 1 hour. Then a solution of 0.05 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Next, the polyamide acid thus obtained was mixed with AA and IQ and then casted onto a stainless endless belt. After drying at 100° C. for 5 minutes, the self-supporting prefilm thus formed was peeled off from the belt. With holding both ends, the prefilm was continuously fed into an oven wherein it was heated at 300° C. for 30 seconds, at 400° C. for 30 seconds and at 510° C. for 30 seconds. Next, it was gradually cooled to room temperature in an annealing chamber. When the film was taken out from the annealing chamber, it was peeled off from the pin. Then various characteristics of the film were measured while referring the direction of the film flow as to the MD direction and the transverse direction as to the TD direction.

EXAMPLE 13

DMAc was introduced into a separable flask and 1 equivalent of ODA and 3 equivalents of p-PDA were added thereto. The resultant mixture was well stirred at room temperature until ODA and p-PDA were completely dissolved. Next, 3.95 equivalents of powdery PMDA was slowly added thereto followed by stirring for 40 minutes. After adding 4 equivalents of ODA and 2 equivalents of p-PDA, the mixture was stirred for 40 minutes. Next, 6 equivalents of powdery TMHQ was slowly added thereto and the mixture was stirred for 1 hour. Then a solution of 0.05 equivalents of TMHQ dissolved in DMAc was slowly added thereto and the resultant mixture was stirred under cooling for 1 hour to give a polyamide acid solution in DMAc. DMAC was employed in such an amount as giving the feeding concentration of the diamine and aromatic tetracarboxylic acid dianhydride monomers of 18% by weight.

Next, the polyamide acid thus obtained was mixed with AA and IQ and then casted onto a stainless endless belt. After drying at 100° C. for 5 minutes, the self-supporting prefilm thus formed was peeled off from the belt. With holding both ends, the prefilm was continuously fed into an oven wherein it was heated at 300° C. for 30 seconds, at 400° C. for 30 seconds and at 510° C. for 30 seconds. Next, it was gradually cooled to room temperature in an annealing chamber. When the film was taken out from the annealing chamber, it was peeled off from the pin. Then various characteristics of the film were measured while referring the direction of the film flow as to the MD direction and the transverse direction as to the TD direction.

EXAMPLE 14

DMAc was introduced into a separable flask and 4 equivalents of ODA and 1 equivalent of p-PDA were added thereto. The resultant mixture was well stirred at room temperature until ODA and p-PDA were completely dissolved. Next, 4.95 equivalents of powdery TMHQ was slowly added thereto followed by stirring for 40 minutes. After adding 0.5 equivalents of ODA and 4.5 equivalents of p-PDA, the mixture was stirred for 40 minutes. Next, 5 equivalents of powdery PMDA was slowly added thereto and the mixture was stirred for 1 hour. Then a solution of 0.5 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Next, the polyamide acid thus obtained was mixed with AA and IQ and then casted onto a stainless endless belt. After drying at 100° C. for 5 minutes, the self-supporting prefilm thus formed was peeled off from the belt. With holding both ends, the prefilm was continuously fed into an oven wherein it was heated at 300° C. for 30 seconds, at 400° C. for 30 seconds and at 510° C. for 30 seconds. Next, it was gradually cooled to room temperature in an annealing chamber. When the film was taken out from the annealing chamber, it was peeled off from the pin. Then various characteristics of the film were measured while referring the direction of the film flow as to the MD direction and the transverse direction as to the TD direction.

The coefficients of linear expansion, coefficients of moisture-absorption expansion and elastic moduli of the films obtained in Comparative Example 1 and Examples 12 to 14 were measured. Table 3 summarizes the results.

Coefficient of linear expansion means a coefficient of linear expansion measured at 20 to 300° C. under a nitrogen gas stream by using TMA-8140 manufactured by Rigaku Denki.

Coefficient of moisture-absorption expansion was determined in the same manner as in Comparative Example 1 and Examples 1 to 4.

Tensile elastic modulus was determined in accordance with ASTM-D882.

Water absorption was determined in accordance with the following formula wherein W1 means the weight of a film sample determined after drying at 150° C. for 30 minutes, and W2 means the weight of the sample determined after immersing in distilled water for 24 hours and then wiping off the water drops on the surface thereof. Water absorption (%)=(W2−W1)/W1×100.

TABLE 3

|  | Coefficient of linear expansion (ppm) | | Coefficient of moisture absorption expansion (ppm) | | Elastic modulus | Water Absorption |
| --- | --- | --- | --- | --- | --- | --- |
|  | MD | TD | MD | TD | (kg/mm²) | (%) |
| C. Ex. 2 | 30 | 34 | 18 | 22 | 300 | 3.0 |
| Ex. 12 | 8 | 7 | 5 | 4 | 680 | 0.9 |
| Ex. 13 | 7 | 7 | 4 | 4 | 650 | 1.3 |
| Ex. 14 | 6 | 7 | 3 | 4 | 780 | 1.0 |

EXAMPLE 15

DMAc was introduced into a separable flask and 8 equivalents of ODA and 5 equivalents of p-PDA were added thereto. The resultant mixture was well stirred at room temperature until ODA and p-PDA were completely dissolved. Next, 5 equivalents of TMHQ and 6.05 equivalents of powdery PMDA were slowly added thereto followed by stirring for 40 minutes. Then a solution of 1.95 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Next, the polyamide acid thus obtained was mixed with AA and IQ and then casted onto a stainless endless belt. After drying at 100° C. for 5 minutes, the self-supporting prefilm thus formed was peeled off from the belt. With holding both ends, the prefilm was continuously fed into an oven wherein it was heated at 300° C. for 30 seconds, at 400° C. for 30 seconds and at 510° C. for 30 seconds. Next, it was gradually cooled to room temperature in an annealing chamber. When the film was taken out from the annealing chamber, it was peeled off from the pin. Then various characteristics of the film were measured while referring the direction of the film flow as to the MD direction and the transverse direction as to the TD direction.

EXAMPLE 16

DMAc was introduced into a separable flask and 12 equivalents of ODA and 11 equivalents of p-PDA were added thereto. The resultant mixture was well stirred at room temperature until ODA and p-PDA were completely dissolved. Next, 15 equivalents of TMHQ and 4.55 equivalents of powdery PMDA were slowly added thereto followed by stirring for 40 minutes. Then a solution of 3.45 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Next, the polyamide acid thus obtained was mixed with AA and IQ and then casted onto a stainless endless belt. After drying at 100° C. for 5 minutes, the self-supporting prefilm thus formed was peeled off from the belt. With holding both ends, the prefilm was continuously fed into an oven wherein it was heated at 300° C. for 30 seconds, at 400° C. for 30 seconds and at 510° C. for 30 seconds. Next, it was gradually cooled to room temperature in an annealing chamber. When the film was taken out from the annealing chamber, it was peeled off from the pin. Then various characteristics of the film were measured while referring the direction of the film flow as to the MD direction and the transverse direction as to the TD direction.

EXAMPLE 17

Component A

DMAc was introduced into a separable flask and 2 equivalents of ODA and 3 equivalents of p-PDA were added thereto. The resultant mixture was well stirred at room temperature until ODA and p-PDA were completely dissolved. Next, 4.25 equivalents of powdery TMHQ was slowly added thereto followed by stirring for 40 minutes. Then a solution of 0.75 equivalents of TMHQ dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Component B

DMF was introduced into a separable flask and 3 equivalents of ODA and 1 equivalent of p-PDA were added thereto. The resultant mixture was well stirred at room temperature until ODA and p-PDA were completely dissolved. Next, 3.4 equivalents of powdery PMDA was slowly added thereto followed by stirring for 40 minutes. Then a solution of 0.6 equivalents of PMDA dissolved in DMF was slowly added thereto and the resultant mixture was stirred under cooling for 1 hour to give a polyamide acid solution in DMF. DMF was employed in such an amount as giving the feeding concentration of the diamine and aromatic tetracarboxylic acid dianhydride monomers of 18% by weight.

Next, the components A and B were mixed at a weight ratio of 1:1 and stirred.

Subsequently, the polyamide acid thus obtained was mixed with AA and IQ and then casted onto a stainless endless belt. After drying at 100° C. for 5 minutes, the self-supporting prefilm thus formed was peeled off from the belt. With holding both ends, the prefilm was continuously fed into an oven wherein it was heated at 300° C. for 30 seconds, at 400° C. for 30 seconds and at 510° C. for 30 seconds. Next, it was gradually cooled to room temperature in an annealing chamber. When the film was taken out from the annealing chamber, it was peeled off from the pin. Then various characteristics of the film were measured while referring the direction of the film flow as to the MD direction and the transverse direction as to the TD direction.

EXAMPLE 18

Component A

DMAc was introduced into a separable flask and 2 equivalents of ODA and 3 equivalents of p-PDA were added thereto. The resultant mixture was well stirred at room temperature until ODA and p-PDA were completely dissolved. Next, 4.25 equivalents of powdery TMHQ was slowly added thereto followed by stirring for 40 minutes. Then a solution of 0.75 equivalents of TMHQ dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Component B

DMF was introduced into a separable flask and 3 equivalents of ODA and 1 equivalent of p-PDA were added thereto. The resultant mixture was well stirred at room temperature until ODA and p-PDA were completely dissolved. Next, 3.4 equivalents of powdery PMDA was slowly added thereto followed by stirring for 40 minutes. Then a solution of 0.6 equivalents of PMDA dissolved in DMF was slowly added thereto and the resultant mixture was stirred under cooling for 1 hour to give a polyamide acid solution in DMF. DMF was employed in such an amount as giving the feeding concentration of the diamine and aromatic tetracarboxylic acid dianhydride monomers of 18% by weight.

Next, the components A and B were mixed at a weight ratio of 2:1 and stirred.

Subsequently, the polyamide acid thus obtained was mixed with AA and IQ and then casted onto a stainless endless belt. After drying at 100° C. for 5 minutes, the self-supporting prefilm thus formed was peeled off from the belt. With holding both ends, the prefilm was continuously fed into an oven wherein it was heated at 300° C. for 30 seconds, at 400° C. for 30 seconds and at 510° C. for 30 seconds. Next, it was gradually cooled to room temperature in an annealing chamber. When the film was taken out from the annealing chamber, it was peeled off from the pin. Then various characteristics of the film were measured while referring the direction of the film flow as to the MD direction and the transverse direction as to the TD direction.

EXAMPLE 19

DMAc was introduced into a separable flask and 4.5 equivalents of ODA and 5.5 equivalents of p-PDA were added thereto. The resultant mixture was well stirred at room temperature until ODA and p-PDA were completely dissolved. Next, 5 equivalents of PMDA was added thereto and the mixture was stirred for 40 minutes. After adding 4.5 equivalents of TMHQ, the mixture was stirred for additional 40 minutes. Then a solution of 0.5 equivalents of TMHQ dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Next, the polyamide acid thus obtained was mixed with AA and IQ and then casted onto a stainless endless belt. After drying at 100° C. for 5 minutes, the self-supporting prefilm thus formed was peeled off from the belt. With holding both ends, the prefilm was continuously fed into an oven wherein it was heated at 300° C. for 30 seconds, at 400° C. for 30 seconds and at 510° C. for 30 seconds. Next, it was gradually cooled to room temperature in an annealing chamber. When the film was taken out from the annealing chamber, it was peeled off from the pin. Then various characteristics of the film were measured while referring the direction of the film flow as to the MD direction and the transverse direction as to the TD direction.

EXAMPLE 20

DMAc was introduced into a separable flask and 4 equivalents of ODA and 2 equivalents of p-PDA were added thereto. The resultant mixture was well stirred at room temperature until ODA and p-PDA were completely dissolved. Then, 6 equivalents of TMHQ was added and the mixture was stirred for 40 minutes. Next, 1 equivalent of ODA and 3 equivalents of p-PDA were added thereto and the mixture was stirred for 40 minutes. After adding 3.5 equivalents of PMDA, the mixture was stirred for additional 40 minutes. Then a solution of 0.5 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Next, the polyamide acid thus obtained was mixed with AA and IQ and then casted onto a stainless endless belt. After drying at 100° C. for 5 minutes, the self-supporting prefilm thus formed was peeled off from the belt. With holding both ends, the prefilm was continuously fed into an oven wherein it was heated at 300° C. for 30 seconds, at 400° C. for 30 seconds and at 510° C. for 30 seconds. Next, it was gradually cooled to room temperature in an annealing chamber. When the film was taken out from the annealing chamber, it was peeled off from the pin. Then various characteristics of the film were measured while referring the direction of the film flow as to the MD direction and the transverse direction as to the TD direction.

EXAMPLE 21

DMAc was introduced into a separable flask and 5 equivalents of ODA and 5 equivalents of p-PDA were added thereto. The resultant mixture was well stirred at room temperature until ODA and p-PDA were completely dissolved. Next, 5 equivalents of TMHQ was added thereto and the mixture was stirred for 40 minutes. After adding 4.5 equivalents of PMDA, the mixture was stirred for additional 40 minutes. Then a solution of 0.5 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

Next, the polyamide acid thus obtained was mixed with AA and IQ and then casted onto a stainless endless belt. After drying at 100° C. for 5 minutes, the self-supporting prefilm thus formed was peeled off from the belt. With holding both ends, the prefilm was continuously fed into an oven wherein it was heated at 300° C. for 30 seconds, at 400° C. for 30 seconds and at 510° C. for 30 seconds. Next, it was gradually cooled to room temperature in an annealing chamber. When the film was taken out from the annealing chamber, it was peeled off from the pin. Then various characteristics of the film were measured while referring the direction of the film flow as to the MD direction and the transverse direction as to the TD direction.

The coefficients of linear expansion, coefficients of moisture-absorption expansion and elastic moduli of the films obtained in Comparative Example 2 and Examples 15 to 21 were measured. Table 4 summarizes the results.

TABLE 4

| | Coefficient of linear expansion (ppm) | | Coefficient of moisture-absorption expansion (ppm) | | Elastic modulus (kg/mm²) | Curling level |
|---|---|---|---|---|---|---|
| | MD | TD | MD | TD | | |
| C. Ex. 2 | 30 | 34 | 18 | 22 | 300 | x |
| Ex. 15 | 12 | 13 | 6 | 8 | 550 | ○ |
| Ex. 16 | 11 | 9 | 4 | 3 | 700 | ○ |
| Ex. 17 | 9 | 9 | 8 | 8 | 550 | ○ |
| Ex. 18 | 7 | 6 | 6 | 6 | 640 | ○ |
| Ex. 19 | 9 | 10 | 5 | 6 | 630 | ○ |
| Ex. 20 | 8 | 8 | 4 | 4 | 660 | ○ |
| Ex. 21 | 9 | 8 | 4 | 4 | 600 | ○ |

Coefficient of linear expansion means a coefficient of linear expansion measured at 20 to 300° C. under a nitrogen gas stream by using TMA-8140 manufactured by Rigaku Denki.

Coefficient of moisture-absorption expansion was determined in the same manner as in Comparative Example 1 and Examples 1 to 4.

Tensile elastic modulus was determined in accordance with ASTM-D882.

Curling level was determined by forming a magnetic layer on each of the film samples of Comparative Example 2 and Examples 15 to 21 by the Co-oblique vapor deposition method by using a continuous deposition device of the electron beam-heating type. In each case, the thickness of the magnetic layer was 0.12 μm and the can temperature was 250° C. The deposition speed of the magnetic layer was about 0.1 μm/sec.

EXAMPLE 22

A polyimide film of about 10 μm in thickness was obtained in the same manner as in Example 5.

EXAMPLE 23

A polyimide film of about 10 μm in thickness was obtained in the same manner as in Example 6.

EXAMPLE 24

A polyimide film of about 10 μm in thickness was obtained in the same manner as in Example 1.

EXAMPLE 25

A polyimide film of about 10 μm in thickness was obtained in the same manner as in Example 8.

EXAMPLE 26

A polyimide film of about 10 μm in thickness was obtained in the same manner as in Example 3.

EXAMPLE 27

A polyimide film of about 10 μm in thickness was obtained in the same manner as in Example 2.

EXAMPLE 28

A polyimide film of about 10 μm in thickness was obtained in the same manner as in Example 4.

The coefficients of linear expansion, coefficients of moisture-absorption expansion and elastic moduli of the films obtained in Comparative Example 1 and Examples 22 to 28 were measured. Table 5 summarizes the results.

TABLE 5

| | Coefficient of linear expansion (ppm) | Coefficient of moisture-absorption expansion (ppm) | Elastic modulus (kg/mm²) | Density (g/cm³) | Water absorption (%) | Adhesion strength (kg/cm) |
|---|---|---|---|---|---|---|
| C. Ex. 1 | 32 | 20 | 300 | 1.420 | 3.0 | 0.8 |
| Ex. 22 | 12 | 7 | 550 | 1.456 | 1.0 | 1.1 |
| Ex. 23 | 10 | 4 | 700 | 1.457 | 0.8 | 1.1 |
| Ex. 24 | 9 | 8 | 550 | 1.455 | 1.5 | 1.2 |
| Ex. 25 | 8 | 7 | 640 | 1.455 | 1.4 | 1.1 |
| Ex. 26 | 9 | 5 | 630 | 1.455 | 1.4 | 1.3 |
| Ex. 27 | 8 | 4 | 680 | 1.460 | 0.9 | 1.2 |
| Ex. 28 | 9 | 5 | 600 | 1.459 | 1.2 | 1.3 |

Coefficient of linear expansion means a coefficient of linear expansion measured at 20 to 300° C. under a nitrogen gas stream by using TMA-8140 manufactured by Rigaku Denki.

Coefficient of moisture-absorption expansion was determined in the same manner as in Comparative Example 1 and Examples 1 to 4.

Tensile elastic modulus was determined in accordance with ASTM-D882.

Water absorption was determined in accordance with the following formula wherein WI means the weight of a film sample determined after drying at 150° C. for 30 minutes, and W2 means the weight of the sample determined after immersing in distilled water for 24 hours and then wiping off the water drops on the surface thereof. Water absorption (%)=(W2−W1)/W1×100.

Density was determined in accordance with JIS.K7112 6.4D method (density gradient centrifugation method).

Adhesion strength was determined as follows.

Each polyimide film thus obtained was laminated onto a steel foil (electrolytic copper foil 3EC-VLP manufactured by Mitsui Mining and Smelting Co., Ltd.) by using a nylon epoxy adhesive to give a three-layered laminate (polyimide film/adhesive/copper foil). Then this laminate was subjected to the determination in accordance with JIS-6472-1995-(8).

The curling level of the three-layered copper-clad laminate was evaluated by the following method.

(1) Films of 50 μm in thickness were obtained as described in Comparative Example 1 and Examples 22 to 28.

(2) Each film thus obtained was laminated onto a steel foil (electrolytic copper foil 3EC-VLP manufactured by Mitsui Mining and Smelting Co., Ltd.) by using a nylon epoxy adhesive to give a three-layered laminate (polyimide film/adhesive/copper foil).

Figure 1:
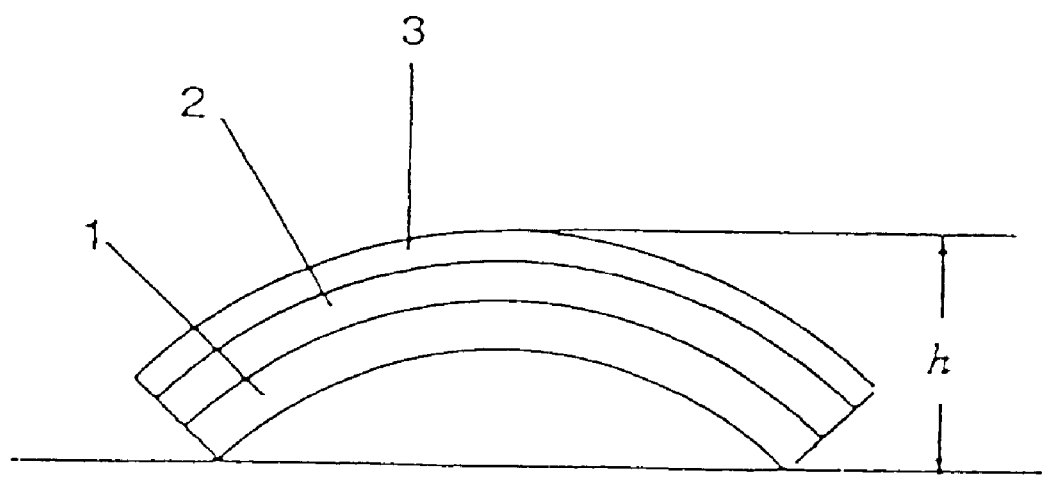
FIG. 1 is a diagram relating to a test for evaluating the curling properties of three-layered laminates of Comparative Example 1 and Examples 22 to 28.

(3) The thus obtained three-layered laminate was cut into apiece of 35mm (TD direction)×40mm (MD direction) and allowed to stand in an atmosphere of 23° C. and 55% RH. Subsequently, the sample was placed as the concave face being downward as shown in FIG. 1 and the maximum lifting height was measured with a dial gauge. Table 6 summarizes the results.

TABLE 6

| | Curling | |
|---|---|---|
| | Direction | Height (mm) |
| C. Ex. 1 | TD | 2.4 |
| Ex. 22 | TD | 1.3 |
| Ex. 23 | TD | 1.3 |
| Ex. 24 | TD | 1.1 |
| Ex. 25 | TD | 1.4 |
| Ex. 26 | TD | 0.9 |
| Ex. 27 | TD | 0.8 |
| Ex. 28 | TD | 0.8 |

EXAMPLE 29

A polyimide film of about 10 μm in thickness was obtained in the same manner as in Example 5.

EXAMPLE 30

A polyimide film of about 10 μm in thickness was obtained in the same manner as in Example 6.

EXAMPTE 31

A polyimide film of about 10 μm in thickness was obtained in the same manner as in Example 3.

EXAMPLE 32

A polyimide film of about 10 μm in thickness was obtained in the same manner as in Example 2.

EXAMPLE 33

DMAc was introduced into a separable flask and 5 equivalents of ODA and 5 equivalents of p-PDA were added thereto. The resultant mixture was well stirred at room temperature until ODA and p-PDA were completely dissolved. Next, 5 equivalents of TMHQ was added thereto followed by stirring for 40 minutes. Further, 4.5 equivalents of PMDA was added thereto followed by stirring for 40 minutes. Then a solution of 0.5 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight.

The polyamide acid solution was mixed with AA and IQ and poured onto a glass plate. After drying at about 100° C. for about 1 minutes, the polyamide acid film was peeled off from the glass plate. Then this film was fixed to a supporting frame and dehydrated and cyclized by heating successively at about 100° C. for about 1 minute, at about 300° C. for about 30 seconds, at about 400° C. for about 30 seconds and at about 510° C. for about 30 seconds to thereby give a polyimide film of about 10 μm in thickness.

The coefficients of linear expansion, coefficients of moisture-absorption expansion and elastic moduli of the films obtained in Comparative Example 1 and Examples 29 to 33 were measured. Table 7 summarizes the results.

TABLE 7

| | Coefficient of linear expansion (ppm) | Coefficient of moisture-absorption expansion (ppm) | Elastic modulus (kg/mm$^2$) | Water absorption (%) |
|---|---|---|---|---|
| C. Ex. 1 | 32 | 20 | 300 | 3.0 |
| Ex. 29 | 12 | 7 | 550 | 1.0 |
| Ex. 30 | 10 | 4 | 700 | 0.8 |
| Ex. 31 | 9 | 5 | 630 | 1.4 |
| Ex. 32 | 8 | 4 | 680 | 0.9 |
| Ex. 33 | 9 | 5 | 600 | 1.2 |

Coefficient of linear expansion means a coefficient of linear expansion measured at 20 to 300° C. under a nitrogen gas stream by using TMA-8140 manufactured by Rigaku Denki.

Coefficient of moisture-absorption expansion was determined in the same manner as in Comparative Example 1 and Examples 1 to 4.

Tensile elastic modulus was determined in accordance with ASTM-D882.

Water absorption was determined in accordance with the following formula wherein W1 means the weight of a film sample determined after drying at 150° C. for 30 minutes, and W2 means the weight of the sample determined after immersing in distilled water for 24 hours and then wiping off the water drops on the surface thereof. Water absorption (%)=(W2−W1)/W1×100.

COMPARATIVE EXAMPLE 3

On one face of the film (10 μm) obtained in Comparative Example 1 was applied a solution of a polyamide acid, which was a thermoplastic polyimide precursor having Tg of 190° C. and containing as the main components 3,3',4,4'-benzophenonetetracarboxylic acid dianhydride, 3,3'-4,4'-ethylene glycol dibenzoate tetracarboxylic acid dianhydride and 2, 2'-bis(4- (4-aminophenoxy)phenyl)propane, in an organic solvent followed by drying to give a polyimide laminate of 17 μm in thickness. Then the polyimide laminate thus obtained was placed on a copper foil (electrolytic copper foil 3EC-VLP manufactured by Mitsui Mining and Smelting Co., Ltd.) and heat compression bonded by using a hot press (30 kgf/cm$^2$/240° C./20 min) to thereby give a three-layered laminate, i.e., non-thermoplastic polyimide/ thermoplastic polyimide/copper foil. The interfacial (non-thermoplastic polyimide/thermoplastic polyimide) adhesion strength of the obtained laminate was measured. Table 8 shows the result.

TABLE 8

| | | Treatment | | | Adhesion strength |
|---|---|---|---|---|---|
| | | Heat | Corona | Plasma | Coupling agent | (kg/cm) |
| C. Ex. 3 | C. Ex. 1 | — | — | — | — | 0.1 |
| C. Ex. 4 | C. Ex. 1 | ○ | — | — | — | 0.2 |
| C. Ex. 5 | C. Ex. 1 | ○ | ○ | — | — | 0.2 |
| C. Ex. 6 | C. Ex. 1 | ○ | ○ | ○ | — | 0.2 |
| C. Ex. 7 | C. Ex. 1 | ○ | ○ | — | ○ isophorone diamine | 0.3 |

TABLE 8-continued

|  |  | Treatment | | | Adhesion strength (kg/cm) |
| --- | --- | --- | --- | --- | --- |
|  |  | Heat | Corona | Plasma | Coupling agent |  |
| C. Ex. 8 | C. Ex. 1 | o | — | o | do. | 0.3 |
| C. Ex. 9 | Ex. 29 | — | — | — | — | 0.3 |
| C. Ex. 10 | Ex. 33 | — | — | — | — | 0.3 |
| Ex. 34 | Ex. 29 | o | — | — | o isophorone diamine | 1.0 |
| Ex. 35 | Ex. 29 | o | o | — | — | 0.9 |
| Ex. 36 | Ex. 29 | o | — | o | — | 1.2 |
| Ex. 37 | Ex. 29 | o | o | o | — | 1.2 |
| Ex. 38 | Ex. 29 | o | o | — | o isophorone diamine | 1.0 |
| Ex. 39 | Ex. 29 | o | o | o | do. | 1.2 |
| Ex. 40 | Ex. 30 | o | o | o | — | 1.0 |
| Ex. 41 | Ex. 31 | o | o | o | — | 1.1 |
| Ex. 42 | Ex. 32 | o | o | o | — | 1.0 |
| Ex. 43 | Ex. 33 | o | — | — | o isophorone diamine | 1.1 |
| Ex. 44 | Ex. 33 | o | — | — | o diethylene triamine | 1.0 |
| Ex. 45 | Ex. 33 | o | — | — | o N-aminoethyl piperazine | 1.0 |
| Ex. 46 | Ex. 33 | o | o | — | — | 0.9 |
| Ex. 47 | Ex. 33 | o | — | o | — | 1.2 |
| Ex. 48 | Ex. 33 | o | o | o | — | 1.2 |
| Ex. 49 | Ex. 33 | — | — | o | — | 1.2 |

COMPARATIVE EXAMPLE 4

The film (10 μm) obtained in Comparative Example 1 was subjected to a heat treatment at 500° C. for 1 minute. Then the adhesion strength of the obtained polyimide film was measured as in Comparative Example 3.

COMPARATIVE EXAMPLE 5

The film (10 μm) obtained in Comparative Example 1 was subjected successively to a heat treatment at 500° C. for 1 minute and a corona treatment at a corona density of 300W·min/m². Then the adhesion strength of the obtained polyimide film was measured as in Comparative Example 3.

COMPARATIVE EXAMPLE 6

The film (10 μm) obtained in Comparative Example 1 was subjected successively to a heat treatment at 500° C. for 1 minute and a corona treatment at a corona density of 300W·min/m². Further, it was subjected to a plasma treatment at a plasma density of 2000W·min/m². Then the adhesion strength of the obtained polyimide film was measured as in Comparative Example 3.

COMPARATIVE EXAMPLE 7

The film (10 μm) obtained in Comparative Example 1 was subjected successively to a heat treatment at 500° C. for 1 minute and a corona treatment at a corona density of 300W·min/m². Further, a solution of isophoronediamine in methanol (5% by weight) was applied thereon with a bar coater and dried at 70° C. for 1 minute. Then the adhesion strength of the obtained polyimide film was measured as in Comparative Example 3.

COMPARATIVE EXAMPLE 8

The film (10 μm) obtained in Comparative Example 1 was subjected successively to a heat treatment at 500° C. for 1 minute and a plasma treatment at a plasma density of 2000W·min/m². Further, a solution of isophoronediamine in methanol (5% by weight) was applied thereon with a bar coater and dried at 70° C. for 1 minute. Then the adhesion strength of the obtained polyimide film was measured as in Comparative Example 3.

COMPARATIVE EXAMPLE 9

The adhesion strength of the film (10 μm) obtained in Example 33 was measured as in Comparative Example 3.

COMPARATIVE EXAMPLE 10

The adhesion strength of the film (10 μm) obtained in Example 33 was measured as in Comparative Example 3.

EXAMPLE 34

The film (10 μm) obtained in Example 29 was subjected to eat treatment at 500° C. for 1 minute. Then, a solution of isophoronediamine in methanol (5% by weight) was applied thereon with a bar coater and dried at 70° C. for 1 minute. Then the adhesion strength of the obtained polyimide film was measured as in Comparative Example 3.

EXAMPLE 35

The film (10 μm) obtained in Example 29 was subjected successively to a heat treatment at 500° C. for 1 minute and a corona treatment at a corona density of 300W·min/m². Then the adhesion strength of the obtained polyimide film was measured as in Comparative Example 3.

EXAMPLE 36

The film (10 μm) obtained in Example 29 was subjected successively to a heat treatment at 500° C. for 1 minute and a plasma treatment at a plasma density of 2000W·min/m². Then the adhesion strength of the obtained polyimide film was measured as in Comparative Example 3.

EXAMPLE 37

The film (10 μm) obtained in Example 29 was subjected successively to a heat treatment at 500° C. for 1 minute and a corona treatment at a corona density of 300W·min/m². Then it was subjected to a plasma treatment at a plasma density of 2000W·min/m². Then the adhesion strength of the obtained polyimide film was measured as in Comparative Example 3.

EXAMPLE 38

The film (10 μm) obtained in Example 29 was subjected successively to a heat treatment at 500° C. for 1 minute and a corona treatment at a corona density of 300W·min/m². Further, a solution of isophoronediamine in methanol (5% by weight) was applied thereon with a bar coater and dried at 70C for 1 minute. Then the adhesion strength of the obtained polyimide film was measured as in Comparative Example 3.

EXAMPLE 39

The film (10 μm) obtained in Example 29 was subjected successively to a heat treatment at 500° C. for 1 minute and a corona treatment at a corona density of 300W·min/m². Further, it was subjected to a plasma treatment at a plasma density of 2000 W·min/m². Then, a solution of isophoronediamine in methanol (5% by weight) was applied thereon with a bar coater and dried at 70° C. for 1 minute. Then the adhesion strength of the obtained polyimide film was measured as in Comparative Example 3.

EXAMPLE 40

The film (10 μm) obtained in Example 30 was subjected successively to a heat treatment at 500° C. for 1 minute and a corona treatment at a corona density of 300W·min/m$^2$. Further, it was subjected to a plasma treatment at a plasma density of 2000 W·min/m$^2$. Then the adhesion strength of the obtained polyimide film was measured as in Comparative Example 3.

EXAMPLE 41

The film (10 μm) obtained in Example 31 was subjected successively to a heat treatment at 500° C. for 1 minute and a corona treatment at a corona density of 300W·min/m$^2$. Further, it was subjected to a plasma treatment at a plasma density of 2000 W·min/m$^2$. Then the adhesion strength of the obtained polyimide film was measured as in Comparative Example 3.

EXAMPLE 42

The film (10 μm) obtained in Example 32 was subjected successively to a heat treatment at 500° C. for 1 minute and a corona treatment at a corona density of 300W·min/m$^2$. Further, it was subjected to a plasma treatment at a plasma density of 2000 W·min/m$^2$. Then the adhesion strength of the obtained polyimide film was measured as in Comparative Example 3.

EXAMPLE 43

The film (10 μm) obtained in Example 33 was subjected to a heat treatment at 500° C. for 1 minute. Then, a solution of isophoronedialine in methanol (5% by weight) was applied thereon with a bar coater and dried at 70° C. for 1 minute. Then the adhesion strength of the obtained polyimide film was measured as in Comparative Example 3.

EXAMPLE 44

The film (10 μm) obtained in Example 33 was subjected to a heat treatment at 500° C. for 1 minute. Then, a solution of diethylenetriamine in methanol (5% by weight) was applied thereon with a bar coater and dried at 70C for 1 minute. Then the adhesion strength of the obtained polyimide film was measured as in Comparative Example 3.

EXAMPLE 45

The film (10 μm) obtained in Example 33 was subjected to a heat treatment at 500° C. for 1 minute. Then, a solution of N-aminoethyl piperazine in methanol (5% by weight) was applied thereon with a bar coater and dried at 70° C. for 1 minute. Then the adhesion strength of the obtained polyimide film was measured as in Comparative Example 3.

EXAMPLE 46

The film (10 μm) obtained in Example 33 was subjected successively to a heat treatment at 500° C. for 1 minute and a corona treatment at a corona density of 300W·min/m$^2$. Then the adhesion strength of the obtained polyimide film was measured as in Comparative Example 3.

EXAMPLE 47

The film (10 μm) obtained in Example 33 was subjected successively to a heat treatment at 500° C. for 1 minute and a plasma treatment at a plasma density of 2000W·min/m$^2$. Then the adhesion strength of the obtained polyimide film was measured as in Comparative Example 3.

EXAMPLE 48

The film (10 μm) obtained in Example 33 was subjected successively to a heat treatment at 500° C. for 1 minute and a corona treatment at a corona density of 300W·min/m$^2$. Further, it was subjected to a plasma treatment at a plasma density of 2000 W·min/m$^2$. Then the adhesion strength of the obtained polyimide film was measured as in Comparative Example 3.

EXAMPLE 49

The film (10 μm) obtained in Example 33 was subjected to plasma treatment at a plasma density of 2000 W·min/m$^2$. Then the adhesion strength of the obtained polyimide film was measured as in Comparative Example 3.
Production of polyimide film:

Six types of polyimide films (PI films-1 to 6) were formed by the following procedures. The properties of these films were each manufactured by the following method.
(Coefficient of linear expansion)

Under a nitrogen gas stream, a sample was repeatedly heated and cooled form room temperature to 400° C. at a rate of 10° C./min. Then the average coefficient of linear expansion was measured in the second heating step at 20 to 300° C. by using TMA-8140 manufactured by Rigaku Denki.
(Coefficient of moisture-absorption expansion)

Coefficient of moisture-absorption expansion was determined in the same manner as in Comparative Example 1 and Examples 1 to 4.
(Tensile elastic modulus)

Tensile elastic modulus was determined in accordance with ASTM-D882.
(Water absorption)

Water absorption was determined in accordance with the following formula wherein W1 means the weight of a film sample determined after drying at 150° C. for 30 minutes, and W2 means the weight of the sample determined after immersing in distilled water for 24 hours and then wiping off the water drops on the surface thereof. Water absorption (%)=(W2−W1)/W1×100. (PI film-1)

DMF was introduced into a separable flask and 10 equivalents of ODA was added thereto. The resultant mixture was well stirred at room temperature until ODA was completely dissolved. Next, 8.5 equivalents of powdery PMDA was slowly added thereto followed by stirring for 40 minutes. Then a solution of 1.5 equivalents of PMDA dissolved in DMF was slowly added thereto and the resultant mixture was stirred under cooling for 1 hour to give a polyamide acid solution in DMF. DMF was employed in such an amount as giving the feeding concentration of the diamine and aromatic tetracarboxylic acid dianhydride monomers of 18% by weight based on the weight of the polyamide acid solution. Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 300° C. for about 1 minute, at about 400° C. for about 1 minute and at about 510° C. for about 1 minute to thereby give a polyimide film of about 50 μm in thickness. The polyimide film thus obtained showed a coefficient of linear expansion of 32 ppm, a coefficient of moisture-absorption expansion of 20 ppm, an elastic modulus of 300 kg/mm$^2$ and a water absorption of 3.0%. (PI film-2)

DMAc was introduced into a separable flask and 8 equivalents of ODA and 5 equivalents of p-PDA were added thereto. The resultant mixture was well stirred at room temperature until ODA and p-PDA were completely dissolved. Next, 5 equivalents of TMHQ and 6.05 equivalents of powdery PMDA were slowly added thereto followed by stirring for 40 minutes. Then a solution of 1.95 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight based on the weight of the polyamide acid solution. Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 300° C. for about 1 minute, at about 400° C. for about 1 minute and at about 510° C. for about 1 minute to thereby give a polyimide film of about 50 $\mu$m in thickness. The polyimide film thus obtained showed a coefficient of linear expansion of 12 ppm, a coefficient of moisture-absorption expansion of 7 ppm, an elastic modulus of 550 kg/mm$^2$ and a water absorption of 1.0%. (PI film-3)

DMAc was introduced into a separable flask and 12 equivalents of ODA and 11 equivalents of p-PDA were added thereto. The resultant mixture was well stirred at room temperature until ODA and p-PDA were completely dissolved. Next, 15 equivalents of TMHQ and 4.55 equivalents of powdery PMDA were slowly added thereto followed by stirring for 40 minutes. Then a solution of 3.45 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight based on the weight of the polyamide acid solution. Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 300° C. for about 1 minute, at about 400° C. for about 1 minute and at about 510° C. for about 1 minute to thereby give a polyimide film of about 50 $\mu$m in thickness. The polyimide film thus obtained showed a coefficient of linear expansion of 10 ppm, a coefficient of moisture-absorption expansion of 4 ppm, an elastic modulus of 700 kg/mm$^2$ and a water absorption of 0.8%. (PI film-4)

DMAc was introduced into a separable flask and 4.5 equivalents of ODA and 5.5 equivalents of p-PDA were added thereto. The resultant mixture was well stirred at room temperature until ODA and p-PDA were completely dissolved. Next, 5 equivalents of PMDA was added thereto followed by stirring for 40 minutes, and then 4.5 equivalents of TMHQ was added thereto followed by stirring for 40 minutes. Then a solution of 0.5 equivalents of TMHQ dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight based on the weight of the polyamide acid solution. Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 300° C. for about 1 minute, at about 400° C. for about 1 minute and at about 510° C. for about 1 minute to thereby give a polyimide film of about 50 $\mu$m in thickness. The polyimide film thus obtained showed a coefficient of linear expansion of 9 ppm, a coefficient of moisture-absorption expansion of 5 ppm, an elastic modulus of 630 kg/mm$^2$ and a water absorption of 1.4%. (PI film-5)

DMAc was introduced into a separable flask and 4 equivalents of ODA and 2 equivalents of p-PDA were added thereto. The resultant mixture was well stirred at room temperature until ODA and p-PDA were completely dissolved. Next, 6 equivalents of TMHQ was added thereto followed by stirring for 40 minutes. After adding 1 equivalent of ODA and 3 equivalents of p-PDA, the mixture was stirred for additional 40 minutes. Next, 3.5 equivalents of PMDA was added followed by stirring for 40 minutes. Then a solution of 0.5 equivalents of PMDA dissolved in DMAc was slowly added thereto and the resultant mixture was stirred under cooling for 1 hour to give a polyamide acid solution in DMAC. DMAC was employed in such an amount as giving the feeding concentration of the diamine and aromatic tetracarboxylic acid dianhydride monomers of 18% by weight based on the weight of the polyamide acid solution. Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 300° C. for about 1 minute, at about 400° C. for about 1 minute and at about 510° C. for about 1 minute to thereby give a polyimide film of about 50 $\mu$m in thickness. The polyimide film thus obtained showed a coefficient of linear expansion of 8 ppm, a coefficient of moisture-absorption expansion of 4 ppm, an elastic modulus of 680 kg/mm$^2$ and a water absorption of 0.9%. (PI film-6)

DMAc was introduced into a separable flask and 5 equivalents of ODA and 5 equivalents of p-PDA were added thereto. The resultant mixture was well stirred at room temperature until ODA and p-PDA were completely dissolved. Next, 5 equivalents of TMHQ was added thereto followed by stirring for 40 minutes. After adding 4.5 equivalents of PMDA, the resultant mixture was stirred for 40 minutes. Then, a solution of 0.5 equivalents of PMDA dissolved in DMAc was slowly added thereto and the resultant mixture was stirred under cooling for 1 hour to give a polyamide acid solution in DMAc. DMAc was employed in such an amount as giving the feeding concentration of the diamine and aromatic tetracarboxylic acid dianhydride monomers of 18% by weight based on the weight of the polyamide acid solution. Next, the polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 300° C. for about 1 minute, at about 400° C. for about 1 minute and at about 510° C. for about 1 minute to thereby give a polyimide film of about 50 $\mu$m in thickness. The polyimide film thus obtained showed a coefficient of linear expansion of 9 ppm, a coefficient of moisture-absorption expansion of 5 ppm, an elastic modulus of 600 kg/mm$^2$ and a water absorption of 1.2%. Treatment of PI films:

These PI films thus obtained were subjected to the following treatments.

(Treatment A)

A heat treatment was carried out at 500° C. for 1 minute.

(Treatment B)

A heat treatment was carried out at 500° C. for 1 minute and then a corona treatment was carried out at a corona density of 300W·min/m².

(Treatment C)

A plasma treatment was carried out at a plasma density of 2000W·min/m².

(Treatment D)

After carrying out a heat treatment at 500° C. for 1 minute, a solution of isophoronediamine in methanol (5% by weight) was applied on a film with a bar coater and dried at 70° C. for 1 minute.

Production of adhesive film:

COMPARATIVE EXAMPLE 11

On one face of the untreated PI-film-1 was applied a solution of a polyamide acid, which was a thermoplastic polyimide precursor having Tg of 190° C. and containing as the main components 3,3',4,4'-benzophenonetetracarboxylic acid dianhydride, 3,3',4,4'-ethylene glycol dibenzoate tetracarboxylic acid dianhydride and 2,2'-bis(4-(4-aminophenoxy) phenyl) propane, in an organic solvent followed by drying to give a one-sided adhesive film of 60 μm in thickness. The adhesion strength and solder heat resistance of the obtained film were measured by the methods as will be described hereinafter. As a result, it showed an adhesion strength of 0.1 kgf/cm and "poor" solder heat resistance both at 280 and 300° C.

COMPARATIVE EXAMPLE 12

The procedure of Comparative Example 11 was followed but using the PI film-1 having been subjected to the treatment A as a substitute for the untreated PI film-1 to thereby give a single-sided adhesive film of 60 μm in thickness. When measured by the method as will be described hereinafter, the adhesive film showed an adhesion strength of 0.3 kgf/cm.

COMPARATIVE EXAMPLE 13

The procedure of Comparative Example 11 was followed but using the PI film-1 having been subjected to the treatment B as a substitute for the untreated PI film-1 to thereby give a single-sided adhesive film of 60 μm in thickness. When measured. by the method as will be described hereinafter, the adhesive film showed an adhesion strength of 0.3 kgf/cm.

COMPARATIVE EXAMPLE 14

The procedure of Comparative Example 11 was followed but using the PI film-1 having been subjected to the treatment C as a substitute for the untreated PI film-1 to thereby give a single-sided adhesive film of 60 μm in thickness. When measured by the method as will be described hereinafter, the adhesive film showed an adhesion strength of 0.3 kgf/cm.

COMPARATIVE EXAMPLE 15

The procedure of Comparative Example 11 was followed but using the P1 film-1 having been subjected to the treatment D as a substitute for the untreated PI film-1 to thereby give a single-sided adhesive film of 60 μm in thickness. When measured by the method as will be described hereinafter, the adhesive film showed an adhesion strength of 0.3 kgf/cm.

COMPARATIVE EXAMPLE 16

On one face of the untreated P1-film-1 was applied a solution of a polyamide acid, which was a thermoplastic polyimide precursor having Tg of 190° C. and containing as the main components 3,3',4,4'-benzophenonetetracarboxylic acid dianhydride, 3,3',4,4'-ethylene glycol dibenzoate tetracarboxylic acid dianhydride and 2,2'-bis(4-(4-aminophenoxy) phenyl) propane, in an organic solvent followed by drying to give a one-sided adhesive film of 60 μm in thickness. Next, the above-described procedure was repeated on the other face of the film to give a double-sided adhesive film of 70 μm in thickness. The solder heat resistance of the obtained film was measured by the methods as will be described hereinafter. As a result, it showed "poor" solder heat resistance both at 280 and 300° C.

COMPARATIVE EXAMPLE 17

On one face of a PET (polyethylene terephthalate) film was applied a nylon epoxy adhesive and dried to give an adhesive PET sheet having an adhesive layer at the stage B. The adhesive PET sheet thus obtained had a thickness of 10 μm. Next, the untreated PI film-1 was placed on this adhesive PET sheet, thus being in the order of the PI film/the adhesive layer/the PET film and heated at 120° C. for 5 seconds under a pressure of 5 kgf/cm to thereby give a single-sided adhesive film wherein the adhesive face was coated with the PET film. The PET film served as a cover film for the adhesive face and was to be peeled off before using. suing. The adhesion strength and solder heat resistance of the obtained film was measured by the methods as will be described hereinafter. As a result, it showed an adhesion strength of 0.1 kgf/cm and "poor" solder heat resistance both at 280 and 300° C.

COMPARATIVE EXAMPLE 18

The procedure of Comparative Example 17 was followed but using the PI film-1 having been subjected to the treatment A as a substitute for the untreated PI film-1 to thereby give a single-sided adhesive film. When measured by the method as will be described hereinafter, the adhesive film showed an adhesion strength of 0.3 kgf/cm.

COMPARATIVE EXAMPLE 19

The procedure of Comparative Example 17 was followed but using the PI film-1 having been subjected to the treatment B as a substitute for the untreated PI film-1 to thereby give a single-sided adhesive film. When measured by the method as will be described hereinafter, the adhesive film showed an adhesion strength of 0.3 kgf/cm.

COMPARATIVE EXAMPLE 20

The procedure of comparative Example 17 was followed but using the PI film-1 having been subjected to the treatment C as a substitute for the untreated PI film-1 to thereby give a single-sided adhesive film. When measured by the method as will be described hereinafter, the adhesive film showed an adhesion strength of 0.4 kgf/cm.

COMPARATIVE EXAMPLE 21

The procedure of Comparative Example 17 was followed but using the PI film-1 having been subjected to the treatment D as a substitute for the untreated PI film-1 to thereby give a single-sided adhesive film. When measured by the method as will be described hereinafter, the adhesive film showed an adhesion strength of 0.4 kgf/cm.

COMPARATIVE EXAMPLE 22

Between two adhesive PET sheets employed in Comparative Example 17, the untreated PI film-1 was inserted, thus being in the order of the PET film/the adhesive layer/the PI film/the adhesive layer/the PET film. After heating at 120° C. for 5 seconds under a pressure of 5 kgf/cm², a double-sided adhesive film wherein both faces were coated with the PET films was obtained. The solder heat resistance of the obtained film was measured by the methods as will be described hereinafter. As a result, it showed "poor" solder heat resistance both at 280 and 300° C.

EXAMPLE 50

The procedure of Comparative Example 11 was followed but using the untreated PI film-2 as a substitute for the untreated PI film-1 to thereby give a single-sided adhesive film of 60 μm in thickness. When measured by the method as will be described hereinafter, the adhesive film showed "good" solder heat resistance both at 280 and 300° C.

EXAMPLE 51

The procedure of Comparative Example 11 was followed but using the untreated PI film-3 as a substitute for the untreated PI film-1 to thereby give a single-sided adhesive film of 60 μm in thickness. When measured by the method as will be described hereinafter, the adhesive film showed "good" solder heat resistance both at 280 and 300° C.

EXAMPLE 52

The procedure of Comparative Example 11 was followed but using the untreated PI film-4 as a substitute for the untreated PI film-1 to thereby give a single-sided adhesive film of 60 μm in thickness. When measured by the method as will be described hereinafter, the adhesive film showed "good" solder heat resistance both at 280 and 300° C.

EXAMPLE 53

The procedure of Comparative Example 11 was followed but using the untreated PI film-5 as a substitute for the untreated PI film-1 to thereby give a single-sided adhesive film of 60 μm in thickness. When measured by the method as will be described hereinafter, the adhesive film showed "good" solder heat resistance both at 280 and 300° C.

EXAMPLE 54

The procedure of Comparative Example 11 was followed but using the untreated PI film-6 as a substitute for the untreated PI film-1 to thereby give a single-sided adhesive film of 60 μm in thickness. When measured by the methods as will be described hereinafter, the adhesive film showed an adhesion strength of 0.2 kgf/cm and "good" solder heat resistance both at 280 and 300° C.

EXAMPLE 55

The procedure of Comparative Example 11 was followed but using the PI film-6 having been subjected to the treatment A as a substitute for the untreated PI film-1 to thereby give a single-sided adhesive film of 60 μm in thickness. When measured by the method as will be described hereinafter, the adhesive film showed an adhesion strength of 0.9 kgf/cm.

EXAMPLE 56

The procedure of Comparative Example 11 was followed but using the PI film-6 having been subjected to the treatment B as a substitute for the untreated PI film-1 to thereby give a single-sided adhesive film of 60 μm in thickness. When measured by the method as will be described hereinafter, the adhesive film showed an adhesion strength of 1.1 kgf/cm.

EXAMPLE 57

The procedure of Comparative Example 11 was followed but using the PI film-6 having been subjected to the treatment C as a substitute for the untreated PI film-1 to thereby give a single-sided adhesive film of 60 μm in thickness. When measured by the method as will be described hereinafter, the adhesive film showed an adhesion strength of 1.2 kgf/cm.

EXAMPLE 58

The procedure of Comparative Example 11 was followed but using the PI film-6 having been subjected to the treatment D as a substitute for the untreated PI film-1 to thereby give a single-sided adhesive film of 60 μm in thickness. When measured by the method as will be described hereinafter, the adhesive film showed an adhesion strength of 1.3 kgf/cm.

EXAMPLE 59

The procedure of Comparative Example 16 was followed but using the untreated PI film-2 as a substitute for the untreated PI film-1 to thereby give a double-sided adhesive film of 70 μm in thickness. When measured by the method as will be described hereinafter, the adhesive film showed "good" solder heat resistance both at 280 and 300° C.

EXAMPLE 60

The procedure of Comparative Example 16 was followed but using the untreated PI film-3 as a substitute for the untreated PI film-1 to thereby give a double-sided adhesive film of 70 μm in thickness. When measured by the method as will be described hereinafter, the adhesive film showed "good" solder heat resistance both at 280 and 3000° C.

EXAMPLE 61

The procedure of Comparative Example 16 was followed but using the untreated PI film-4 as a substitute for the untreated PI film-1 to thereby give a double-sided adhesive film of 70 μm in thickness. When measured by the method as will be described hereinafter, the adhesive film showed "good" solder heat resistance both at 280 and 300° C.

EXAMPLE 62

The procedure of Comparative Example 16 was followed but using the untreated PI film-5 as a substitute for the untreated PI film-1 to thereby give a double-sided adhesive film of 70 μm in thickness. When measured by the method as will be described hereinafter, the adhesive film showed "good" solder heat resistance both at 280 and 300° C.

EXAMPLE 63

The procedure of Comparative Example 16 was followed but using the untreated PI film-6 as a substitute for the untreated PI film-1 to thereby give a double-sided adhesive film of 70 μm in thickness. When measured by the method as will be described hereinafter, the adhesive film showed "good" solder heat resistance both at 280 and 300° C.

EXAMPLE 64

The procedure of Comparative Example 17 was followed but using the untreated PI film-2 as a substitute for the untreated PI film-1 to thereby give a single-sided adhesive film of 60 μm in thickness. When measured by the method as will be described hereinafter, the adhesive film showed "good" solder heat resistance both at 280 and 300° C.

EXAMPLE 65

The procedure of Comparative Example 17 was followed but using the untreated PI film-3 as a substitute for the untreated PI film-1 to thereby give a single-sided adhesive film of 60 μm in thickness. When measured by the method as will be described hereinafter, the adhesive film showed "good" solder heat resistance both at 280 and 300° C.

EXAMPLE 66

The procedure of Comparative Example 17 was followed but using the untreated PI film-4 as a substitute for the untreated PI film-1 to thereby give a single-sided adhesive film of 60 μm in thickness. When measured by the method as will be described hereinafter, the adhesive film showed "good" solder heat resistance both at 280 and 300° C.

EXAMPLE 67

The procedure of Comparative Example 17 was followed but using the untreated PI film-5 as a substitute for the untreated PI film-1 to thereby give a single-sided adhesive film of 60 μm in thickness. When measured by the method as will be described hereinafter, the adhesive film showed "good" solder heat resistance both at 280 and 300° C.

EXAMPLE 68

The procedure of Comparative Example 17 was followed but using the untreated PI film-6 as a substitute for the untreated PI film-1 to thereby give a single-sided adhesive film of 60 μm in thickness. When measured by the methods as will be described hereinafter, the adhesive film showed an adhesion strength of 0.2 kgf/cm and "good" solder heat resistance both at 280 and 300° C.

EXAMPLE 69

The procedure of Comparative Example 17 was followed but using the PI film-6 having been subjected to the treatment A as a substitute for the untreated PI film-1 to thereby give a single-sided adhesive film of 60 μm in thickness. When measured by the method as will be described hereinafter, the adhesive film showed an adhesion strength of 1.1 kgf/cm.

EXAMPLE 70

The procedure of Comparative Example 17 was followed but using the PI film-6 having been subjected to the treatment B as a substitute for the untreated PI film-1 to thereby give a single-sided adhesive film of 60 μm in thickness. When measured by the method as will be described hereinafter, the adhesive film showed an adhesion strength of 1.2 kgf/cm.

EXAMPLE 71

The procedure of Comparative Example 17 was followed but using the PI film-6 having been subjected to the treatment C as a substitute for the untreated PI film-1 to thereby give a single-sided adhesive film of 60 μm in thickness. When measured by the method as will be described hereinafter, the adhesive film showed an adhesion strength of 1.4 kgf/cm.

EXAMPLE 72

The procedure of Comparative Example 17 was followed but using the PI film-6 having been subjected to the treatment D as a substitute for the untreated PI film-1 to thereby give a single-sided adhesive film of 60 μm in thickness. When measured by the method as will be described hereinafter, the adhesive film showed an adhesion strength of 1.3 kgf/cm.

EXAMPLE 73

The procedure of Comparative Example 22 was followed but using the untreated PI film-2 as a substitute for the untreated PI film-1 to thereby give a double-sided adhesive film of 70 μm in thickness. When measured by the method as will be described hereinafter, the adhesive film showed "good" solder heat resistance both at 280 and 300° C.

EXAMPLE 74

The procedure of Comparative Example 22 was followed but using the untreated PI film-3 as a substitute for the untreated PI film-1 to thereby give a double-sided adhesive film of 70 μm in thickness. When measured by the method as will be described hereinafter, the adhesive film showed "good" solder heat resistance both at 280 and 300° C.

EXAMPLE 75

The procedure of Comparative Example 22 was followed but using the untreated PI film-4 as a substitute for the untreated PI film-1 to thereby give a double-sided adhesive film of 70 μm in thickness. When measured by the method as will be described hereinafter, the adhesive film showed "good" solder heat resistance both at 280 and 300° C.

EXAMPLE 76

The procedure of Comparative Example 22 was followed but using the untreated PI film-5 as a substitute for the untreated PI film-1 to thereby give a double-sided adhesive film of 70 μm in thickness. When measured by the method as will be described hereinafter, the adhesive film showed "good" solder heat resistance both at 280 and 300° C.

EXAMPLE 77

The procedure of Comparative Example 22 was followed but using the untreated PI film-6 as a substitute for the untreated PI film-1 to thereby give a double-sided adhesive film of 70 μm in thickness. When measured by the method as will be described hereinafter, the adhesive film showed "good" solder heat resistance both at 280 and 300° C.

Methods for measuring adhesion strength and solder heat resistance of adhesive film:

First, a copper foil (electrolytic copper foil 3EC-VLP, 35 μm, manufactured by Mitsui Mining and Smelting Co., Ltd.) was bonded to each of the adhesive films obtained in Comparative Examples 11 to 22 and Examples 50 to 77 by selecting appropriate bonding method from the following ones depending on the type of the adhesive layer employed and the type of the film (i.e., single- or double-sided). (Adhesive film having thermoplastic polyimide layer on one face: Comparative Examples 11 to 15 and Examples 50 to 58)

The single-sided adhesive film was placed on the copper foil (electrolytic copper foil 3EC-VLP, 35 μm, manufactured by Mitsui Mining and Smelting Co., Ltd.) and heat compression bonded by using a hot press (30 kgf/cm$^2$, 240° C., 20 minutes) to give a three-layered laminate consisting of the PI film/the thermoplastic polyimide/the copper foil. (Adhesive film having thermoplastic polyimide layer on both faces: Comparative Example 16 and Examples 59 to 63) The copper foils (electrolytic copper foil 3EC-VLP, 35 μm manufactured by Mitsui Mining and Smelting Co., Ltd.) were placed on both faces of the adhesive film and heat compression bonded by using a hot press (30 kgf/cm², 240° C., 20 minutes) to give a five-layered laminate consisting of the copper foil/the thermoplastic polyimide/ the PI film/the thermoplastic polyimide/the copper foil. (Adhesive film having thermosetting adhesive layer on one face: Comparative Examples 17 to 21 and Examples 64 to 72)

After peeling off the PET film serving as the cover film, the single-sided adhesive film was placed on the copper foil (electrolytic copper foil 3EC-VLP, 35 μm, manufactured by Mitsui Mining and Smelting Co., Ltd.) and preliminarily heat compression bonded by using a hot press (10 kgf/cm², 120° C., 1 minute) to give a three-layered laminate consisting of the PI film/the nylon epoxy adhesive/the copper foil. Next, the three-layered laminate thus obtained was heated in three steps (at 120°C. for 4 hours, at 160° C. for 4 hours, at 120° C. for 4 hours) to thereby completely harden the nylon epoxy adhesive. (Adhesive film having thermosetting adhesive layers on both faces: Comparative Example 22 and Examples 73 to 77)

After peeling off the PET film serving as the cover film, the copper foils (electrolytic copper foil 3EC-VLP, 35 μm, manufactured by Mitsui Mining and Smelting Co., Ltd.) were placed on the both faces of the double-sided adhesive film and preliminarily heat compression bonded by using a hot press (10 kgf/cm², 120° C., 1 minute) to give a five-layered laminate consisting of the copper foil/the nylon epoxy adhesive/the PI film/the nylon epoxy adhesive/the copper foil. Next, the five-layered laminate thus obtained was heated in three steps (at 120° C. for 4 hours, at 160° C. for 4 hours, at 120° C. for 4 hours) to thereby completely harden the nylon epoxy adhesive.

Each of the copper-clad laminates thus obtained was evaluated in the adhesion strength and solder heat resistance by the following methods. (Adhesion strength)

Adhesion strength was measured in accordance with the method as specified in JIS 6472-1995-(8). (Solder heat resistance)

Solder heat resistance was evaluated in the original state. A copper-clad laminate was cut into a piece (20 mm×50 mm) and floated on a melt solder at 280 or 300° C. for 1 minute. Next, the copper foil was etched off and the foaming was observed. A sample being free from any abnormalities (foaming, wrinkling, cracking, peeling, deformation, etc.) was evaluated as "good", while one suffering from abnormalities (foaming, wrinkling, cracking, peeling, deformation, etc.) was evaluated as "poor".

Table 9 summarizes the adhesion strength data and the results of the solder heat resistance evaluation of the samples of Comparative Examples 11 to 22 and Examples 50 to 77.

TABLE 9

| | PI film | Treatment | Face | Adhesive | Adhesion strength (kgf/cm) | Solder heat resistance 280° C. | Solder heat resistance 300° C. |
|---|---|---|---|---|---|---|---|
| C. Ex. 11 | 1 | no | single | TPI | 0.1 | poor | poor |
| C. Ex. 12 | 1 | A | single | TPI | 0.3 | | |
| C. Ex. 13 | 1 | B | single | TPI | 0.3 | | |
| C. Ex. 14 | 1 | C | single | TPI | 0.3 | | |
| C. Ex. 15 | 1 | D | single | TPI | 0.3 | | |
| C. Ex. 16 | 1 | no | double | TPI | | poor | poor |
| C. Ex. 17 | 1 | no | single | NE | 0.1 | poor | poor |
| C. Ex. 18 | 1 | A | single | NE | 0.3 | | |
| C. Ex. 19 | 1 | B | single | NE | 0.3 | | |
| C. Ex. 20 | 1 | C | single | NE | 0.4 | | |
| C. Ex. 21 | 1 | D | single | NE | 0.4 | | |
| C. Ex. 22 | 1 | no | double | NE | | poor | poor |
| Ex. 50 | 2 | no | single | TPI | | good | good |
| Ex. 51 | 3 | no | single | TPI | | good | good |
| Ex. 52 | 4 | no | single | TPI | | good | good |
| Ex. 53 | 5 | no | single | TPI | | good | good |
| Ex. 54 | 6 | no | single | TPI | 0.2 | good | good |
| Ex. 55 | 6 | A | single | TPI | 0.9 | | |
| Ex. 56 | 6 | B | single | TPI | 1.1 | | |
| Ex. 57 | 6 | C | single | TPI | 1.2 | | |
| Ex. 58 | 6 | D | single | TPI | 1.3 | | |
| Ex. 59 | 2 | no | double | TPI | | good | good |
| Ex. 60 | 3 | no | double | TPI | | good | good |
| Ex. 61 | 4 | no | double | TPI | | good | good |
| Ex. 62 | 5 | no | double | TPI | | good | good |
| Ex. 63 | 6 | no | double | TPI | | good | good |
| Ex. 64 | 2 | no | single | NE | | good | good |
| Ex. 65 | 3 | no | single | NE | | good | good |
| Ex. 66 | 4 | no | single | NE | | good | good |
| Ex. 67 | 5 | no | single | NE | | good | good |
| Ex. 68 | 6 | no | single | NE | 0.2 | good | good |
| Ex. 69 | 6 | A | single | NE | 1.1 | | |
| Ex. 70 | 6 | B | single | NE | 1.2 | | |
| Ex. 71 | 6 | C | single | NE | 1.4 | | |
| Ex. 72 | 6 | D | single | NE | 1.3 | | |
| Ex. 73 | 2 | no | double | NE | | good | good |
| Ex. 74 | 3 | no | double | NE | | good | good |
| Ex. 75 | 4 | no | double | NE | | good | good |
| Ex. 76 | 5 | no | double | NE | | good | good |
| Ex. 77 | 6 | no | double | NE | | good | good |

TPI: Thermoplastic polyimide.
NE: Nylon epoxy adhesive.

EXAMPLE 78

A polyimide film of about 10 μm in thickness was obtained in the same manner as in Example 5.

EXAMPLE 79

A polyimide film of about 10 μm in thickness was obtained in the same manner as in Example 6.

EXAMPLE 80

A polyimide film of about 10 μm in thickness was obtained in the same manner as in Example 1.

EXAMPLE 81

Preparation of Component A

DMAc was introduced into a separable flask and 2 equivalents of ODA and 3 equivalents of p-PDA were added thereto. The resultant mixture was well stirred at room temperature until ODA and p-PDA were completely dissolved. Next, 4.25 equivalents of powdery TMHQ was slowly added thereto followed by stirring for 40 minutes. Then 0.75 equivalents of TMHQ dissolved in DMAc was slowly added thereto and the resultant mixture was stirred under cooling for 1 hour to give a polyamide acid solution. DMAc was employed in such an amount as giving the feeding concentration of the diamine and aromatic tetracarboxylic acid dianhydride monomers of 18% by weight.

Preparation of Component B

DMF was introduced into a separable flask and 3 equivalents of ODA and 1 equivalent of p-PDA were added thereto. The resultant mixture was well stirred at room temperature until ODA and p-PDA were completely dissolved. Next, 3.4 equivalents of powdery. PMDA was slowly added thereto followed by stirring for 40 minutes. Then 0.6 equivalents of PMDA dissolved in DMF was slowly added thereto and the resultant mixture was stirred under cooling for 1 hour to give a polyamide acid solution. DMF was employed in such an amount as giving the feeding concentration of the diamine and aromatic tetracarboxylic acid dianhydride monomers of 18% by weight.

Next, the components A and B were mixed at a weight ratio of 3:1. Then the obtained polyamide acid mixture solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 100° C. for about 5 minutes, at about 300° C. for about 30 seconds, at about 400° C. for about 30 seconds and at about 510° C. for about 30 seconds to thereby give a polyimide film of about 10 $\mu$m in thickness.

EXAMPLE 82

DMAc was introduced into a separable flask and 1 equivalent of p-PDA was added thereto. The resultant mixture was well stirred at room temperature until p-PDA was completely dissolved. Next, 0.99 equivalents of powdery TMHQ was slowly added thereto followed by stirring for 40 minutes. Next, 1equivalent of powdery ODA was added thereto followed by stirring for 40 minutes. Next, 0.90 equivalents of powdery PMDA was slowly added thereto followed by stirring for 40 minutes. Then 0.11 equivalents of PMDA dissolved in DMAc was slowly added thereto and the resultant mixture was stirred under cooling for 1 hour to give a polyamide acid solution. DMAc was employed in such an amount as giving the feeding concentration of the diamine and aromatic tetracarboxylic acid dianhydride monomers of 18% by weight.

Next, the obtained polyamide acid solution was mixed with AA and IQ and poured onto a glass plate. After drying at about 100° C. for about 5 minutes, the polyamide acid film was peeled off from the glass plate. Then this film was fixed to a supporting frame and dehydrated and cyclized by heating successively at about 100° C. for about 5 minutes, at about 300° C. for about 30 seconds, at about 400° C. for about 30 seconds and at about 510° C. for about 30 seconds to thereby give a polyimide film of about 10 $\mu$m in thickness.

The coefficients of linear expansion, coefficients of moisture-absorption expansion, water absorptions, elastic moduli and tensile elastic moduli of the polyimide films obtained in the above Comparative Example 1 and Examples 78 to 82 were measured respectively by the following methods.
(Coefficient of linear expansion)

Coefficient of linear expansion was measured by the conventional method at 20 to 300° C. under a nitrogen gas stream by using TMA-8140 manufactured by Rigaku Denki.

(Water absorption)

Water absorption was determined in accordance with the following formula wherein W1 means the weight of a film sample determined after drying at 150° C. for 30 minutes, and W2 means the weight of the sample determined after immersing in distilled water for 24 hours and then wiping off the water drops on the surface thereof. Water absorption $(\%)=(W2-W1)/W1 \times 100$.
(Coefficient of moisture-absorption expansion)

Coefficient of moisture-absorption expansion was determined in the same manner as in Comparative Example 1 and Examples 1 to 4.

Elastic modulus and tensile elastic modulus were determined in accordance with ASTM-D882.

Table 10 summarizes the data of the polyimide films thus obtained.

TABLE 10

|  | Coefficient of linear expansion (ppm) | Coefficient of moisture-absorption expansion (ppm) | Water absorption (%) | Tensile elastic modulus (%) | Elastic modulus (kg/mm$^2$) |
| --- | --- | --- | --- | --- | --- |
| C. Ex. 1 | 32 | 20 | 3.0 | 50 | 300 |
| Ex. 78 | 12 | 6 | 1.0 | 40 | 550 |
| Ex. 79 | 10 | 3 | 0.8 | 30 | 700 |
| Ex. 80 | 9 | 8 | 1.5 | 40 | 550 |
| Ex. 81 | 7 | 6 | 1.3 | 30 | 680 |
| Ex. 82 | 8 | 3 | 0.9 | 50 | 640 |

COMPARATIVE EXAMPLE 23

DMAc was introduced into a separable flask and 1 equivalent of ODA and 3 equivalents of p-PDA were added thereto. The resultant mixture was well stirred at room temperature until ODA and p-PDA were completely dissolved. Next, 3.5equivalents of powdery PMDA was slowly added thereto followed by stirring for 40 minutes. Then a solution of 0.5 equivalents of PMDA dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give films of 25, 50 and 75 $\mu$m in thickness.

After fixing to a frame, heating was performed under the following conditions: the film of 25 $\mu$m in thickness:

100° C. for 5 minutes, and 300° C., 400° C. and 510° C. each for 30 seconds; the film of 50 $\mu$m in thickness:

100° C. for 5 minutes, and 300° C., 400° C. and 510° C. each for 60 seconds; and the film of 75 $\mu$m in thickness:

100° C. for 5 minutes, and 300° C., 400° C. and 510° C. each for 90 seconds.

EXAMPLE 83

The procedure of Example 4 was followed to give films of 25, 50 and 75 $\mu$m in thickness.

After fixing to a frame, heating was performed under the following conditions: the film of 25 $\mu$m in thickness:

100° C. for 5 minutes, and 300° C., 400° C. and 510° C. each for 30 seconds; the film of 50 μm in thickness:
100° C. for 5 minutes, and 300° C., 400° C. and 510° C. each
for 60 seconds; and the film of 75 μm in thickness:
100° C. for 5 minutes, and 300° C., 400° C. and 510° C. each
for 90 seconds.

By using the films obtained in Comparative Example 23 and Example 83, measurement was made on the water vapor permeability and oxygen permeability in accordance with Japanese Industrial Standards (JIS). In the measurement of the temperature-dependency of water vapor permeability, films of 25 μm in thickness were employed. Tables 11 to 13 show the results.

TABLE 11

Water vapor permeability: JIS Z0208 (cup method) 40° C., 90% RH
($g/m^2 \cdot 24\ h$)

| | Ex. 83 | Comp. Ex. 23 |
|---|---|---|
| 25 μm | 8.5 | 60 |
| 50 μm | 5.0 | 38 |
| 75 μm | 3.4 | 24 |

TABLE 12

Water vapor permeability (temperature/moisture dependency):
JIS Z0208 (cup method)
($g/m^2 \cdot 24\ h$)

| | Ex. 83 | Comp. Ex. 23 |
|---|---|---|
| 25° C., 90% | 3.4 | 30 |
| 40° C., 90% | 7.6 | 60 |
| 60° C., 90% | 18 | 130 |
| 85° C., 85% | 57 | 300 |

TABLE 13

Oxygen permeability: JIS K7126A method
($g/m^2 \cdot 24\ h \cdot atm$)

| | Ex. 83 | Comp. Ex. 23 |
|---|---|---|
| 25 μm | 18 | 150 |
| 50 μm | 11 | 75 |
| 75 μm | 8.3 | 55 |

Now, the importance of the water vapor permeability and oxygen permeability will be described.

(1) Water Vapor Permeability

When a base film has a high water absorption and a high water vapor permeability, its dielectric constant varies and, in its turn, the electrical characteristics of an FPC are changed. In general, circuits are designed by considering the range of these changes in electrical characteristics. However, a broader range of these changes to be taken into consideration will the more severely restrict down-sizing and thickness reduction of FPCs. In the case of a two-layered FPC, in particular, the base film being in contact directly with copper is liable to be affected by water absorption. Therefore, it is highly important that a base film to be used in two-layered FPCs has a low water absorption and a low water vapor permeability.

(2) Oxygen Permeability

When oxygen permeates from the base film side into a three-layered FPC, there sometimes arises an adhesion failure due to the deterioration of the adhesive. In the case of a two-layered FPC, on the other hand, electrical characteristics are damaged due to the deterioration of copper. It is therefore desired to employ a polyimide film having a low oxygen permeability.

COMPARATIVE EXAMPLE 24

DMAc was introduced into a separable flask and 1 equivalent of ODA and 2 equivalents of p-PDA were added thereto. The resultant mixture was well stirred at room temperature until ODA and p-PDA were completely dissolved. Next, 2.5 equivalents of powdery TMHQ was slowly added thereto followed by stirring for 40 minutes. Then a solution of 0.5 equivalents of TMHQ dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

COMPARATIVE EXAMPLE 25

DMAc was introduced into a separable flask and 2 equivalents of ODA and 3 equivalents of p-PDA were added thereto. The resultant mixture was well stirred at room temperature until ODA and p-PDA were completely dissolved. Next, 4.5 equivalents of powdery TMHQ was slowly added thereto followed by stirring for 40 minutes. Then a solution of 0.5 equivalents of TMHQ dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

COMPARATIVE EXAMPLE 26

DMAc was introduced into a separable flask and 1 equivalent of ODA and 1 equivalent of p-PDA were added thereto. The resultant mixture was well stirred at room temperature until ODA and p-PDA were completely dissolved. Next, 1.8 equivalents of powdery TMHQ was slowly added thereto followed by stirring for 40 minutes. Then a solution of 0.2 equivalents of TMHQ dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

COMPARATIVE EXAMPLE 27

DMAc was introduced into a separable flask and 3 equivalents of ODA and 1 equivalent of p-PDA were added thereto. The resultant mixture was well stirred at room temperature until ODA and p-PDA were completely dissolved. Next, 3.6 equivalents of powdery TMHQ was slowly added thereto followed by stirring for 40 minutes. Then a solution of 0.4 equivalents of TMHQ dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

COMPARATIVE EXAMPLE 28

The procedure of Comparative Example 24 was followed but heating was performed at 100° C. for 5 minutes and then at 200, 300 and 400° C. each for 2 minutes after fixing to a frame, thereby giving a polyimide film of 12.5 μm in thickness.

EXAMPLE 84

The procedure of Example 4 was followed, thereby giving a polyimide film of about 10 μm in thickness.

EXAMPLE 85

DMAc was introduced into a separable flask and 5 equivalents of ODA and 5 equivalent of p-PDA were added thereto. The resultant mixture was well stirred at room temperature until ODA and p-PDA were completely dissolved. Next, 6 equivalents of powdery TMHQ was slowly added thereto followed by stirring for 40 minutes. Further, 3.5 equivalents of PMDA was added thereto followed by stirring for 40 minutes. Then a solution of 0.5 equivalents of PMDA dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

EXAMPLE 86

DMAc was introduced into a separable flask and 5 equivalents of ODA and 5 equivalent of p-PDA were added thereto. The resultant mixture was well stirred at room temperature until ODA and p-PDA were completely dissolved. Next, 7 equivalents of powdery TMHQ was slowly added thereto followed by stirring for 40 minutes. Further, 2.5 equivalents of PMDA was added thereto followed by stirring for 40 minutes. Then a solution of 0.5 equivalents of PMDA dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

EXAMPLE 87

DMAc was introduced into a separable flask and 5 equivalents of ODA and 5 equivalent of p-PDA were added thereto. The resultant mixture was well stirred at room temperature until ODA and p-PDA were completely dissolved. Next, 4 equivalents of powdery TMHQ was slowly added thereto followed by stirring for 40 minutes. Further, 5.5 equivalents of PMDA was added thereto followed by stirring for 40 minutes. Then a solution of 0.5 equivalents of PMDA dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

EXAMPLE 88

DMAc was introduced into a separable flask and 5 equivalents of ODA and 5 equivalent of p-PDA were added thereto. The resultant mixture was well stirred at room temperature until ODA and p-PDA were completely dissolved. Next, 3 equivalents of powdery TMHQ was slowly added thereto followed by stirring for 40 minutes. Further, 6.5 equivalents of PMDA was added thereto followed by stirring for 40 minutes. Then a solution of 0.5 equivalents of PMDA dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

EXAMPLE 89

DMAc was introduced into a separable flask and 7 equivalents of ODA and 3 equivalent of p-PDA were added thereto. The resultant mixture was well stirred at room temperature until ODA and p-PDA were completely dissolved. Next, 5 equivalents of powdery TMHQ was slowly added thereto followed by stirring for 40 minutes. Further, 4.5 equivalents of PMDA was added thereto followed by stirring for 40 minutes. Then a solution of 0.5 equivalents of PMDA dissolved in DMAc was slowly added thereto and the resultant mixture was stirred for 1 hour to give a polyamide acid solution in DMAC. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

EXAMPLE 90

DMAc was introduced into a separable flask and 3 equivalents of ODA and 7 equivalent of p-PDA were added thereto. The resultant mixture was well stirred at room temperature until ODA and p-PDA were completely dissolved. Next, 5 equivalents of powdery TMHQ was slowly added thereto followed by stirring for 40 minutes. Further, 4.5 equivalents of PMDA was added thereto followed by stirring for 40 minutes. Then a solution of 0.5 equivalents of PMDA dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

EXAMPLE 91

DMAc was introduced into a separable flask and 7 equivalents of ODA and 3 equivalent of p-PDA were added thereto. The resultant mixture was well stirred at room temperature until ODA and p-PDA were completely dissolved. Next, 7 equivalents of powdery TMHQ was slowly added thereto followed by stirring for 40 minutes. Further, 2.5 equivalents of PMDA was added thereto followed by stirring for 40 minutes. Then a solution of 0.5 equivalents of PMDA dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

EXAMPLE 92

DMAc was introduced into a separable flask and 7 equivalents of ODA and 3 equivalent of p-PDA were added thereto. The resultant mixture was well stirred at room temperature until ODA and p-PDA were completely dissolved. Next, 3 equivalents of powdery TMHQ was slowly added thereto followed by stirring for 40 minutes. Further, 6.5 equivalents of PMDA was added thereto followed by stirring for 40 minutes. Then a solution of 0.5 equivalents of PMDA dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

EXAMPLE 93

DMAc was introduced into a separable flask and 3 equivalents of ODA and 7 equivalent of p-PDA were added thereto. The resultant mixture was well stirred at room temperature until ODA and p-PDA were completely dissolved. Next, 3 equivalents of powdery TMHQ was slowly added thereto followed by stirring for 40 minutes. Further, 6.5 equivalents of PMDA was added thereto followed by stirring for 40 minutes. Then a solution of 0.5 equivalents of PMDA dissolved in DMAc was slowly added thereto and the resultant mixture was stirred for 1 hour to give a polyamide acid solution in DMAc. DMAc was employed in such an amount as giving the feeding concentration of the diamine and aromatic tetracarboxylic acid monomers of 18% by weight.

Next, the procedure of Example 1 was followed to give a polyimide film of about 10 μm in thickness.

EXAMPLE 94

The procedure of Example 84 was followed but the final heating step was performed not at 510° C. but at 480° C. after fixing to a frame, thereby giving a polyimide film of 12.5 μm in thickness.

EXAMPLE 95

The procedure of Example 84 was followed but the final heating step was performed not at 510° C.but at 4500° C. after fixing to a frame, thereby giving a polyimide film of 12.5 μm in thickness.

EXAMPLE 96

The procedure of Example 84 was followed but the final heating step was performed not at 510° C. but at 400° C. after fixing to a frame, thereby giving a polyimide film of 12.5 μm in thickness.

The dynamic viscoelasticities of the films obtained in the above Examples were measured under the following conditions.

Measurement device: DMS200 manufactured by Seiko Electronics.
Sample form: 9 mm×40 mm.
Profile: 20° C.–400° C. 3° C./min.
Frequency: 10 Hz.
Lamp: 20. Fbase: 0. F0gain: 3.0

Table 14 shows the data of E' (storage elastic modulus) and Tg (0° C.) at which the minimum ΔE'/ΔT was observed (i.e., the temperature at which the largest decrease in E' with temperature rise was observed).

TABLE 14

|  | TMHQ | PMDA | ODA | p-PDA | Tg (° C.) | E' (Pa) at 350° C. |
|---|---|---|---|---|---|---|
| Comp. Ex. 24 | 3 | — | 1 | 2 | 228 | 1.1E9 |
| Comp. Ex. 25 | 5 | — | 2 | 3 | 215 | 9.8E8 |
| Comp. Ex. 26 | 2 | — | 1 | 1 | 227 | 6.6E8 |
| Comp. Ex. 27 | 4 | — | 3 | 1 | 211 | 2.7E8 |
| Comp. Ex. 28 | 3 | — | 1 | 2 | 228 | 1.1E9 |
| Ex. 84 | 5 | 5 | 5 | 5 | 290 | 2.1E9 |
| Ex. 85 | 6 | 4 | 5 | 5 | 280 | 1.9E9 |
| Ex. 86 | 7 | 3 | 5 | 5 | 275 | 1.7E9 |
| Ex. 87 | 4 | 6 | 5 | 5 | 290 | 2.1E9 |
| Ex. 88 | 3 | 7 | 5 | 5 | 295 | 2.2E9 |
| Ex. 89 | 5 | 5 | 7 | 3 | 280 | 2.0E9 |
| Ex. 90 | 5 | 5 | 3 | 7 | 295 | 2.5E9 |
| Ex. 91 | 7 | 3 | 7 | 3 | 270 | 1.9E9 |
| Ex. 92 | 3 | 7 | 7 | 3 | 290 | 2.5E9 |
| Ex. 93 | 3 | 7 | 3 | 7 | 300 | 2.7E9 |
| Ex. 94 | 5 | 5 | 5 | 5 | 290 | 2.1E9 |
| Ex. 95 | 5 | 5 | 5 | 5 | 290 | 2.1E9 |
| Ex. 96 | 5 | 5 | 5 | 5 | 290 | 2.1E9 |

Next, a hydrolytic resistance test was performed by using the films of Comparative Examples 24 to 28 and Examples 84 to 96 under the following conditions (film thickness: 12.5 μm).

① As an indication of hydrolytic resistance, use was made of tear propagation resistance measured in accordance with ASTM D-1938.

② Tear propagation resistance was measured as the initial value.

③ To evaluate hydrolytic resistance, a film sample was exposed to 150° C./100% RH/4 atm for 24 hours by using PC305S (manufactured by Hirayama Seisakusho) and then the tear propagation resistance was measured.

④ After the exposure, the samples of Comparative Examples 24 to 28 crumbled into dust, thereby making the measurement impossible.

Table 15 summarizes the results.

TABLE 15

|  | Maximum temp. (° C.) | Initial value (g/mm) | After exposure (g/mm) | Retention (%) |
|---|---|---|---|---|
| Comp. Ex. 24 | 510 | 120 | Not determined | 0 |
| Comp. Ex. 25 | 510 | 121 | do. | 0 |
| Comp. Ex. 26 | 510 | 125 | do. | 0 |
| Comp. Ex. 27 | 510 | 119 | do. | 0 |
| Comp. Ex. 28 | 400 | 120 | do. | 0 |

TABLE 15-continued

| | Maximum temp. (° C.) | Initial value (g/mm) | After exposure (g/mm) | Retention (%) |
|---|---|---|---|---|
| Ex. 84 | 510 | 150 | 120 | 80 |
| Ex. 85 | 510 | 150 | 121 | 81 |
| Ex. 86 | 510 | 149 | 120 | 81 |
| Ex. 87 | 510 | 152 | 125 | 82 |
| Ex. 88 | 510 | 150 | 122 | 81 |
| Ex. 89 | 510 | 150 | 116 | 77 |
| Ex. 90 | 510 | 148 | 120 | 81 |
| Ex. 91 | 510 | 150 | 120 | 81 |
| Ex. 92 | 510 | 153 | 121 | 79 |
| Ex. 93 | 510 | 150 | 119 | 79 |
| Ex. 94 | 480 | 155 | 120 | 77 |
| Ex. 95 | 450 | 154 | 110 | 71 |
| Ex. 96 | 400 | 149 | 70 | 47 |

Next, the importance of the dynamic viscoelasticity and hydrolytic resistance of PI film will be described.

(1) Dynamic Viscoelasticity

Comparative Example 28 corresponds to Example 1 in JP-A-10-36506 applied by us, though the thickness is different. First, the meaning of E' at 350° C. will be illustrated. A polyimide film is continuously shaped under applying a tension in the width direction while holding at both ends in a tentering oven at a high temperature (400° C. or above). When the elastic modulus at high temperature is considerably lowered, the tension in the width direction can be hardly applied and thus the film sags in the tentering oven, which makes stable manufacture thereof impossible. As the results of our studies, it is found that this phenomenon arises at a higher possibility when E' is lowered to 1.0E9 or below. Therefore, there is a fear that the film of the Example in our published patent cannot be continuously manufactured in a stable state.

In the above-described case, the temperature at which E' shows the largest decrease with temperature rise is referred to as Tg. At Tg of 250° C. or below, the following troubles would likely occur.

1. When a thermoplastic polyimide is employed as an adhesive, the procedure is carried out at an elevated temperature (about 250 to 300° C.) and heat contact bonding is performed by using a press. Thus, the base film is deformed and, after cooling, undergoes curling or warpage.
2. When used at a high temperature, the thus constructed FPC might be deformed.

It is therefore considered that Tg should be at least 250° C. and E' should be at least 1.0E9 at 350° C.

(2) Hydrolytic Resistance

There is a tendency that FPCs with the use of polyimide films as the base film are to be used under more and more diversified conditions. Among all, it seems one of the most stringent cases to use an FPC at a high temperature and a high humidity. When an FPC is used under these conditions, it is estimated that the deterioration of base film due to hydrolysis brings about the following troubles.

That is to say, the deterioration of the film due to hydrolysis induces: ① decrease in the interfacial adhesion strength between PI film and adhesive (in three-layered FPC); ② decrease in the interfacial adhesion strength between PI film and copper laminate (in two-layered FPC); ③ intolerance to storage in bent state or use at moving/flexing parts due to deterioration in mechanical strength; ④ deterioration in electrical characteristics of PI film; etc.

As described above, the present invention makes it possible to provide a novel polyimide film which has excellent characteristics (a sufficiently high elastic modulus, a low water absorption, a small coefficient of moisture-absorption expansion, a small coefficient of linear expansion and a high dimensional stability, etc.) and boards with excellent performance for various electric/electronic equipments with the use of the polyimide film, namely, flexible print connection boards, adhesive films for packaging semiconductors, magnetic recording films and hard disk suspension connection bases.

While the invention has been described in detail and with reference to specific examples thereof, it will be apparent to one skilled in the art that various changes and modification can be made therein without departing from the spirit and scope thereof.

What is claimed is:

1. A polyimide film having a tensile elastic modulus of 700 kg/mm$^2$ or less and a coefficient of linear expansion at 100 to 200° C. of 5 to 15 ppm which contains three repeating units A, B and C in its molecule, wherein said repeating unit A is represented by the following general formula (A):

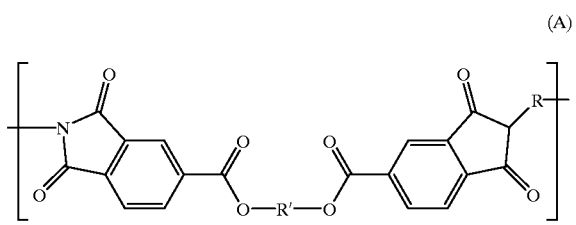

wherein $R^1$ represents a divalent organic group selected from among:

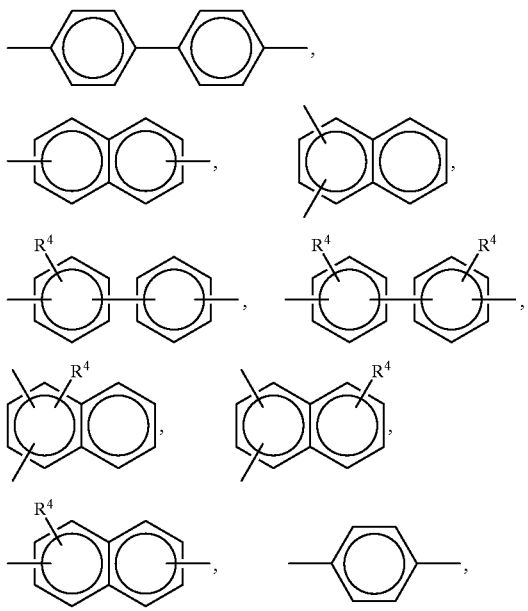

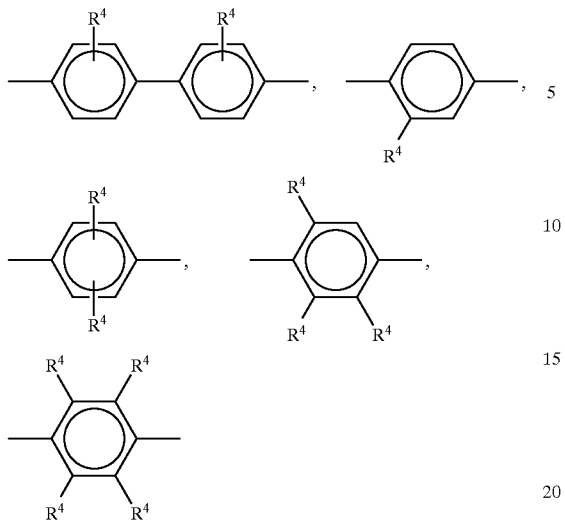

(wherein $R^4$ represents $CH_3$—, Cl—, Br—, F— or $CH_3O$—); and R represents a divalent organic group represented by the following general formula:

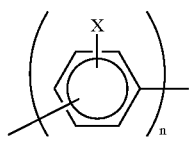

(wherein n is an integer of 1 to 3; and X represents a monovalent substituent selected from among a hydrogen atom, a halogen atom, a carboxyl group, a lower alkyl group having 6 or less carbon atoms and a lower alkoxy group having 6 or less carbon atoms), said repeating unit B is represented by the following general formula (B):

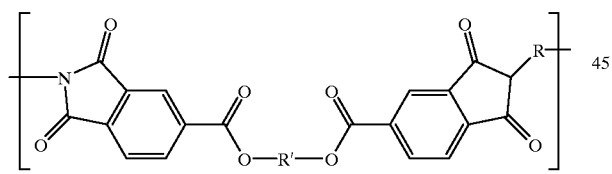

wherein $R^1$ is as defined in the general formula (A), and R represents a divalent organic group represented by the following general formula:

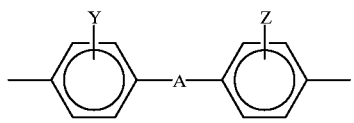

(wherein Y and Z may be the same or different and each represents a monovalent substituent selected from among a hydrogen atom, a carboxyl group, a lower alkyl group having 6 or less carbon atoms and a lower alkoxy group having 6 or less carbon atoms; and A represents a divalent linking group selected from among —O—, —S—, —CO—, —SO—, $SO_2$—, and $CH_2$—), said repeating unit C is represented by the following general formula (C):

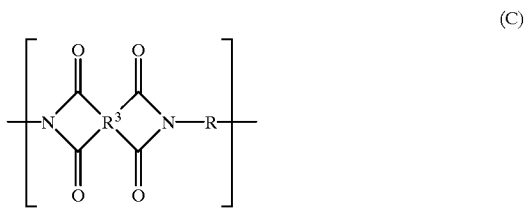

wherein R is defined as in any one of the general formulae (A) and (B); and $R^3$ represents a tetravalent organic group selected from among:

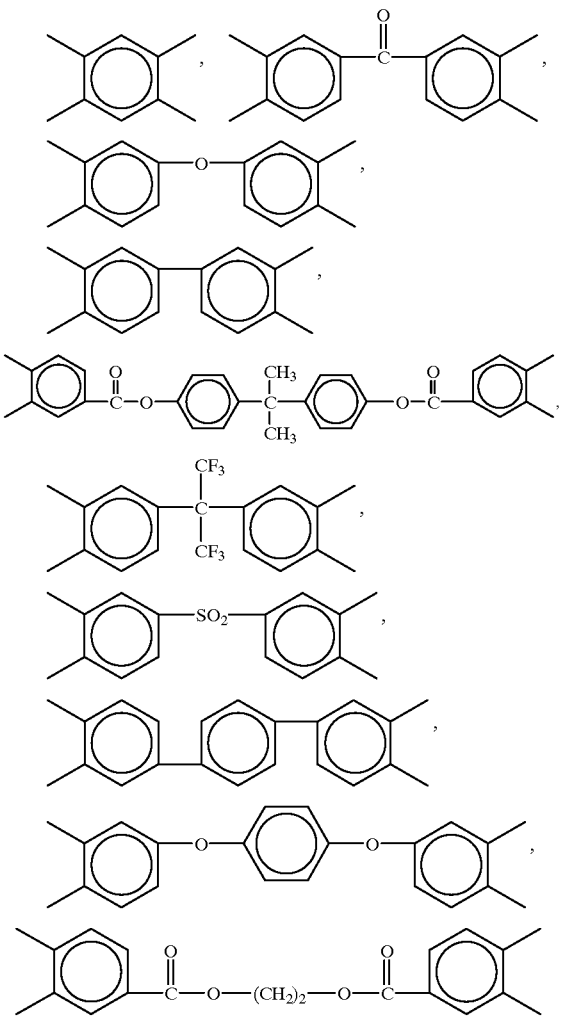

and the ratio of repeating units A+B to repeating units C is from 1:3 to 3:1.

2. The polyimide film as claimed in claim 1 having a water absorption of 3.0% or less.

3. The polyimide film as claimed in claim 2 having a water absorption of 2.0% or less.

4. The polyimide film as claimed in claim 1 which further contains a repeating unit represented by the following general formula (D) in its molecule:

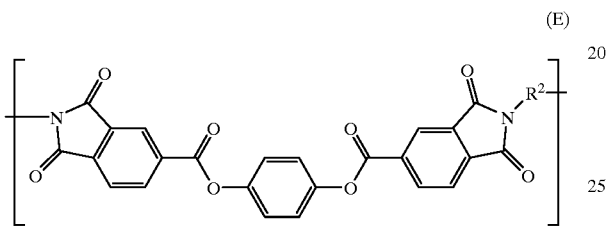

(D)

wherein R is defined in any one of the general formulae (A) and (B).

5. The polyimide film as claimed in claim 1 which contains a repeating unit represented by the following general formula (E) and another repeating unit represented by the following general formula (F) in its molecule:

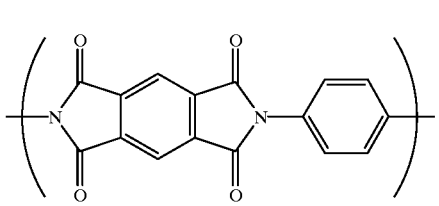

(E)

wherein $R^2$ represents a divalent organic group selected from:

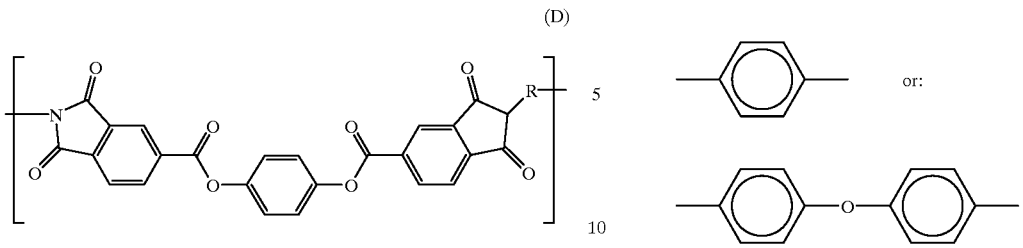

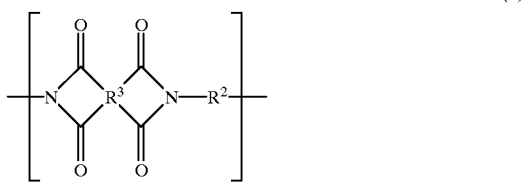

(F)

wherein $R^2$ is as defined in the general formula (E); and $R^3$ is as defined in the general formula (C).

6. The polyimide film as claimed in claim 1 wherein the main repeating units contained in its molecule are those represented by the following formulae (G) to (J):

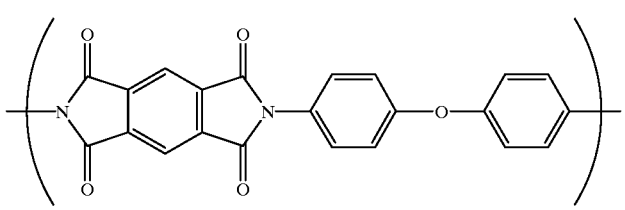

(G)

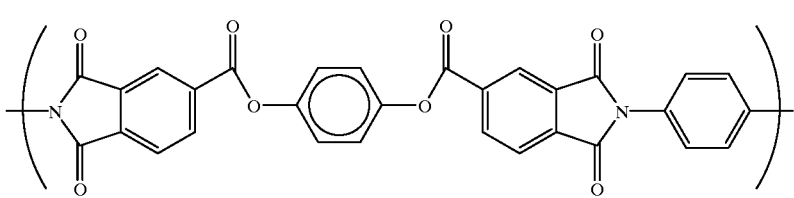

(H)

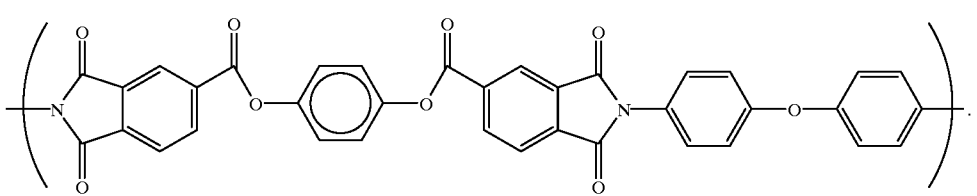

(I)

(J)

7. The polyimide film as claimed in claim 6 which satisfies the requirement that (a+b)/s, (a+c)/s, (b+d)/s and (c+d)/s each falls within the range of 0.25 to 0.75, wherein a, b, c, and d represent respectively the numbers of the repeating units represented by the above general formulae (G) to (J) and s represents a+b+c+d.

8. A laminate for flexible print connection boards which is obtained by forming a metal layer at least on one face of the polyimide as claimed in claim 1.

9. The laminate for flexible print connection boards as claimed in claim 8, wherein said metal layer is laminated via a thermosetting adhesive.

10. The laminate for flexible print connection boards as claimed in claim 8, wherein said metal layer is laminated via a thermoplastic polyimide adhesive.

11. The laminate for flexible print connection boards as claimed in any of claims 8 to 10, wherein at least one face of said polyimide film is subjected to at least one treatment selected from among heat treatment, corona treatment, plasma treatment and coupling agent-treatment.

12. An adhesive film obtained by forming an adhesive layer on at least one face of the polyimide film as claimed in claim 1.

13. The adhesive film as claimed in claim 12 wherein said adhesive layer comprises a thermosetting adhesive.

14. The adhesive film as claimed in claim 12 wherein said adhesive layer comprises a thermoplastic polyimide adhesive.

15. The polyimide film as claimed in claim 1 to be used as a base film for magnetic recording.

16. The polyimide film as claimed in claim 1 to be used as a hard disk suspension connection base.

17. The polyimide film as claimed in claim 1, wherein repeating unit C contains two repeating units C-1 and C-2, R of C-1 being as defined in general formula (A) and R of C-2 being as defined in general formula (B).

18. The polyimide film as claimed in claim 17, wherein the ratio of repeating units (A+C-1) to repeating units (B+C-2) is from 1:3 to 3:1.

* * * * *